(12) United States Patent
Narayan

(10) Patent No.: US 10,196,754 B2
(45) Date of Patent: Feb. 5, 2019

(54) CONVERSION OF CARBON INTO N-TYPE AND P-TYPE DOPED DIAMOND AND STRUCTURES

(71) Applicant: NORTH CAROLINA STATE UNIVERSITY, Raleigh, NC (US)

(72) Inventor: Jagdish Narayan, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 36 days.

(21) Appl. No.: 15/231,085

(22) Filed: Aug. 8, 2016

(65) Prior Publication Data

US 2017/0037532 A1    Feb. 9, 2017

Related U.S. Application Data

(60) Provisional application No. 62/355,681, filed on Jun. 28, 2016, provisional application No. 62/331,217, filed on May 3, 2016, provisional application No. 62/245,018, filed on Oct. 22, 2015, provisional application No. 62/202,202, filed on Aug. 7, 2015.

(51) Int. Cl.

| | | |
|---|---|---|
| *C30B 29/04* | (2006.01) | |
| *C30B 31/00* | (2006.01) | |
| *H01L 21/02* | (2006.01) | |
| *H01L 29/00* | (2006.01) | |
| *C30B 13/10* | (2006.01) | |
| *C01B 21/064* | (2006.01) | |
| *C30B 13/24* | (2006.01) | |
| *C23C 14/06* | (2006.01) | |
| *C23C 14/28* | (2006.01) | |
| *C30B 23/02* | (2006.01) | |
| *C30B 23/06* | (2006.01) | |
| *C30B 29/40* | (2006.01) | |
| *C30B 19/08* | (2006.01) | |
| *C30B 29/62* | (2006.01) | |
| *C30B 31/06* | (2006.01) | |
| *C30B 31/22* | (2006.01) | |
| *H01L 21/268* | (2006.01) | |
| *H01F 1/42* | (2006.01) | |
| *G01R 33/12* | (2006.01) | |
| *H03B 15/00* | (2006.01) | |
| *G01R 33/032* | (2006.01) | |
| *C01B 32/05* | (2017.01) | |
| *C01B 32/188* | (2017.01) | |
| *C01B 32/25* | (2017.01) | |
| *H01L 43/10* | (2006.01) | |

(52) U.S. Cl.
CPC ............. *C30B 13/10* (2013.01); *C01B 21/064* (2013.01); *C01B 21/0648* (2013.01); *C01B 32/05* (2017.08); *C01B 32/188* (2017.08); *C01B 32/25* (2017.08); *C23C 14/0605* (2013.01); *C23C 14/0647* (2013.01); *C23C 14/28* (2013.01); *C30B 13/24* (2013.01); *C30B 19/08* (2013.01); *C30B 23/025* (2013.01); *C30B 23/066* (2013.01); *C30B 29/04* (2013.01); *C30B 29/403* (2013.01); *C30B 29/62* (2013.01); *C30B 31/06* (2013.01); *C30B 31/22* (2013.01); *G01R 33/032* (2013.01); *G01R 33/1284* (2013.01); *H01F 1/42* (2013.01); *H01L 21/0254* (2013.01); *H01L 21/0259* (2013.01); *H01L 21/02527* (2013.01); *H01L 21/02595* (2013.01); *H01L 21/02603* (2013.01); *H01L 21/02609* (2013.01); *H01L 21/02631* (2013.01); *H01L 21/02686* (2013.01); *H01L 21/268* (2013.01); *H03B 15/006* (2013.01); *C01P 2002/02* (2013.01); *C01P 2004/03* (2013.01); *C01P 2006/40* (2013.01); *C01P 2006/42* (2013.01); *C01P 2006/90* (2013.01); *H01L 43/10* (2013.01)

(58) Field of Classification Search
CPC ......... C30B 31/00; C30B 31/22; C30B 29/04; H01L 29/16; H01L 21/02; H01L 21/04
See application file for complete search history.

(56) References Cited

U.S. PATENT DOCUMENTS

| | | | |
|---|---|---|---|
| 3,678,306 | A | 7/1972 | Garnier et al. |
| 4,885,614 | A | 12/1989 | Furukawa et al. |
| 4,950,625 | A | 8/1990 | Nakashima et al. |
| 5,221,411 | A | 6/1993 | Narayan |
| 5,406,123 | A | 4/1995 | Narayan |

(Continued)

FOREIGN PATENT DOCUMENTS

| | | |
|---|---|---|
| WO | 2017/218801 A1 | 12/2017 |
| WO | 2018/005619 A1 | 1/2018 |

OTHER PUBLICATIONS

High rate homoepitaxial growth of diamond by microwave plasma CVD with nitrogen addition, Y. Mokuno et al. / Diamond & Related Materials 15 (2006) 455-459.*

(Continued)

*Primary Examiner* — Haidung D Nguyen
(74) *Attorney, Agent, or Firm* — Kilpatrick Townsend & Stockton LLP

(57) ABSTRACT

Using processes disclosed herein, materials and structures are created and used. For example, processes can include melting boron nitride or amorphous carbon into an undercooled state followed by quenching. Exemplary new materials disclosed herein can be ferromagnetic and/or harder than diamond. Materials disclosed herein may include dopants in concentrations exceeding thermodynamic solubility limits. A novel phase of solid carbon has structure different than diamond and graphite.

19 Claims, 54 Drawing Sheets

(35 of 54 Drawing Sheet(s) Filed in Color)

(56) References Cited

U.S. PATENT DOCUMENTS

| | | | |
|---|---|---|---|
| 5,541,144 | A | 7/1996 | Wildenburg |
| 5,541,423 | A * | 7/1996 | Hirabayashi ...... H01L 21/02381 257/76 |
| 5,812,573 | A * | 9/1998 | Shiomi ................ H01S 3/16 257/77 |
| 7,982,566 | B2 | 7/2011 | Kasten |
| 8,753,614 | B2 | 6/2014 | Shenderova et al. |
| 9,117,578 | B2 | 8/2015 | Hahn et al. |
| 2004/0118335 | A1 | 6/2004 | Chang |
| 2008/0071093 | A1 | 3/2008 | Lindsey et al. |
| 2010/0001292 | A1 * | 1/2010 | Yamasaki ......... H01L 21/02376 257/77 |
| 2010/0219549 | A1 | 9/2010 | Cook et al. |
| 2010/0329962 | A1 | 12/2010 | Twitchen et al. |
| 2011/0089404 | A1 | 4/2011 | Marcus et al. |
| 2012/0051996 | A1 | 3/2012 | Scarsbrook et al. |
| 2012/0292118 | A1 | 11/2012 | Frushour |
| 2014/0145210 | A1 * | 5/2014 | Suzuki ................ H01L 21/041 257/77 |
| 2014/0210139 | A1 | 7/2014 | Melaibari |
| 2017/0373153 | A1 | 12/2017 | Narayan |

OTHER PUBLICATIONS

Fabrication of diamond lateral p-n junction diodes on (111) substrates, Sato et al., Phys. Status Solidi A 212, No. 11, 2548-2552 (2015).*
Formation of diamond p-n junction and its optical emission characteristics, Koizumi et al., Diamond and Related Materials 11 (2002) 307-311.*
Defect structure and electron field-emission properties of boron-doped diamond films, Chen et al., Appl. Phys. Lett., vol. 75, No. 18, Nov. 1, 1999, 2857-2859.*
Substitutional phosphorus doping of diamond by ion implantation, Hofsass et al., Journal of Applied Physics 81, 2566-2569 (1997).*
PCT/US2016/045984, "International Search Report and Written Opinion", dated Jan. 17, 2017, 14 pages.
PCT/US2016/045984, "Invitation to Pay Additional Fees and Partial Search Report", dated Oct. 7, 2016, 2 pages.
PCT/US2017/039694, "Invitation to Pay Additional Fees and Partial Search Report", dated Aug. 23, 2017, 2 pages.
Blasé, "Superconducting group-IV semiconductors," Nature Materials, 2009, vol. 8, pp. 375-382, https://hal-archives-ouvertes.fr/hal-00761020/document, p. 16 para 1-2.
Bulliard, et al., "Electron Energy-Loss Spectra of Fullerene C60 in the Gas Phase," Chemical Physics Letters, Jul. 16, 1993, vol. 209, Nos. 5,6, pp. 434-438, http://www.sciencedirect.com/science/article/pii/0009261493861134, abstract.
Ma, et al., "Low-Energy Interaction and Adsorption of C60 on Diamond Surfaces," Nuclear Instruments and Methods in Physics Research B, Jun. 2000, vol. 168, Issue 2, p. 169-180, http://www.sciencedirect.com/science/article/pii/SO168583X99008614, p. 173, Fig. 3.
Narayan, "A New Phase of Carbon," North Carolina State University, May 31, 2008, http://www.q.carboninc.com/, p. 1,4.
Nemanich, et al., "Electron emission properties of crystalline diamond and III-nitride surfaces," Applied Surface Science, Jun. 1998, vols. 130-132, pp. 694-703, http://www.sciencedirect.com/science/article/pii/S0169433293001408, p. 699, col. 2, para. 3 to p. 700, col. 1, para. 1.
Nishibata, "Effect of Quenching Rate on Hardness and Microstructure of Hot-Stamped Steel," Journal of Alloys and Compounds, Nov. 15, 2013, vol. 577, pp. 549-554, http://www.sciencedirect.com/science/article/pii/S0925838812000138, abstract, p. 550-552.
Tallaire et al., "Temperature Dependent Creation of Nitrogen-Vacancy Centers in CVD Diamond Layers," Diamond and Related Materials, Jan. 2015, vol. 51, pp. 55-60, http://www.sciencedirect.com/science/article/pii/S092596351400226X, Abstract, p. 56, col. 1, para. 3, col. 2, para 3, p. 57 para 1, Fig. 1c.
Wort, et al., "Diamond as an electronic Material," Materials Today, Feb. 2008, vol. 11, Nos. 1-2, pp. 22-28, http://www.sciencedirect.com/science/article/pii/S1369702107703498, p. 1.
PCT/US2017/037719, "International Search Report and Written Opinion", dated Nov. 8, 2017, 16 pages.
PCT/US2017/039694, "International Search Report and Written Opinion", dated Nov. 2, 2017, 14 pages.
Song et al., "Winding, Fabrication, Engineering Design, and Other Considerations for 2G HTS Coils", Magnet Technology 2013, 2013, pp. 6-8, 18 pages.
Wang et al., "Influence of turn-to-turn resistivity and coil geometrical size on charging characteristics of no-electrical-insulation REBCO pancake coils", Superconductor Science and Technology, May 24, 2016, 10 pages.

* cited by examiner

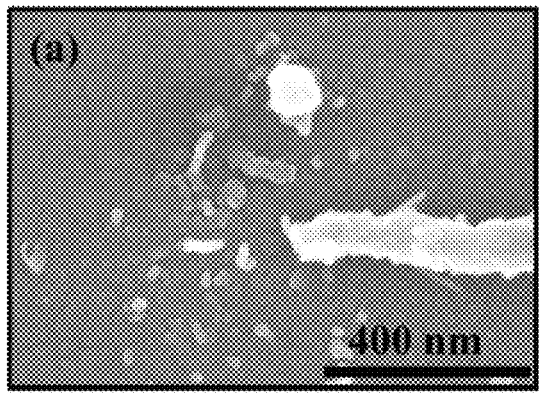 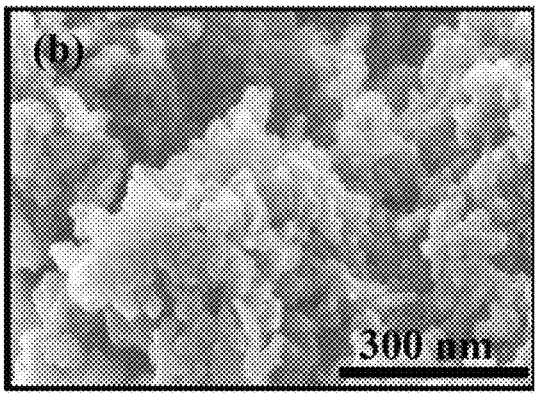
FIG. 49A  FIG. 49B
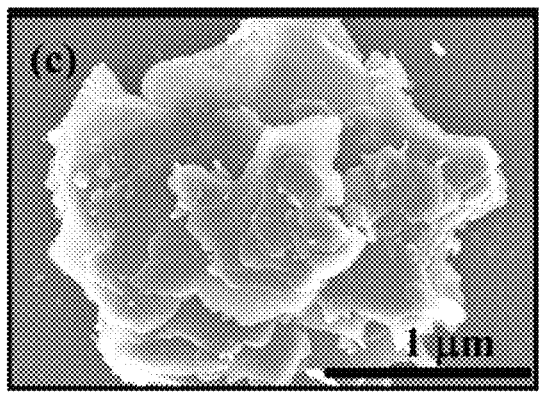 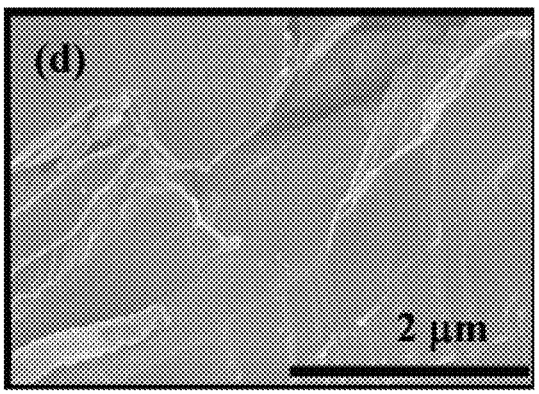
FIG. 49C  FIG. 49D

E the amplitude & polarization of laser beam;
M the magnetization of FM Q-C.

TI: Sr₃SnO, Bi₂Se₃, Be₂SeTe₂ ...

CONVERSION OF CARBON INTO N-TYPE AND P-TYPE DOPED DIAMOND AND STRUCTURES

This application claims the benefit of U.S. Provisional Application No. 62/202,202, entitled "SYNTHESIS AND PROCESSING OF Q-CARBON, GRAPHENE, NANO-DIAMOND, AND MICRODIAMOND BY NANOSECOND PULSED LASERS" and filed on Aug. 7, 2015, U.S. Provisional Application No. 62/245,018, entitled "Synthesis and Processing of Q-Carbon, Single-Crystal Diamond Film, and Single-Crystal Diamond Nanoneedles and Microneedles" and filed on Oct. 22, 2015, U.S. Provisional Application No. 62/331,217, entitled "SYSTEMS AND METHODS FOR PROCESSING NANODIAMONDS AND OTHER NANOSTRUCTURES" and filed on May 3, 2016, and U.S. Provisional Application No. 62/355,681, entitled "NANOSTRUCTURES AND METHODS FOR PROCESSING" and filed on Jun. 28, 2016, which are incorporated herein by reference in their entirety.

This invention was made with government support under grant number 1306400 awarded by the National Science Foundation. The government has certain rights to this invention.

Embodiments relate generally to synthesis and processing of materials and nanostructures, and more particularly, to synthesis and processing of novel phases of carbon (Q-Carbon) and boron nitride (Q-BN), and direct conversion of carbon and BN into diamond and C—BN, respectively, including doped diamond and doped C—BN.

Using processes disclosed herein, materials and structures are created and used. For example, processes can include melting boron nitride or amorphous carbon into an undercooled state followed by quenching. Exemplary new materials disclosed herein can be ferromagnetic and/or harder than diamond. Materials disclosed herein may include dopants in concentrations exceeding thermodynamic solubility limits. A novel phase of solid carbon has structure different than diamond and graphite.

Some embodiments include a process for creating nanostructures. The process can include melting at least a portion of material into a super undercooled state. The process can also include quenching from the super undercooled state to form one or more nanostructures. The material can be carbon (e.g., amorphous carbon) and the nanostructures formed can include diamond nanostructures. The material can be boron nitride (e.g., hexagonal boron nitride) and the nanostructures formed can include cubic boron nitride nanostructures. The process can include, prior to the melting, depositing a film of the material on a substrate. The substrate can be adapted to provide a template for epitaxial growth such that the nanostructures are formed as epitaxial nanostructures (e.g., epitaxial diamond nanostructures, epitaxial cubic boron nitride nanostructures, etc.). The material can be deposited on the substrate by pulsed laser deposition. The melting can include melting at least a portion of the material using a nanosecond laser pulse. The melting and/or quenching can be performed in an environment at ambient temperature and pressure.

Some embodiments include a process for creating doped nanostructures incorporating one or more dopants at concentrations exceeding thermodynamic solubility limits. The process can include depositing a film and doping the film with one or more dopants. The process can also include melting at least a portion of the deposited, doped film into a super undercooled state. The process can further include quenching from the super undercooled state to form one or more doped nanostructures incorporating the one or more dopants at concentrations exceeding thermodynamic solubility limits. The dopants can be incorporated into the doped nanostructures at concentrations exceeding thermodynamic solubility limits via solute trapping. The material can be carbon (e.g., amorphous carbon) and the nanostructures formed can be doped diamond nanostructures (e.g., n-type/p-type diamond and/or diamond having nitrogen-vacancy (NV) centers). The material can be boron nitride (e.g., hexagonal boron nitride) and the nanostructures formed can include doped cubic boron nitride nanostructures. The film can be deposited on a substrate that can be adapted to provide a template for epitaxial growth such that the doped nanostructures are formed as epitaxial doped nanostructures epitaxial n-type/p-type/NV diamond nanostructures, epitaxial n-type/p-type cubic boron nitride nanostructures, etc.). The substrate can also be adapted placed deterministically on the substrate. The film can be deposited on the substrate by pulsed laser deposition. The melting can include melting at least a portion of the film using a nanosecond laser pulse. The melting and/or quenching can be performed in an environment at ambient temperature and pressure.

Some embodiments include a material comprising a plurality of carbon atoms having an amorphous structure, the bond length of each of the carbon atoms being less than 0.154 nm. The carbon-carbon bond length between the carbon atoms of the material can be between 0.142 and 0.154 nm. The carbon-carbon bond length between the carbon atoms of the material can be between 0.142 and 0.146 nm. A first portion of the plurality of carbon atoms of the material can form a three dimensional structure. The first portion of the material can form a tetrahedral shape. The material can be stable up to 3330 K The material can have a higher negative electron affinity than that of diamond. The negative electron affinity of the material can be at least seven percent greater than that of diamond. The material can be a semiconductor. The material can be metallic. The material can be harder than diamond.

Some embodiments include magnetic un-doped carbon. The magnetic un-doped carbon can be ferromagnetic.

Some embodiments include a phase of carbon that has a structure that is different than the structures of graphite and diamond.

Some embodiments include a phase of carbon having a higher negative electron affinity than diamond. The negative electron affinity can be at least seven percent greater than that of diamond. The phase of carbon can be a semiconductor or metallic depending on a quenching rate from an undercooled state. The phase of carbon can be stable up to 3330 K.

Some embodiments include a material harder than diamond.

Some embodiments include a material comprising a plurality of carbon atoms having an amorphous structure with no long-range order, the bond length of each of the carbon atoms being less than 0.154 nm. The carbon-carbon bond length between the carbon atoms of the material can be between 0.142 and 0.154 nm. The carbon-carbon bond length between the carbon atoms of the material can be between 0.142 and 0.146 nm. A first portion of the plurality of carbon atoms can form a three dimensional structure. The first portion can form a tetrahedral shape.

Some embodiments include a process that includes depositing amorphous carbon on a substrate. The process can include melting the amorphous carbon into an undercooled state. The process can also include quenching melted amorphous carbon can be melted from the undercooled state to create Q-carbon, diamond, and/or graphene. In some embodiments, the quenching can create Q-carbon and diamond composite. In some embodiments, the quenching creates diamond. In some embodiments, the quenching creates graphene. In some embodiments, the quenching creates Q-carbon. In some embodiments, the process also includes melting the Q-carbon and quenching the melted Q-Carbon to create diamond. In some embodiments, the created diamond (e.g., diamond created directly by quenching from undercooled amorphous carbon or diamond formed from melted Q-carbon) is a nanodot, nanodiamond, microdiamond, nanoneedle, microneedle, or large area single crystal film (ore portion thereof). In some embodiments, the process includes using the substrate as a template for epitaxial growth. In some embodiments, the created diamond is epitaxial single crystal.

Some embodiments include a process that includes melting amorphous carbon of an amorphous carbon film in an undercooled state by a laser pulse in an environment at ambient temperature and pressure. The process can include quenching the amorphous carbon from the undercooled state to form Q-carbon, graphene, and/or diamond. The quenching can form a diamond/Q-carbon composite. The process can also include melting the Q-carbon and quenching the melted Q-Carbon to create diamond (e.g., a nanodot, nanodiamond, microdiamond, nanoneedle, microneedle, or large area single crystal film (or a portion thereof)). The process can further include depositing a film of amorphous carbon on a substrate. The process can also include using the substrate as a template for epitaxial growth. The created or formed diamond can be an epitaxial single crystal.

Some embodiments include a process for creating diamond. The process can include depositing a film of amorphous carbon on a substrate by pulsed laser deposition. The process can also include melting a first portion of amorphous carbon of the amorphous carbon film in an undercooled state by a first laser pulse. The process can also include quenching the first portion of amorphous carbon from the undercooled state to form Q-carbon. The process can further include melting a first portion of the Q-carbon by a second laser pulse. The process can also include quenching the melted first portion of Q-Carbon to create a first diamond portion. The process can also include melting a second portion of the Q-carbon by a third laser pulse. The process can also include quenching the melted second portion of the Q-Carbon to create a second diamond portion. The first and second portions of diamond can form at least a portion of a nanodiamond, microdiamond, nanoneedle, microneedle, or large area single crystal film.

Some embodiments include a process for creating diamond and products formed by the process. The process can include melting amorphous carbon into an undercooled state. The process can also include quenching the amorphous carbon from the undercooled state to create diamond. The created diamond can be a nanodiamond, microdiamond, nanoneedle, microneedle, or large area single crystal film (or a portion thereof). The process can further include, before the melting, depositing a film of the amorphous carbon on a substrate. The process can also include epitaxially growing the created diamond using the substrate as a template for epitaxial growth. The substrate can be tungsten carbide, silicon, copper, sapphire, glass, or a polymer. The melting can include melting amorphous carbon in an undercooled state by a laser pulse in an environment at ambient temperature and pressure.

Some embodiments include a process for creating diamond. The process can include melting a first portion of amorphous carbon into an undercooled state by a laser pulse in an environment at ambient temperature and pressure. The process can also include quenching the first portion of amorphous carbon from the undercooled state to create a first portion of diamond. The created first portion of diamond can be at least part of a nanodiamond, microdiamond, nanoneedle, microneedle, gemstone, or large area single crystal film. The process can further include, after the quenching the first portion, melting a second portion of amorphous carbon into an undercooled state and quenching the second portion of the amorphous carbon to create a second diamond portion. The first and second portions of diamond can form a at least a portion of a nanodiamond, microdiamond, nanoneedle, microneedle, gemstone, or large area single crystal film. The process can further include, before the melting, depositing a film of the amorphous carbon on a substrate. The process can also include epitaxially growing the first portion of diamond using the substrate as a template for epitaxial growth.

Some embodiments include a process for creating diamond. The process can include depositing a film of amorphous carbon on a substrate. The process can also include melting a first portion of the amorphous carbon film in an undercooled state by a laser pulse in an environment at ambient temperature and pressure. The process can also include quenching the first portion of the amorphous carbon film from the undercooled state to create a first diamond portion using the substrate as a template for epitaxial growth. The process can further include, after the quenching the first portion, repositioning the laser pulse with respect to the film or repositioning the film with respect to the laser pulse. The process can also include, after the repositioning, melting a second portion of amorphous carbon in an undercooled state. The process can also include, quenching the second portion of the amorphous carbon to create a second diamond portion using the substrate as a template for epitaxial growth. The first and second portions of diamond together can form at least part of a nanodiamond, microdiamond, nanoneedle, microneedle, gemstone, or large area single crystal film.

Some embodiments include a process for creating Q-BN. The process can include melting boron nitride into an undercooled state by a laser pulse in an environment at ambient temperature and pressure. The process can also include quenching the undercooled boron nitride from the undercooled state to create Q-BN. The boron nitride can be hexagonal boron nitride. The melting can include nanosecond pulsed laser melting at ambient temperatures and atmospheric pressure in air. The process can further include melting the Q-BN. The process can also include quenching the melted Q-BN to create cubic boron nitride. The process can also include depositing diamond on the cubic boron nitride by pulsed laser deposition of carbon to create a cubic boron nitride and diamond heterostructure, the cubic boron nitride acting as a template for epitaxial diamond growth. The quenching the melted Q-BN can include quenching the melted Q-BN to create phase-pure cubic boron nitride. The process can include, before the melting, depositing the boron nitride as a film on a substrate at room temperature. The substrate can be tungsten carbide, silicon, sapphire, glass, or a polymer. The created cubic boron nitride can be a nanodot, microcrystal, nanoneedle, microneedle or large area single crystal film (or a portion thereof). The process can also include using the substrate as a template for epitaxial growth. The laser pulse can be a nanosecond laser pulse.

Some embodiments include a process for creating cubic boron nitride and products formed by the process. The process can include melting hexagonal boron nitride into an undercooled state by a laser pulse in an environment at ambient temperature and pressure. The process can also include quenching the undercooled hexagonal boron nitride to create cubic boron nitride. The quenching can include quenching the undercooled hexagonal boron nitride to phase-pure cubic boron nitride. The process can also include depositing a film of the hexagonal boron nitride on a substrate and using the substrate as a template for epitaxial growth. The created cubic boron nitride can be a nanodot, microcrystal, nanoneedle, microneedle, or large area single crystal film (or a portion thereof). The substrate can be tungsten carbide, silicon, copper, sapphire, glass, or a polymer. The melting can include melting the hexagonal boron nitride in an undercooled state by a laser pulse in an environment at ambient temperature and pressure.

Some embodiments include a process for creating cubic boron nitride and products formed by the process. The process can include depositing a film of hexagonal boron nitride on a substrate by laser pulse deposition. The process can also include melting a first portion of the hexagonal boron nitride film into an undercooled state by a first laser pulse in an environment at ambient temperature and pressure. The process can further include quenching the melted first portion of the hexagonal boron nitride film from the undercooled state to create a first cubic boron nitride portion. The process can also include moving the substrate with respect to an orientation of the laser pulse or moving the orientation of the laser pulse with respect to the film. The process can also include melting a second portion of the hexagonal boron nitride film adjacent the first portion of the film into an undercooled state by a second laser pulse in an environment at ambient temperature and pressure; The process can further include quenching the melted second portion of the hexagonal boron nitride film from the undercooled state to create a second cubic boron nitride portion. The created first and second cubic boron nitride portions together forming at least part of a nanodot, microcrystal, nanoneedle, microneedle, or large area single crystal film.

Some embodiments include a structure that includes a substrate and a plurality of NV-doped diamonds deterministically placed on the substrate. The plurality of NV doped diamonds can have a same orientation. The plurality of NV-doped diamonds can be epitaxial with the substrate.

Some embodiments include an NV-doped diamond having a concentration of NV-dopants that exceeds thermodynamic solubility limits.

Some embodiments include a process for creating NV-doped diamond at ambient temperature and pressure, the process including quenching carbon from an undercooled state to create the NV-doped diamond with NV-dopant concentrations that exceed thermodynamic solubility limits.

Some embodiments include a process for creating NV-doped diamond having substitutional nitrogen atoms and vacancies incorporated therein. The process can include depositing an amorphous carbon film on a substrate by pulsed laser deposition. The process can also include adding $N_2^+$ ions to the deposited amorphous carbon film. The process can further include, after the adding, melting a portion of the film with the added $N_2^+$ ions into an undercooled state. The process can also include quenching the melted portion from the undercooled state to create NV-doped diamond having substitutional nitrogen atoms and vacancies incorporated therein. The quenching can include rapid quenching from the undercooled state to create the NV-doped diamond with NV-dopant concentrations that exceed thermodynamic solubility limits. The rapid quenching can include using solute trapping to create the NV-doped diamond with NV-dopant concentrations that exceed thermodynamic solubility limits. The NV-doped diamond can have sharp transitions between $NV^-$ and $NV^0$. The process can also include configuring the substrate to deterministically place the created NV-doped diamond on the substrate. The NV-doped diamond can have transitions between $NV^-$ and $NV^0$, and the transitions can be controlled electrically and/or optically by laser illumination. The duration of the quenching can be between 200-250 nanoseconds. The process can also include epitaxially growing the created NV-doped diamond by using the substrate as a template for epitaxial growth. The created NV-doped diamond can be a nanodot, microcrystal, nanoneedle, microneedle, or large area single crystal film (or a portion thereof).

Some embodiments include a large area single crystal film comprising n-type doped diamond having a concentration of n-type dopants that exceeds thermodynamic solubility limits.

Some embodiments include an N-type doped diamond having a concentration of n-type dopants that exceeds thermodynamic solubility limits.

Some embodiments include a process for creating n-type and/or p-type diamond and products formed by the process. The process can include doping amorphous carbon with n-type and/or p-type dopants. The process can also include melting the doped amorphous carbon into an undercooled state. The process can further include quenching the melted amorphous carbon from the undercooled state to create n-type and/or p-type doped diamond. The n-type and/or p-type dopants can be incorporated into electrically active substitutional sites of the created diamond with concentrations exceeding solubility limits via solute trapping. The process can include, before the melting, depositing the amorphous carbon as a film on a substrate. The process can further include using the substrate as a template for epitaxial growth of the created n-type and/or p-type doped diamond. The created n-type and/or p-type doped diamond can be a nanodot, nanodiamond, microdiamond, nanoneedle, microneedle, or large area single crystal film (or a portion thereof). The melting can include melting the doped amorphous carbon into an undercooled state by a laser pulse in an environment at ambient temperature and pressure. The quenching can include quenching the melted amorphous carbon from the undercooled state to create n-type and/or p-type doped diamond in an environment at ambient temperature and pressure.

Some embodiments include a process for creating n-type and/or p-type diamond and products formed by the process. The process can include depositing a film of amorphous carbon on a substrate. The process can also include doping the amorphous carbon film with n-type and/or p-type dopants. The process can further include melting the doped amorphous carbon in an undercooled state by a laser pulse. The process can also include quenching the melted amorphous carbon from the undercooled state to form n-type and/or p-type doped diamond using the substrate as a template for epitaxial growth. The n-type and/or p-type dopants can be incorporated into electrically active substitutional sites of the created diamond with concentrations exceeding solubility limits via solute trapping.

Some embodiments include a process for creating n-type and p-type diamond and products formed by the process. The process can include depositing a film of amorphous carbon on a substrate. The process can also include doping at least a first portion of the amorphous carbon film with first dopants, the first dopants being n-type or p-type dopants.

The process can further include melting at least a first portion of the doped first portion of the amorphous carbon film into an undercooled state by a laser pulse. The process can also include quenching the melted first portion from the undercooled state to form a first doped diamond portion using the substrate as a template for epitaxial growth. The process can also include doping at least a second portion of amorphous carbon with second dopants. The second dopants can be n-type or p-type dopants. The second dopants can be different than the first dopants (e.g., the first dopants can be one type of the two types (n-type and p-type), and the second dopants can be the other type). The process can also include melting at least a second portion of the doped second portion of amorphous carbon into an undercooled state by a laser pulse. The process can further include quenching the melted second portion from the undercooled state to form a second doped diamond portion. The first and second dopants can be incorporated into the first and second doped diamond portions respectively at concentrations exceeding solubility limits via solute trapping. The first and second doped diamond portions can together form at least a portion of a p-n junction. The film can comprise the second portion of amorphous carbon, or the process can also include depositing, after quenching the melted first portion, a second film of the second portion of amorphous carbon.

Some embodiments include a process for creating n-type and/or p-type cubic boron nitride and products formed by the process. The process can include doping boron nitride with n-type and/or p-type dopants. The process can also include melting the doped boron nitride in an undercooled state. The process can further include quenching the melted boron nitride from the undercooled state to form n-type and/or p-type doped cubic boron nitride. The boron nitride can be hexagonal boron nitride. The n-type and/or p-type dopants can be incorporated into electrically active substitutional sites of the created cubic boron nitride with concentrations exceeding solubility limits via solute trapping. The process can also include, before the melting, depositing the boron nitride as a film on a substrate. The process can further include using the substrate as a template for epitaxial growth of the created n-type and/or p-type doped cubic boron nitride. The created n-type and/or p-type doped cubic boron nitride is a nanodot, microcrystal, nanoneedle, microneedle, or large area single crystal film (or a portion thereof). The melting can include melting the doped boron nitride in an undercooled state by a laser pulse in an environment at ambient temperature and pressure. The quenching can include quenching the melted boron nitride from the undercooled state to create n-type and/or p-type doped cubic boron nitride in an environment at ambient temperature and pressure.

Some embodiments include a process for creating n-type and/or p-type cubic boron nitride and products formed by the process. The process can include depositing a film of hexagonal boron nitride on a substrate. The process can also include doping the hexagonal boron nitride film with n-type and/or p-type dopants. The process can further include melting the doped boron nitride in an undercooled state by a laser pulse. The process can also include quenching the melted boron nitride from the undercooled state to form n-type and/or p-type doped cubic boron nitride using the substrate as a template for epitaxial growth. The n-type and/or p-type dopants can be incorporated into electrically active substitutional sites of the created cubic boron nitride with concentrations exceeding solubility limits via solute trapping.

Some embodiments include a process for creating n-type and p-type cubic boron nitride and products formed by the process. The process can include depositing a film of boron nitride (e.g., hexagonal boron nitride) on a substrate. The process can also include doping at least a first portion of the boron nitride film with first dopants, the first dopants being n-type or p-type dopants. The process can further include melting at least a first portion of the doped first portion of the boron nitride film into an undercooled state by a laser pulse. The process can also include quenching the melted first portion from the undercooled state to form a first doped cubic boron nitride portion using the substrate as a template for epitaxial growth. The process can also include doping at least a second portion of boron nitride with second dopants. The second dopants can be n-type or p-type dopants. The second dopants can be different than the first dopants (e.g., the first dopants can be one type of the two types (n-type and p-type), and the second dopants can be the other type). The process can also include melting at least a second portion of the doped second portion of boron nitride into an undercooled state by a laser pulse. The process can further include quenching the melted second portion from the undercooled state to form a second doped cubic boron nitride portion. The first and second dopants can be incorporated into the first and second doped cubic boron nitride portions respectively at concentrations exceeding solubility limits via solute trapping. The first and second doped cubic boron nitride portions can together form at least a portion of a p-n junction. The film can comprise the second portion of boron nitride, or the process can also include depositing, after quenching the melted first portion, a second film of the second portion of boron nitride.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 49A shows formation of super undercooled BN from which nano- and micro-cBN crystallites are formed.

FIG. 49B shows Q-BN converted into nanocrystalline films.

FIG. 49C shows Q-BN converted into large-area <111> platelets.

FIG. 49D shows Q-BN converted into single-crystal thin films.

DETAILED DESCRIPTION

Figure 1A:
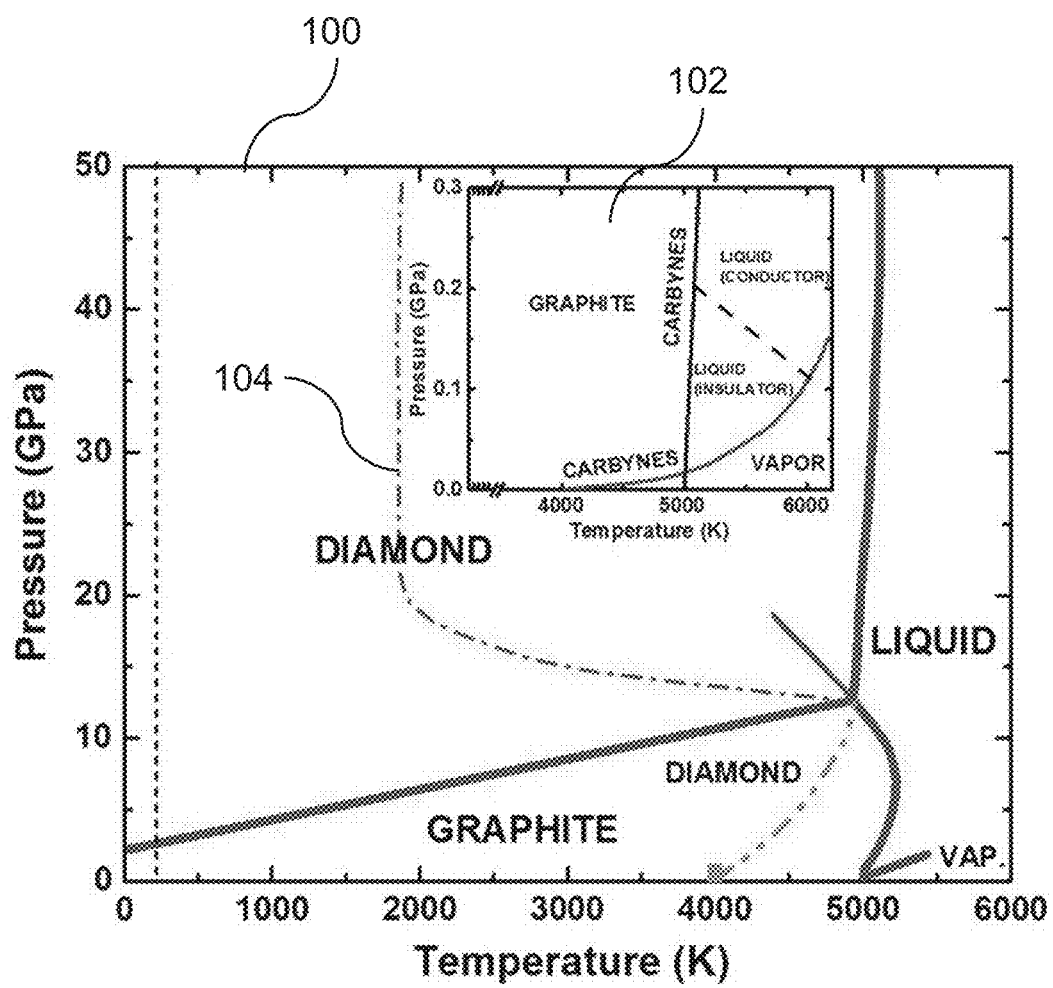
FIG. 1A is a graph depicting an example of a carbon phase diagram.

Certain aspects and features of the present disclosure are directed to converting carbon into graphene, diamond, and/or a phase of carbon from which diamond structures can grow or nucleate. In some examples, the phase of carbon can be referred to as quenched-in carbon ("Q-Carbon"). Q-carbon can include nanodiamond nuclei, which can provide a seed for growth of nanodiamond, microdiamond, single crystal diamond nanoneedles or microneedles, and single-crystal diamond films.

Carbon can be converted to Q-carbon by pulsed laser annealing and utilizing energy densities in the melting regime. In some examples, carbon can be directly converted into Q-carbon by irradiating a carbon film with a nanosecond laser. The carbon film can be on a substrate (e.g., a sapphire, glass, plastic, polymer, tungsten carbide, silicon, copper, stainless steel, or titanium nitride substrate). The laser can melt the carbon film and create a highly undercooled phase. The highly undercooled phase can cause a highly undercooled carbon layer to form near the carbon film and substrate interface. The carbon film can be cooled and retained at room temperature. Cooling the carbon film from the highly undercooled phase to room temperature can form a phase of carbon (e.g., Q-carbon). Q-carbon can be a state of solid carbon with a higher mass density than amorphous or diamond-like carbon. The Q-carbon can have a structure that has a mixture of four-fold $sp^3$ bonded carbon and some three-fold $sp^2$ bonded carbon. In some examples, the relative fraction for $sp^3$ bonded carbon can vary from seventy percent to eighty-five percent. The Q-carbon can have enhanced mechanical, chemical, and physical properties, including, for example, enhanced hardness, enhanced electrical conductivity, enhanced room-temperature ferromagnetism ("RTFM"), enhanced field emission, and enhanced electron emission (e.g., negative electron affinity). In some examples, the Q-carbon can be harder than diamond. For example, from covalent bond length determinations, the Q-carbon may be harder than diamond. As an example, the Q-carbon may have a shorter average carbon-carbon length than diamond (e.g., less than 0.154 nm). For example, the average carbon-carbon bond length can be between 0.142 nm and 0.146 nm. As another example, the average carbon-carbon length can be between 0.142 nm and 0.154 nm. In some examples, the Q-carbon may be a semiconductor. In other examples, the Q-carbon can be metallic. In still another example, the Q-carbon may exhibit robust ferromagnetism.

In some examples, nanodiamond nuclei can be embedded in the Q-carbon. The nanodiamond nuclei and lattice matching substrates can provide a seed for growth of a diamond microstructure, diamond nanostructure, or single-crystal diamond sheet. For example, the nanodiamond nuclei can provide a seed for growth of a nanodiamond, microdiamond, single-crystal diamond nanoneedle or microneedle, or large-area single-crystal diamond sheet. In some examples, a subsequent laser pulse can be applied to the Q-carbon. The subsequent laser pulse can cause nanodiamond on the Q-carbon to grow into microdiamond and nucleate other diamond structures (e.g., diamond nanoneedles, diamond microneedles and large-area single-crystal diamond sheets) on the microdiamond.

Diamond microstructures, diamond nanostructures, and single-crystal diamond sheets can be formed from super undercooled carbon depending on various factors, including, for example, the nucleation time and the growth time allowed for diamond formation, laser parameters, or the properties and characteristics of the substrate. Table 1, shown below, provides example parameters for forming diamond structures using ArF Excimer laser (193 nm wavelength and 20 ns pulse duration). The thermal conductivity of the substrate should be low enough to confine the laser energy into the carbon film.

TABLE 1

Parameters for diamond growth from super undercooled carbon using ArF (193 nm wavelength and 20 ns pulse duration) Excimer Laser

| Structure | Nucleation/Growth time | Laser Parameters |
| --- | --- | --- |
| Nanodiamond | 1-5 ns | 0.5 $Jcm^{-2}$-0.8 $Jcm^{-2}$ |
| Microdiamond | 50-100 ns | 0.6 $Jcm^{-2}$-0.8 $Jcm^{-2}$ |
| Nanoneedle | 100-150 ns | 0.5 $Jcm^{-2}$-0.8 $Jcm^{-2}$ |
| Microneedle | 200-250 ns | 0.5 $Jcm^{-2}$-0.8 $Jcm^{-2}$ |
| Single-crystal film | 100-250 ns | 0.6 $Jcm^{-2}$-0.8 $Jcm^{-2}$ |

The diamond microstructures, nanostructures, and single-crystal sheet can each be integrated on a substrate (e.g., a silicon or plastic substrate). Diamond structures formed from Q-carbon can have various enhanced characteristics including, for example, enhanced electron emission properties.

In some examples, carbon can be converted into Q-carbon at ambient temperatures (e.g., room temperature) and atmospheric pressure in air (e.g., pressure of a surrounding medium, including, for example, air). The conversion of carbon to Q-carbon may occur in the absence of any catalyst or in the absence of hydrogen. For example, carbon can be converted into Q-carbon by irradiating an amorphous (e.g., diamond-like) carbon film with a nanosecond laser. The laser can provide a nanosecond laser pulse that can melt the amorphous carbon film. Using the nanosecond laser pulses to melt the amorphous carbon film can create a highly undercooled state, which can cause a highly undercooled carbon layer to form near an interface between the carbon film and the substrate. Quenching the carbon while in the highly undercooled state may cause the highly undercooled carbon layer to break into a cellular (e.g., filamentary) structure, which can create Q-carbon from which various forms of diamond can be formed. The diamond can be in the form of a nanodiamond (e.g., a diamond that has a size range of less than 100 nanometers (nm)). In another example, carbon can be converted into diamond in the form of a microdiamond (e.g., a diamond that has a size range of greater than 100 nm). In still another example, carbon can be converted into diamond in the form of a nanoneedle or microneedle. In some examples, a diamond microneedle can have a length of up to 2000 nm. In another example, a diamond microneedle or diamond nanoneedle may be a diamond with a diameter between 80 nm to 500 nm and a length between 2000 nm to 3000 nm. In other examples, diamond microstructures can be formed from the Q-carbon including, for example, diamond nanodots, nanorods, or large-area single-crystal diamond films.

In some examples, creating a highly undercooled state of amorphous carbon can modify the equilibrium phase diagram of carbon. For example, creating the highly undercooled state can shift the graphite, diamond, and liquid carbon triple point from a high-pressure and temperature to low pressures and temperatures. Quenching or cooling the amorphous carbon from the highly undercooled state can cause a nanodiamond to nucleate. In some examples, a microdiamond may grow out of the highly undercooled state of the amorphous carbon. For example, a nanodiamond may act as a seed crystal for growing the microdiamond. In certain examples, diamonds formed from the amorphous carbon may have various enhanced characteristics and properties (e.g., ferromagnetism at room-temperature and higher, enhanced hardness, enhanced electron emission and catalytic properties).

In some examples, an amorphous metastable phase of carbon can be converted into Q-carbon at ambient temperatures and atmospheric pressure in air. The amorphous carbon can include bonding characteristics that may be a mixture of graphite (e.g., $sp^2$ bonded) and diamond (e.g., $sp^3$ bonded). In some examples, the amorphous carbon can be on a substrate, including, for example, a sapphire, a plastic or a glass substrate. The amorphous carbon can be melted at a low temperature (e.g., at 4000K or more than 1000K below the melting point of crystalline carbon or graphite) to create a highly undercooled state of carbon liquid. In some examples, the highly undercooled state can be created by irradiating the amorphous carbon using a nanosecond laser. The laser can be a nanosecond Excimer pulsed laser or an equivalent energy source (e.g., ArF Excimer laser (wavelength 193 nm or photon energy of 6 eV and pulse duration 20 ns)). Nanosecond laser pulses from the laser can melt the amorphous carbon film and create the highly undercooled state. The highly undercooled state can cause a highly undercooled carbon layer to form near an interface between the carbon film and the substrate. In some examples entire layer of carbon can be converted into the Q-carbon phase. In some examples, diamond nanocrystallites can be nucleated from four-fold coordinated ($sp^3$ bonded) carbon present in the highly undercooled state of the amorphous carbon. Undercooling the amorphous carbon can shift the amorphous carbon, diamond, and liquid carbon triple point to 4000K or lower at ambient pressures (e.g., pressure of a surrounding medium). At temperatures below 4000K, Gibbs free energy of amorphous carbon can equal the free energy of highly undercooled liquid and metastable diamond phase that is quenched and retained at room temperature. In some examples, the amorphous carbon can be metallic in the highly undercooled state, which can cause the carbon atoms to be closely packed with a significant shrinkage. In some examples, packing the carbon atoms can cause the amorphous carbon to have a mass density and hardness that is greater than that of diamond. The amorphous carbon can be quenched to room temperature after a period of time in the undercooled phase. Quenching the amorphous carbon from the undercooled phase to room temperature can form Q-carbon. A subsequent laser pulse can be applied to the Q-carbon. The subsequent laser pulse can melt the Q-carbon and create a highly undercooled state. The Q-carbon can be quenched from the highly undercooled state to room temperature. Quenching the Q-carbon can form diamond microstructures, diamond nanostructures, and single-crystal diamond sheets. Diamond microstructures, diamond nanostructures, and single-crystal diamond sheets may be formed depending on a number of factors, including, for example, parameters of the nanosecond pulsed laser, orientation of the substrate, the amount of time in the undercooled phase, nucleation time and growth time allowed for diamond formation, etc.

In some examples, shrinkage and internal melting of the amorphous carbon while in the undercooled state can cause bubbles to form. The bubbles may burst and allow a single-crystal diamond microneedle or nanoneedle to grow out of the bubbles, depending on a size of the bubble. In another example, a microneedle can be formed from the Q-carbon through explosive recrystallization, where nanodiamonds nucleate from the Q-carbon and grow rapidly by liquid mediated explosive recrystallization. In some examples, a diamond microneedle can have a length of up to 2000 nm. In another example, a diamond microneedle or nanoneedle may be a diamond with a diameter between 80 nm to 500 nm and a length between 2000 nm to 3000 nm. In some examples, the diamond microneedle or nanoneedle may have a growth velocity between 5 $ms^{-1}$ and 10 $ms^{-1}$. In another example, the diamond microneedle or nanoneedle may have a melt lifetime between about 250 ns to 500 ns.

In certain examples, nanodiamond crystals can nucleate from the undercooled state and can provide a seed for growth of nanodiamond, microdiamond, diamond nanoneedles, diamond microneedles, or single-crystal diamond films. In some examples, the undercooling state may be retained for a sufficient period of time to allow nanodiamond, microdiamond, diamond nanoneedles, diamond microneedles, or single-crystal diamond films to nucleate and grow.

The laser heating of the amorphous carbon can be confined spatially and temporally. Confining the laser heating of the amorphous carbon can allow diamond structures (e.g., microdiamonds, nanodiamonds, diamond microneedles, diamond nanoneedles, diamond films, etc.) formed from the amorphous carbon to be deposited on heat-sensitive substrates (e.g., low thermal conductivity substrates, including, for example, sapphire, silicon, plastic, or glass). In another example, converting carbon into Q-carbon, nanodiamond, microdiamond, diamond nanoneedles, diamond microneedles, or single-crystal diamond films can allow the integration of diamond thin film based devices with silicon based microelectronic and nanoelectronic devices.

Directly converting carbon into diamond at ambient pressures and temperatures in air can increase production volume of diamond and can reduce costs associated with producing diamonds. Directly converting carbon into diamond at ambient pressures and temperatures in air may also enhance the synthesis and processing of nanodiamonds and microdiamonds for various applications, including, for example, abrasive powders, protective coatings, catalytic properties, display devices, biomedical and microelectronic and nanoelectronic applications, photonics, etc. Directly converting carbon into diamond nanoneedles and microneedles may enhance the production of field emission based devices and may be beneficial for biomedical applications (e.g., minimally invasive transdermal medical devices for various applications, including, for example, drug delivery, fluid sampling, micro-dialysis, electrochemical sensing, etc.). In other examples, directly converting carbon into large area single-crystal diamond films can allow n-type doping (e.g., adding an impurity that contributes free electrons and increases conductivity) and p-type doping (e.g., adding an impurity that can create a deficiency of valence electrons) of the diamond films, which may enhance the processing of high-power devices and high-power transistors.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative examples but, like the illustrative examples, should not be used to limit the present disclosure.

FIG. 1A is a graph depicting an example of a carbon phase diagram 100. The carbon phase diagram 100 includes an inset 102. Inset 102 depicts an example of a carbon phase diagram at low pressures. In the carbon phase diagram 100, graphite, diamond, liquid, and vapor can be thermodynamically stable forms of carbon. At low pressures, graphite can convert into vapor around 4000K. In the carbon phase diagram 100, diamond synthesis from liquid carbon can require higher temperatures and pressures as the graphite, diamond, and liquid carbon triple point occurs at 5000K and 12 GPa, where 1 GPa is equal to 9869 Atm. Based on the carbon phase diagram 100, diamond can exist in the interiors of the outer planets (e.g., Uranus and Neptune) and Earth's mantle, where pressure and temperature are 600 GPa and 7000K, and 135 GPa and 3500K, respectively. In the carbon phase diagram 100, graphite can be transformed into diamond above about 2000K at 6 to 10 GPa using liquid metal catalysts, which can be used for commercial synthesis of diamond. In some examples, carbon polymorphs can exist metastably well into a pressure-temperature region, where a different phase is thermodynamically stable. As an example, diamond can survive indefinitely at room temperature, where graphite is the stable form.

FIG. 1A also depicts a shift 104 in the carbon phase diagram 100. In some examples, carbon can be melted at a low temperature (e.g., more than 1000K less than the melting point of crystalline carbon). Melting carbon at a low temperature can create a highly undercooled state of carbon liquid, which can be of metallic nature. The highly undercooled state can be created by irradiating the carbon using a nanosecond laser. The laser can be a nanosecond Excimer pulsed laser. For example, a nanosecond laser pulse from the laser can melt the carbon and create the highly undercooled state. Creating the highly undercooled state can modify the carbon phase diagram 100. For example, creating the highly undercooled state can cause the shift 104. The shift 104 can represent a shift in the carbon, diamond, and liquid carbon triple point. The shift 104 can be a shift in the triple point from high-pressure and temperature to low pressures and temperature. In some examples, the carbon, diamond, and liquid carbon triple point can be shifted to 4000K or lower at ambient atmospheric pressures.

In some examples, quenching or cooling the amorphous carbon from the highly undercooled state to room temperature can create a phase of carbon. In some examples, the phase of carbon can be referred to as Q-Carbon. Q-carbon can be a state of solid carbon with a structure that has a mixture of four-fold $sp^3$ bonded carbon and $sp^2$ bonded carbon. In some examples, the Q-carbon can have a structure that has a mixture of mostly four-fold $sp^3$ bonded carbon and some three-fold $sp^2$ bonded carbon (distinct entropy). The Q-carbon can have enhanced magnetic, mechanical, chemical, and physical properties, including, for example, enhanced room-temperature ferromagnetism ("RTFM") and enhanced field emission. In some examples, the Q-carbon can be harder than diamond. For example, from covalent bond length determinations, the Q-carbon may be harder than diamond (e.g., the Q-carbon can have a shorter average carbon-carbon bond length than diamond). In some examples, the relative hardness of the Q-carbon as measured by Hysitron Nanoindentor can be over 60% higher than that of diamond-like amorphous carbon.

In some examples, a subsequent laser pulse can be applied to the Q-carbon. The subsequent laser pulse can create a highly undercooled state. Quenching or cooling the Q-carbon from the highly undercooled state can cause graphene or various forms of diamond (e.g., diamond nanoneedles, microneedles, single-crystal films, nanodots, or nanorods) to form. Various forms of diamond can form from super undercooled state of carbon depending on various factors, including, for example, the nucleation and growth times allowed for diamond formation. In some examples, a nanodiamond can act as a seed crystal for growing a microdiamond.

Figure 1B:
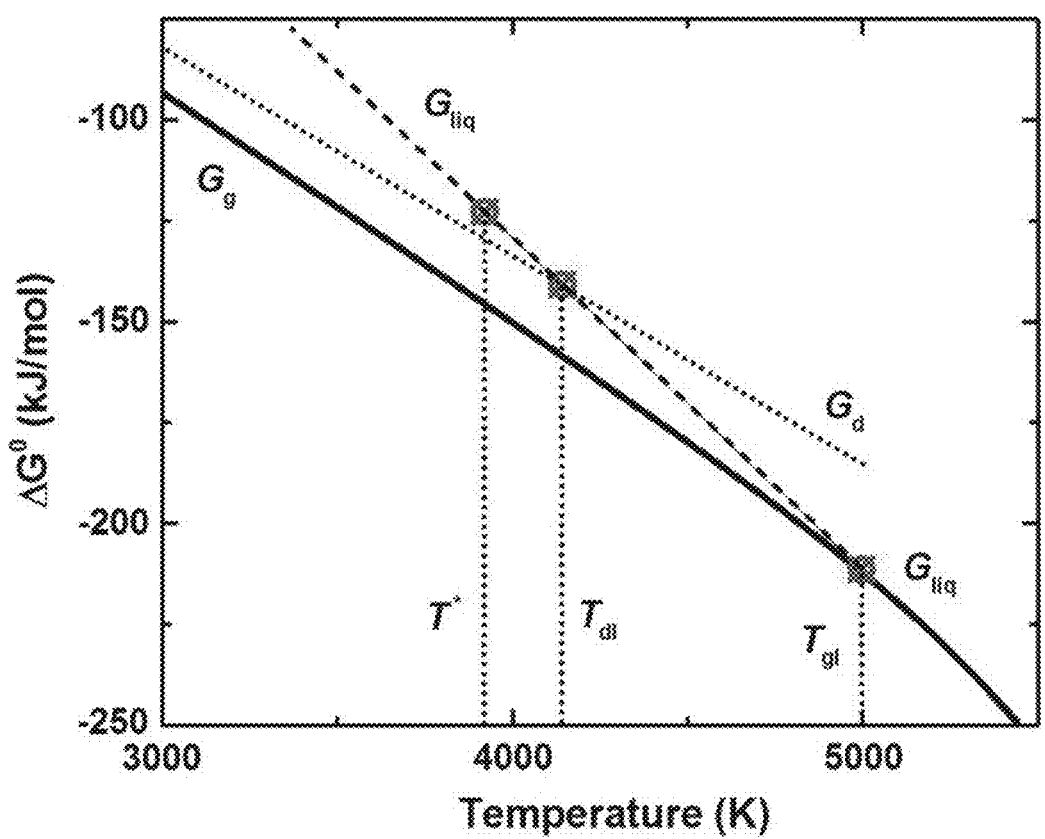
FIG. 1B is a graph depicting Gibbs free energy as a Function of Temperature for Graphite ($G_g$), Liquid Carbon ($G_{liq}$) and Diamond ($G_d$).

FIG. 1B shows thermodynamic Gibbs free energy variation as a function of temperature for Graphite ($G_g$), Liquid Carbon ($G_{liq}$) and Diamond ($G_d$). It depicts equilibrium carbon melting temperature of $T_{gl}$ (~5000K) where liquid carbon free energy ($G_{liq}$) equals ($G_g$), $T_{dl}$ (slightly above 4000K) where super undercooled carbon liquid can be quenched into diamond in various nanostructures and microstructures, and T* (slightly below 4000K) where super undercooled carbon liquid can be quenched into Q-carbon.

Figure 2:
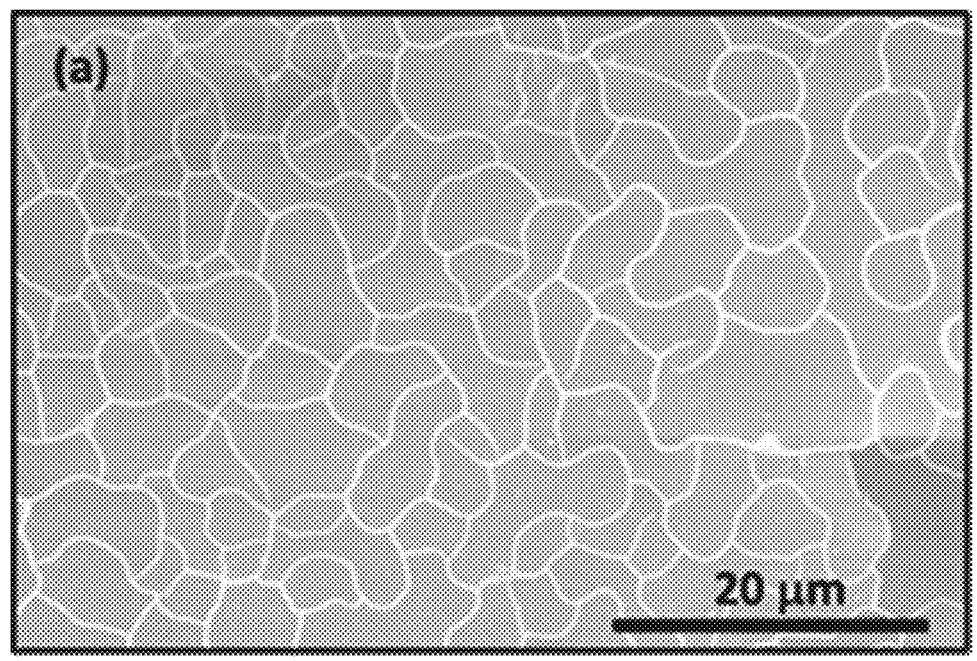
FIG. 2 is a top view of a scanning electron microscope ("SEM") micrograph showing a cellular structure of a Q-carbon filament.
Figure 3:
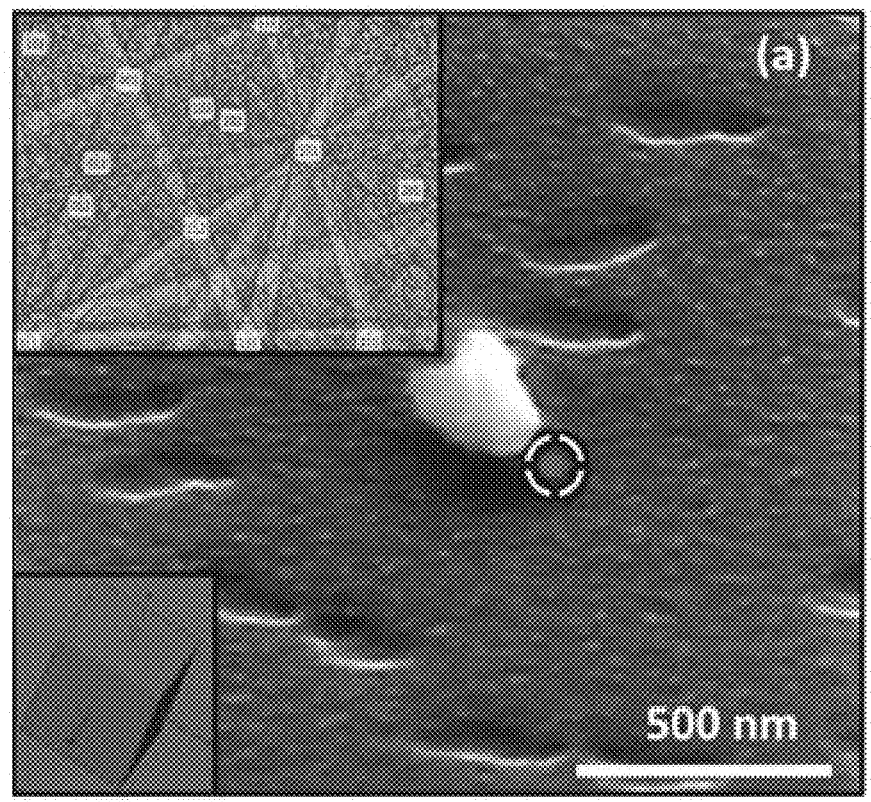
FIG. 3 is an image showing formation of a nanodiamond.

FIG. 2 is a top view of a scanning electron microscope ("SEM") micrograph showing a cellular structure of a Q-carbon filament. In some examples, the Q-carbon filament can be formed after a laser pulse is applied to amorphous carbon. The amorphous carbon can be on a substrate, including, for example, a sapphire substrate, a plastic substrate, a glass substrate, or composite substrate consisting of copper/sapphire ("Cu/Sapphire") or copper/titanium nitride/silicon ("Cu/TiN/Si"). The laser pulse can be provided by a nanosecond Excimer pulsed laser (e.g., an ArF Excimer laser). The laser can have a wavelength of 193 nm. The laser can have a pulse duration of 20 nanoseconds (ns). The energy density of the laser pulse can be 0.5 $Jcm^{-2}$. The Q-carbon filament can have a size of 200 nm to 500 nm across. In another example, a similar microstructure of Q-carbon filament can be formed by applying a laser pulse with an energy density of 0.6 $Jcm^{-2}$ to the amorphous carbon. The Q-carbon filament can have enhanced mechanical, chemical, and physical properties, including, for example, enhanced hardness, enhanced electrical conductivity, enhanced room temperature ferromagnetism ("RTFM"), enhanced field emission (e.g., negative surface potential), and enhanced electron emission (e.g., negative electron affinity). As an example, the Q-carbon can have enhanced ferromagnetism with a Curie temperature at about 500K. In another example, the Q-carbon can have enhanced ferromagnetism with a Curie temperature over 500K. The Q-carbon may have a density that is greater than the amorphous carbon. In some examples, the Q-carbon can be harder than diamond. In some examples, the Q-carbon can have a matrix of mostly $sp^3$ bonded amorphous carbon. In some examples, nanodiamond nuclei or diamond nanocrystallites can nucleate from or be embedded within the four-fold coordinated ($sp^3$ bonded) Q-carbon. For example, FIG. 3 is an image showing formation of a nanodiamond.

Figure 4:
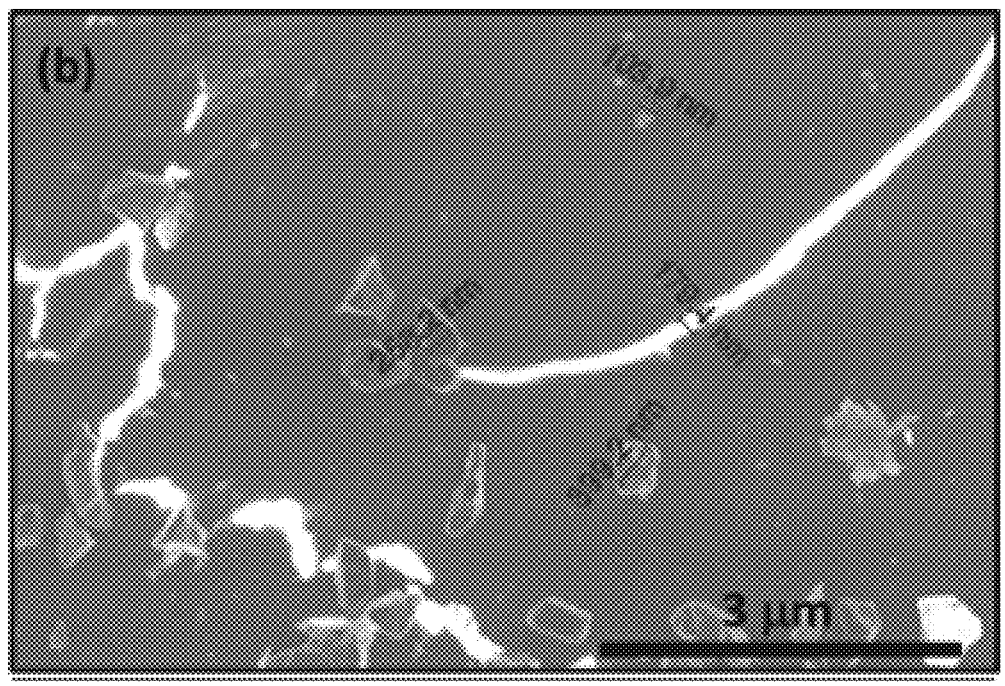
FIG. 4 is a top view of an SEM micrograph showing growth of microdiamonds from a Q-carbon filament that contained nanodiamond nuclei.

In some examples, the nanodiamond nuclei or lattice matching substrate can provide a seed for growth of nanodiamonds, microdiamonds, diamond nanoneedles, diamond microneedles, or large-area single-crystal diamond sheets. For example, FIG. 4 is a top view of an SEM micrograph showing growth of microdiamonds from a Q-carbon filament that contained nanodiamond nuclei (e.g., the Q-carbon filament of FIG. 2). In the example shown in FIG. 4, the Q-carbon filament can be formed by applying a single laser pulse with a wavelength of 193 nm, a pulse duration of 20 ns and an energy density of 0.6 $Jcm^{-2}$ to amorphous carbon. In some examples, the microdiamonds formed from the Q-carbon can have a size greater than 100 nm. In the example shown in FIG. 4, the size of each microdiamond can be between 500 nm and 600 nm.

Figure 5:
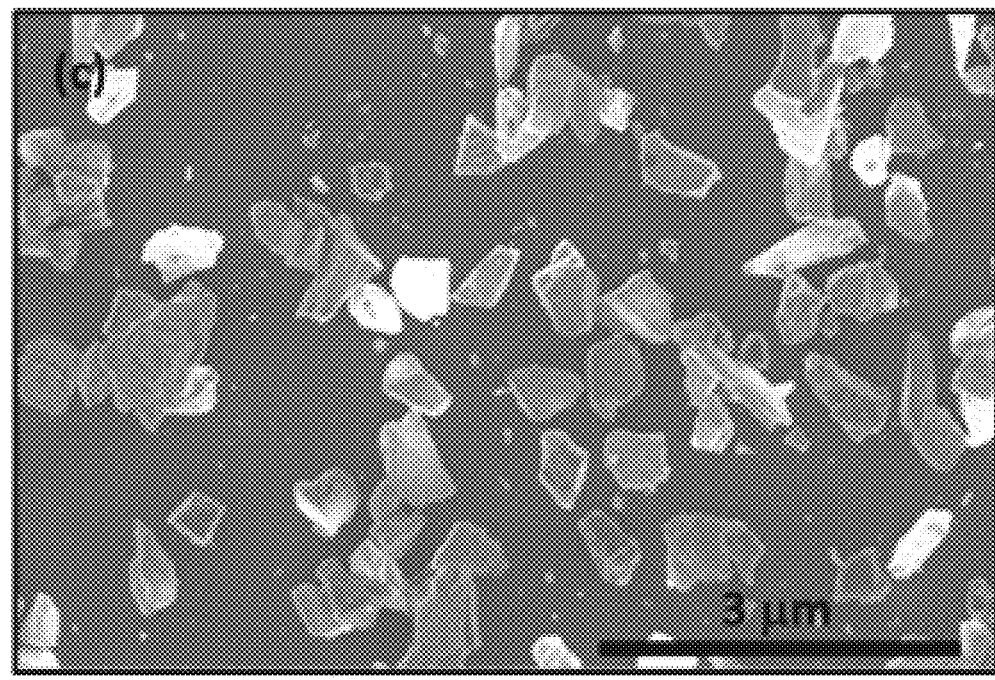
FIG. 5 is a top view of an SEM micrograph showing an area near the middle of an irradiated amorphous carbon that includes a high density of nanodiamonds and microdiamonds.
Figure 6:
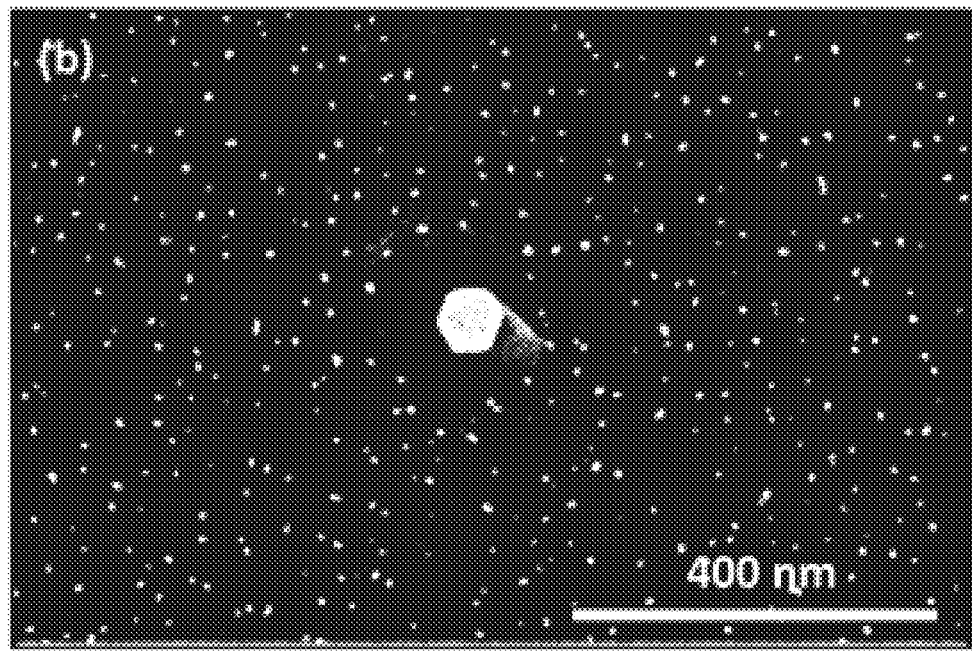
FIG. 6 is a top view of an SEM micrograph showing formation of nanodiamonds from a Q-carbon.

In some examples, an area near the middle of the laser irradiated amorphous carbon can include a high density of nanodiamonds and microdiamonds. For example, FIG. 5 is a top view of an SEM micrograph showing an area near the middle of an irradiated amorphous carbon that includes a high density of nanodiamonds and microdiamonds. In some examples, a nanodiamond can have a size of less than 100 nm. In the example shown in FIG. 5, each nanodiamond can have a size between 10 nm and 20 nm. In another example, nanodiamonds formed from a Q-carbon can be of other sizes. For example, FIG. 6 is a top view of an SEM micrograph showing formation of nanodiamonds from a Q-carbon. In the example shown in FIG. 6, each nanodiamond can have a diameter between 2 nm and 8 nm.

Figure 7:
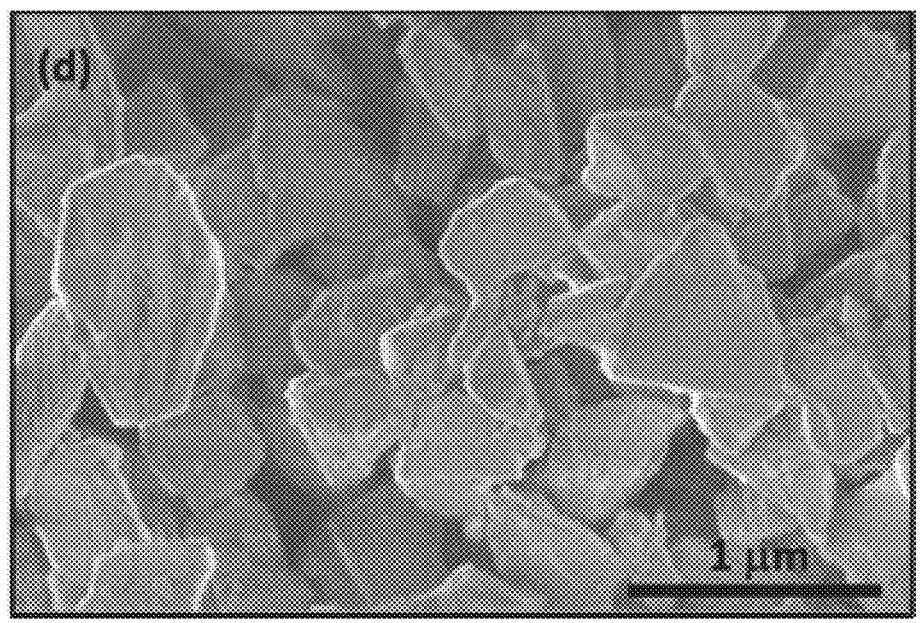
FIG. 7 is a top view of an SEM micrograph showing an area near the middle of an irradiated amorphous carbon that includes mostly microdiamonds.

In some examples, an area near the irradiated amorphous carbon can include a high density of mostly microdiamonds. For example, FIG. 7 is a top view of an SEM micrograph showing an area near the middle of an irradiated amorphous carbon that includes mostly microdiamonds. In some examples, microdiamonds may cover an entire area of the amorphous carbon.

Figure 8:
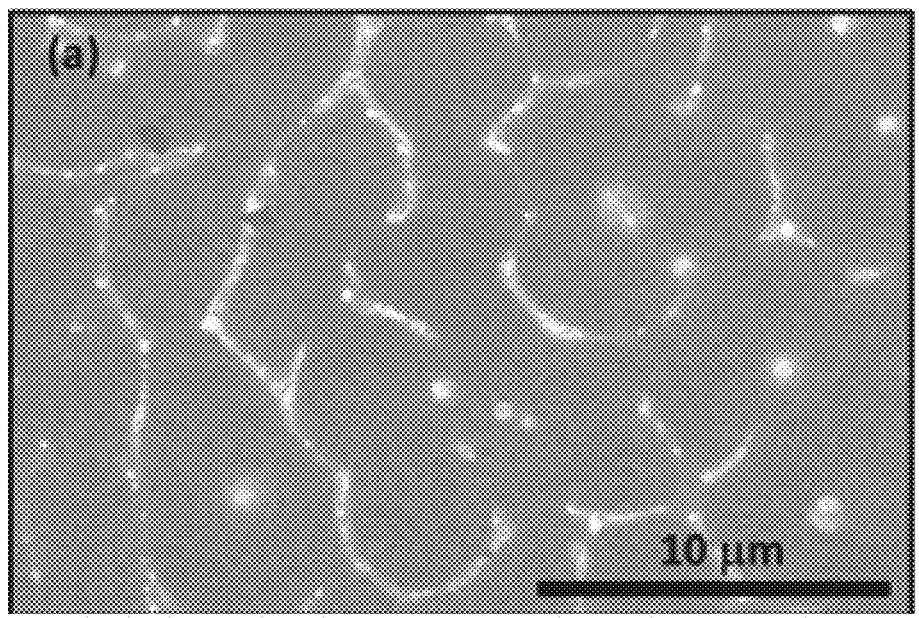
FIG. 8 is a top view of an SEM micrograph showing a Q-carbon filament growing microdiamond through the growth of nanodiamonds.

In some examples, a subsequent laser pulse can be applied to the Q-carbon. The subsequent laser pulse can cause nanodiamond formation on the Q-carbon to grow microdiamond and nucleate other diamond structures. For example, a nanodiamond can provide, or act as, a seed crystal for growth of microdiamond. As an example, FIG. 8 is a top view of a SEM micrograph showing a Q-carbon filament growing microdiamond through the growth of nanodiamonds. In some examples, a nanodiamond that acts as a seed for growth of the microdiamonds may exist on the Q-carbon filament prior to the subsequent laser pulse being applied to the Q-carbon.

Figure 9:
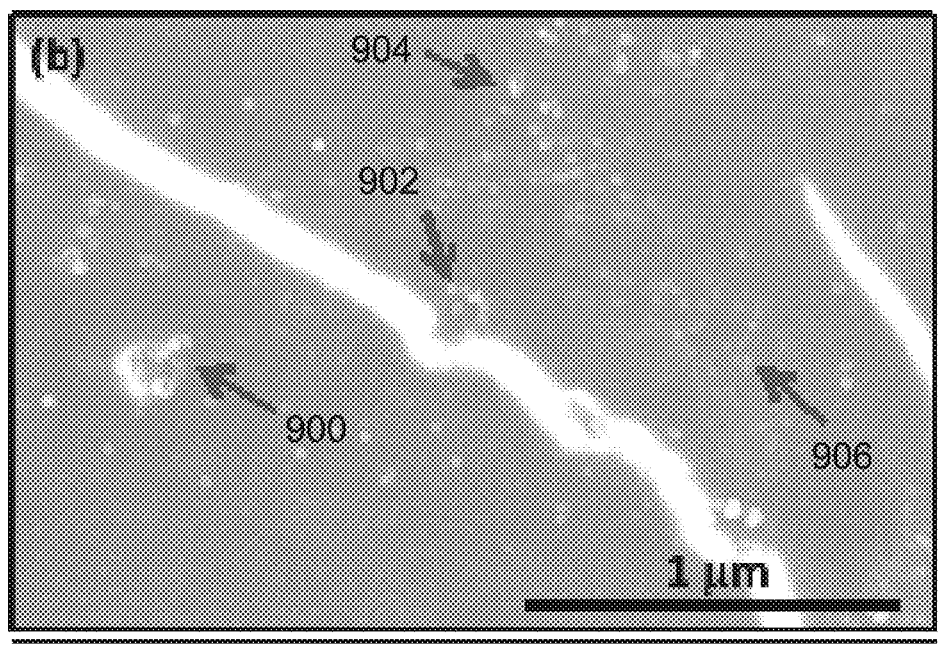
FIG. 9 is a top view of an SEM micrograph showing formation of nanodiamonds by homogeneous nucleation and on top of existing microdiamonds formed by heterogeneous nucleation (shown by arrows).
Figure 10:
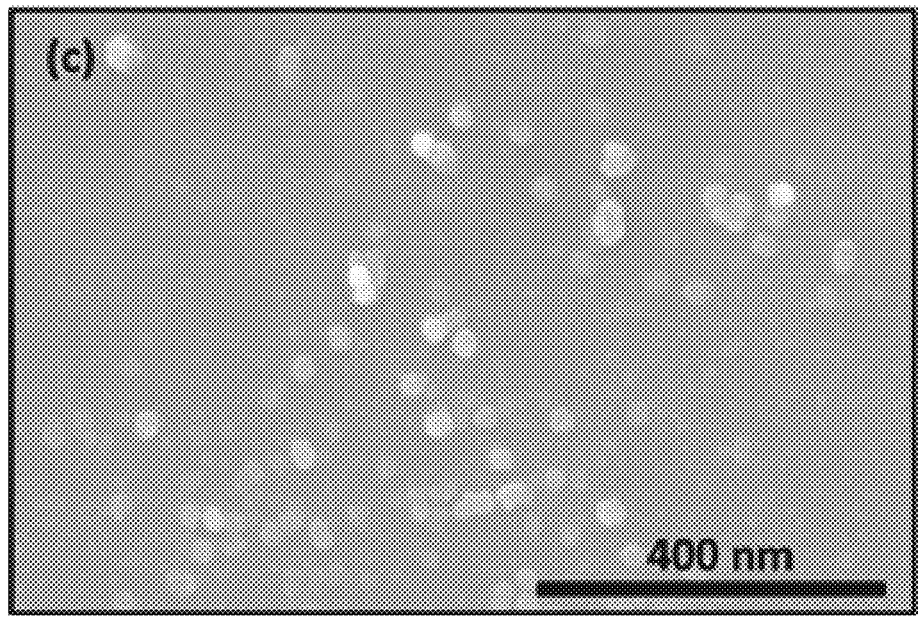
FIG. 10 is a top view of an SEM micrograph showing formation of nanodiamonds by homogeneous nucleation between Q-carbon filaments.

FIG. 9 is a top view of an SEM micrograph showing formation of nanodiamonds by homogeneous nucleation and on top of existing microdiamonds formed by heterogeneous nucleation. In some examples, homogeneous nucleation may occur prior to applying the subsequent laser pulse to the Q-carbon. In some examples, heterogeneous nucleation may occur after the subsequent laser pulse is applied to the Q-carbon. In the example shown in FIG. 9, nanodiamonds 900, 902, 904, 906 can be formed by heterogeneous nucleation. In some examples, the nanodiamonds formed by homogeneous nucleation can be formed between the Q-carbon filament. For example, FIG. 10 is a top view of an SEM micrograph showing formation of nanodiamonds by homogeneous nucleation between Q-carbon filaments. In the example shown in FIG. 10, the nanodiamonds can have a size between 10 nm and 20 nm.

Figure 11:
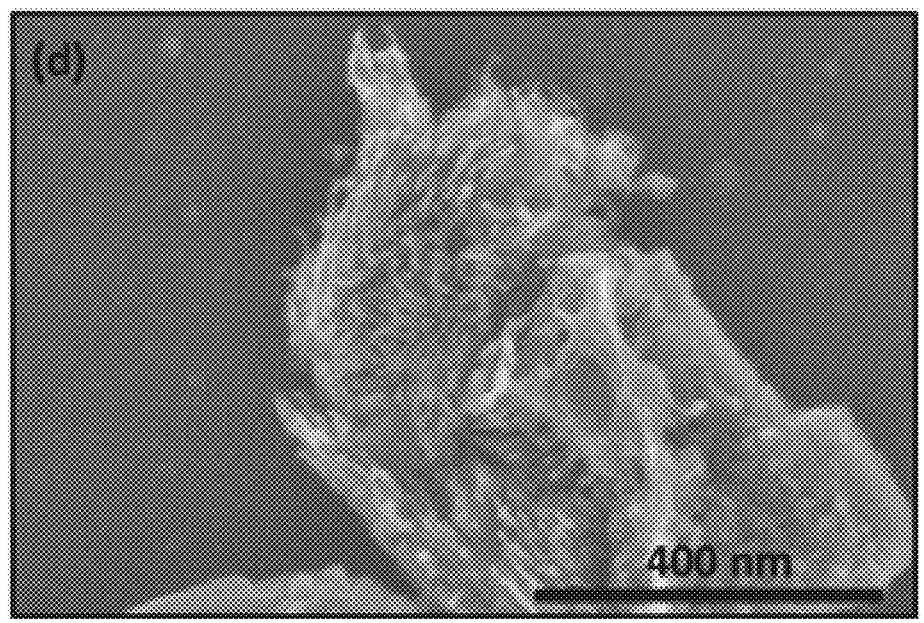
FIG. 11 is a top view of SEM micrograph showing diamond nanodots and nanorods nucleating from Q-carbon.

In some examples various diamond structures can be formed from the Q-carbon. For example, nanodots and nanorods can form from the Q-carbon. As an example, FIG. 11 is a top view of an SEM micrograph showing diamond nanodots and nanorods nucleating from Q-carbon. In some examples, a laser pulse can be applied to the Q-carbon after the Q-carbon is formed from the amorphous carbon. The laser pulse may cause the Q-carbon to melt while microdiamonds on the Q-carbon may not melt. Melting the Q-carbon while not melting the microdiamonds can allow the diamond nanodots and nanorods to nucleate from the Q-carbon.

Figure 12:
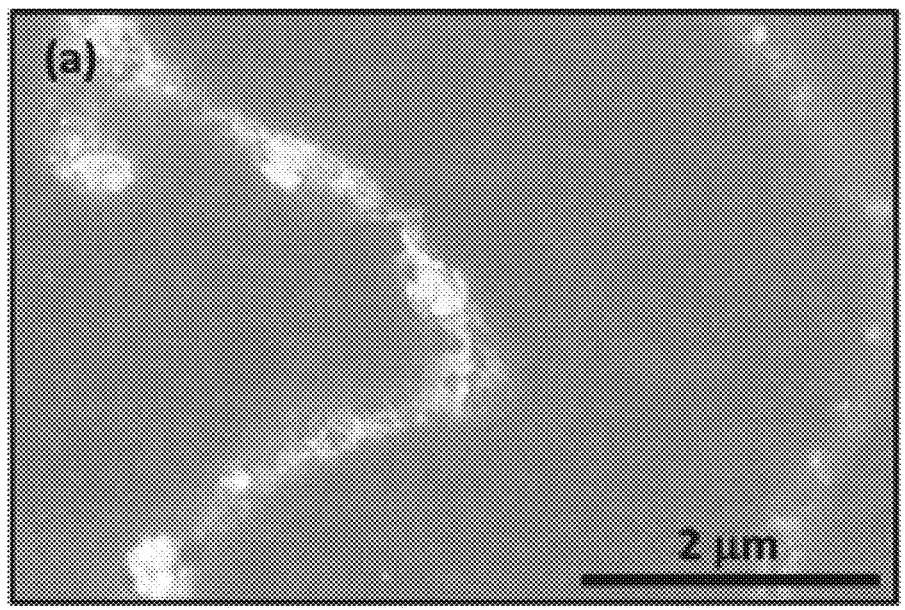
FIG. 12 is a top view of an SEM micrograph showing microdiamonds forming when most of a Q-carbon filament is converted into diamond by second laser pulse.

In some examples, most of a Q-carbon filament can be converted into microdiamonds or nanodiamonds. For example, FIG. 12 is a top view of an SEM micrograph showing microdiamonds forming when most of a Q-carbon filament is converted into diamond.

Figure 13:
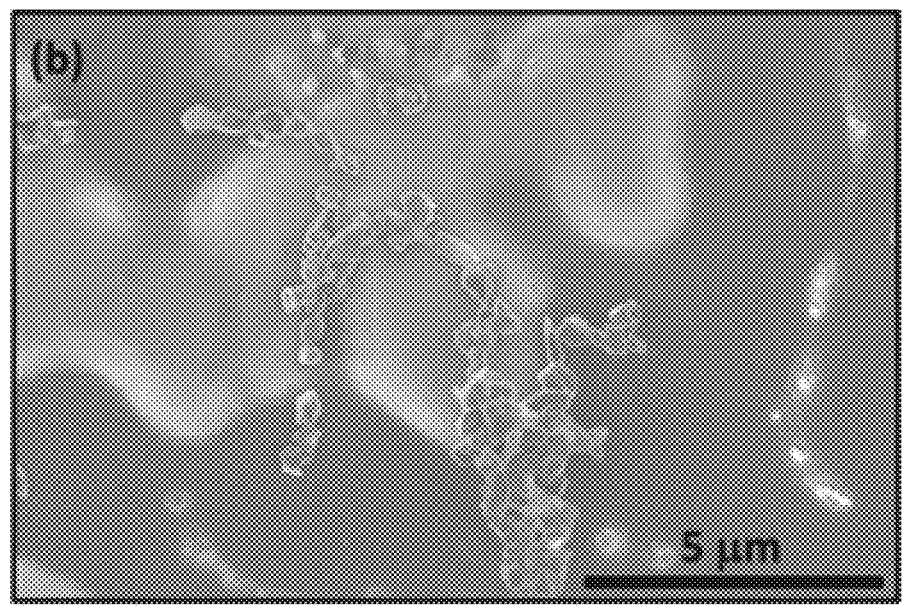
FIG. 13 is a top view of an SEM micrograph showing a full conversion of amorphous Q-carbon into a string of microdiamonds.

FIG. 13 is a top view of an SEM micrograph showing a full conversion of amorphous Q-carbon into a string of microdiamonds. In the example shown in FIG. 13, at least a portion of the Q-carbon may have microdiamonds embedded within the Q-carbon. In some examples, microdiamonds embedded into the Q-carbon within the Q-carbon may not be converted completely into diamond.

Figure 14:
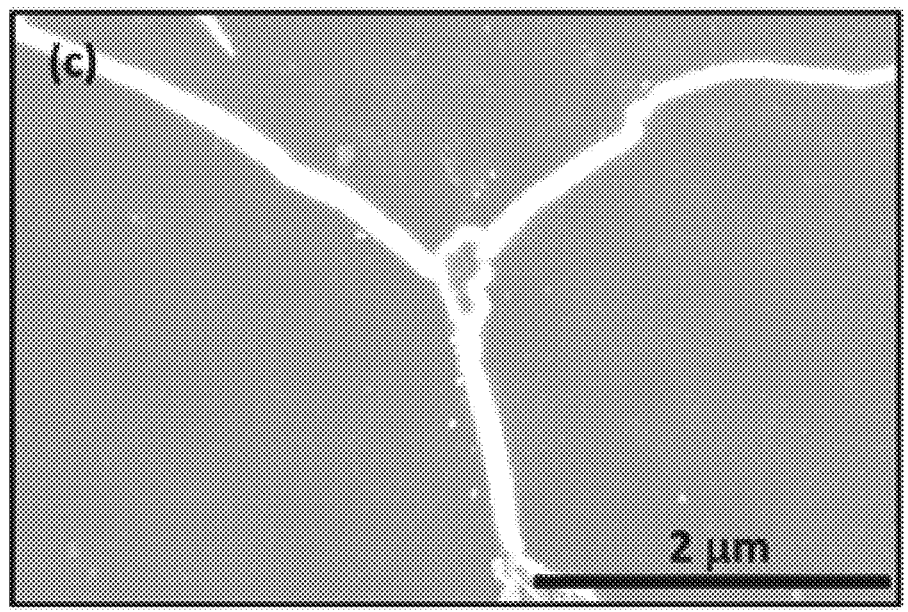
FIG. 14 is a top view of an SEM micrograph showing a triple point of a Q-carbon filament and the nucleation of diamond.

FIG. 14 is a top view of an SEM micrograph showing a triple point of a Q carbon filament and the nucleation of diamond. In some examples, the triple point of the Q-carbon filament may provide a site for enhanced nucleation of nanodiamonds, microdiamonds, diamond nanoneedles, diamond microneedles, or large-area single-crystal diamond sheets.

Figure 15:
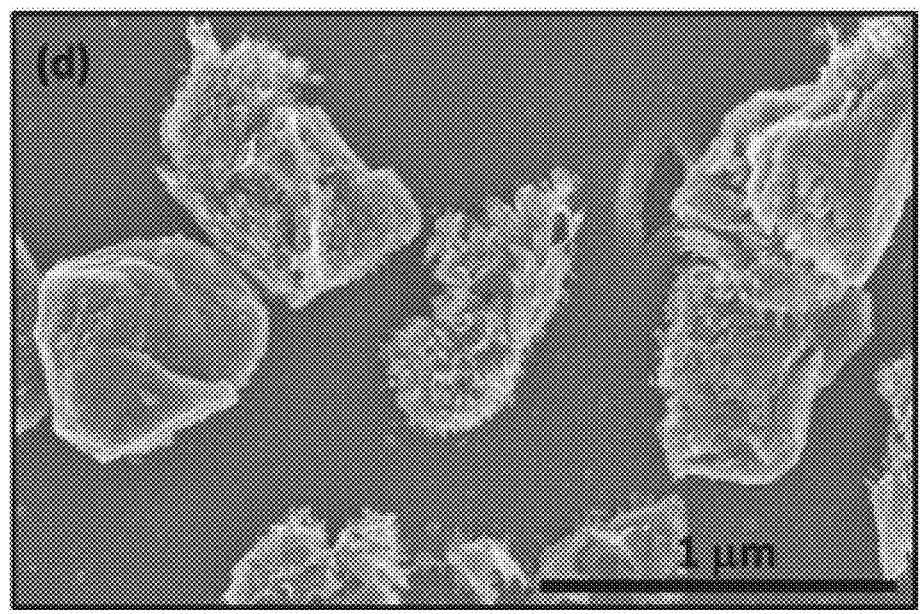
FIG. 15 is a top view of an SEM micrograph showing heterogeneous nucleation of nanodiamonds after a laser pulse is applied to the Q-carbon.

FIG. 15 is atop view of an SEM micrograph showing heterogeneous nucleation of nanodiamonds after a laser pulse is applied to the Q-carbon and diamond. In some examples, stepped and high-index surfaces on the Q-carbon may provide more nucleation sites for growth of nanodiamonds, microdiamonds, diamond nanoneedles, diamond microneedles, or large-area single-crystal diamond sheets.

Figure 16:
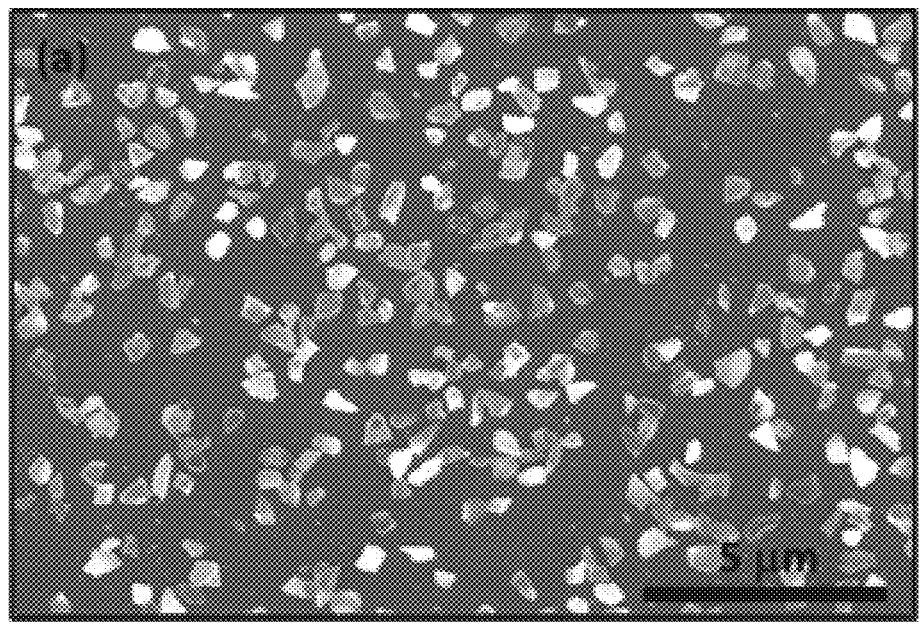
FIG. 16 is a top view of an SEM micrograph showing formation of microdiamonds and some nanodiamonds after a second laser pulse is applied to the Q-carbon filament.

FIG. 16 is a top view of an SEM micrograph showing formation of microdiamonds and some nanodiamonds after a laser pulse is applied to the Q-carbon filament. In some examples, the nanodiamonds may nucleate on microdiamonds existing on the Q-carbon filament prior to applying the subsequent laser pulse. In the example shown in FIG. 16, the nanodiamonds and microdiamonds may be of different morphology. The nanodiamonds and microdiamonds may nucleate after two laser pulses are applied to the Q-carbon. In some examples, each laser pulse can have an energy density of be 0.6 $Jcm^{-2}$.

Figure 17:
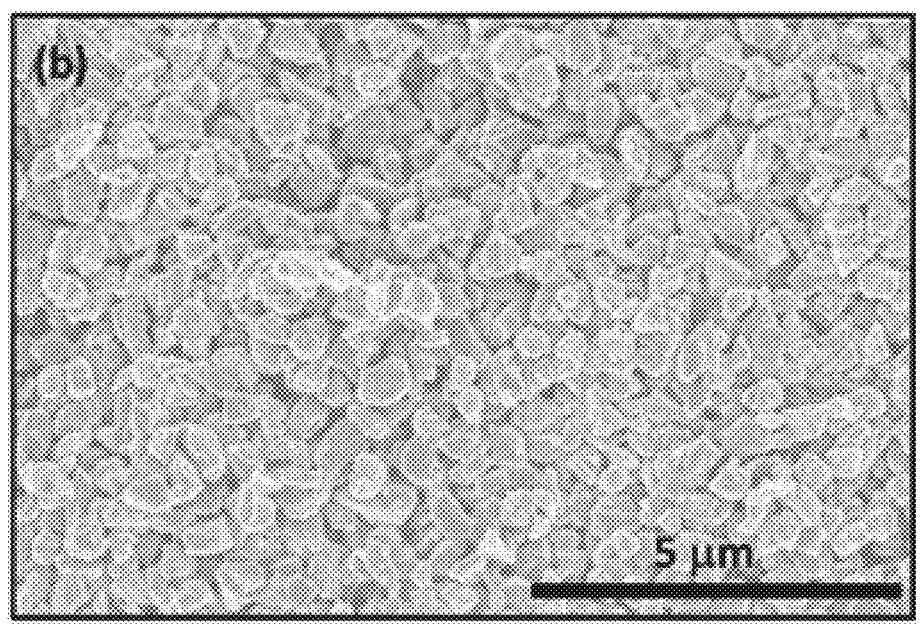
FIG. 17 is a top view of an SEM micrograph showing microdiamonds covering an entire region of super undercooled carbon.

FIG. 17 is a top view of an SEM micrograph showing microdiamonds covering an entire region of a super undercooled carbon. In some examples, nanodiamonds may form on top of the microdiamonds.

Figure 18:
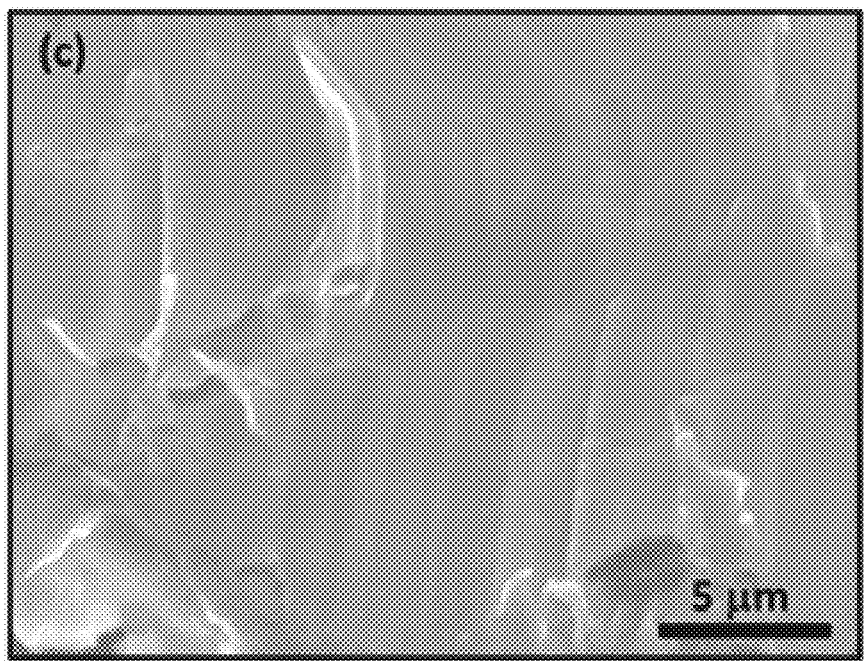
FIG. 18 is a top view of an SEM micrograph showing formation of a large-area single-crystal diamond thin film on a sapphire substrate.

In some examples, a single-crystal diamond sheet can be formed from the Q-carbon. For example, FIG. 18 is a top view of an SEM micrograph showing formation of a large-area single-crystal diamond thin film. In some examples, the large-area single-crystal diamond film can be doped both n-type (e.g., adding an impurity that contributes free electrons and increases conductivity) and p-type doping (e.g., adding an impurity that can create a deficiency of electrons, known as holes). Doping the large-area single-crystal diamond thin film both n-type and p-type may enhance the processing of high-power devices and high-power and high-temperature radiation resistant transistors.

Figure 19:
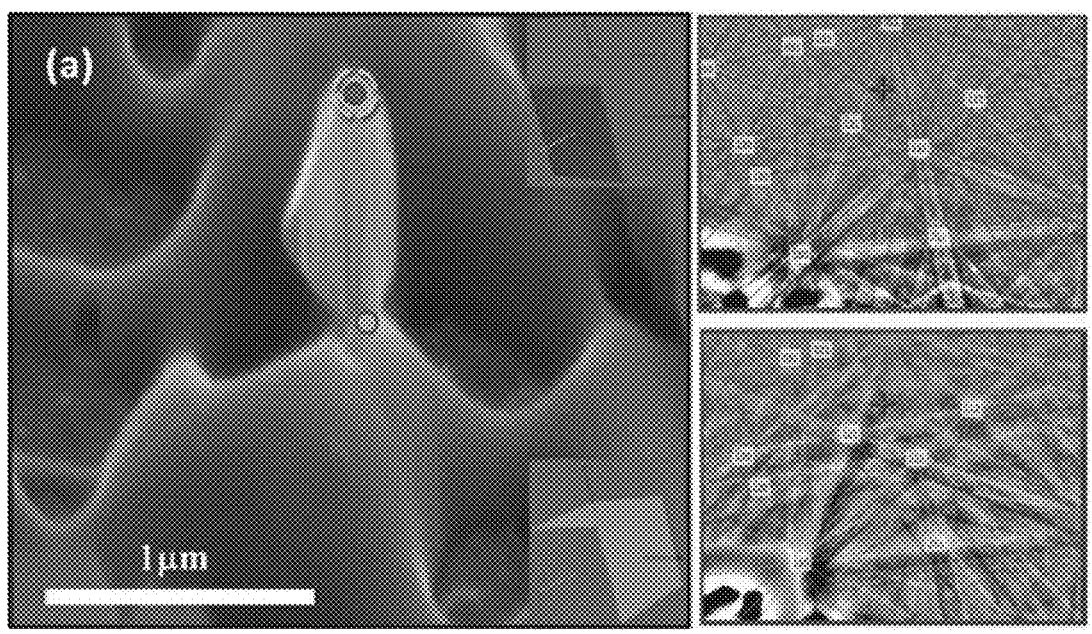
FIG. 19 is an image of an SEM micrograph showing diamond growing on a copper substrate, where diamond is epitaxially aligned with copper and grows as single crystal.
Figure 20:
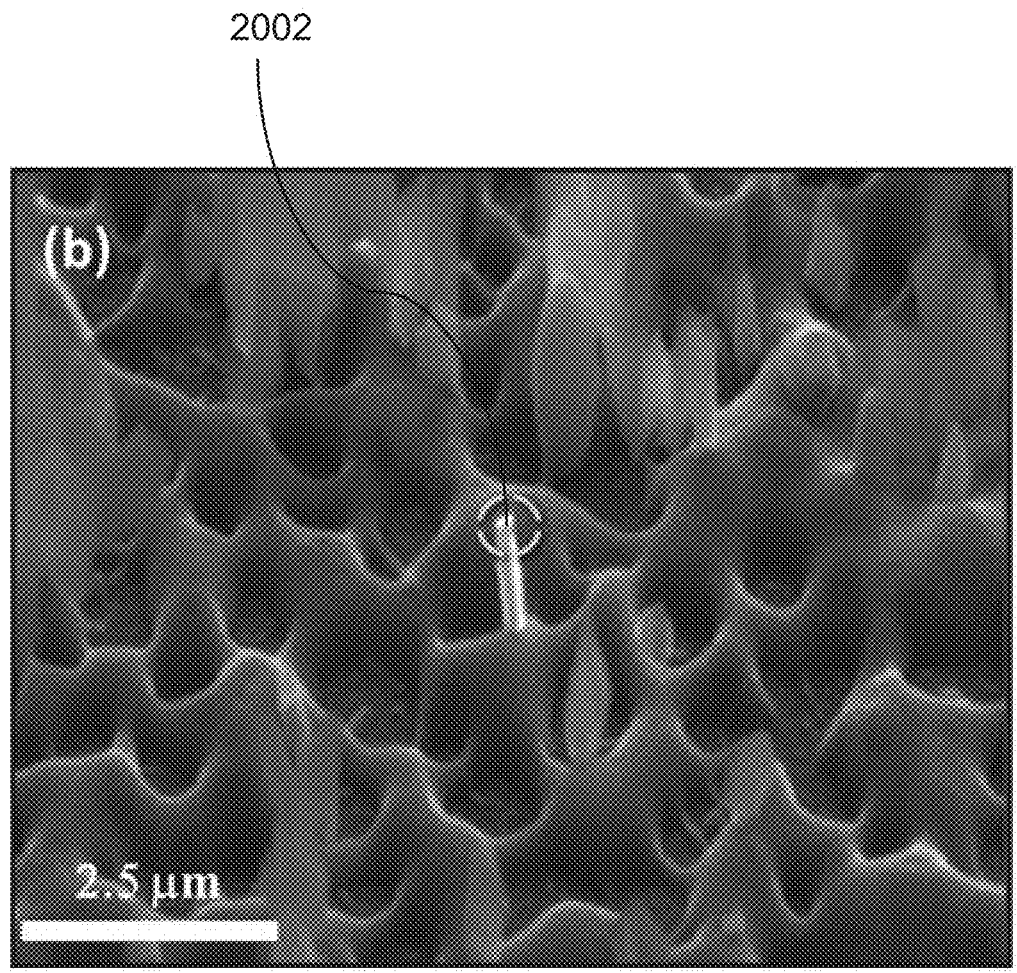
FIG. 20 is an image of an SEM micrograph showing the formation of a diamond faceted pillar 2002 from super undercooled carbon.

In some examples, the large-area single-crystal diamond thin film can be formed when an epitaxial copper template is provided by using Copper/Titanium Nitride/Silicon ("Cu/TiN/Si") heterostructures. In another example, a copper template can be lattice matched with diamond in the absence of alloying effects for growing diamonds structures from the Q-carbon. For example, FIG. 19 is an image of an SEM micrograph showing diamond growing on a copper substrate, where diamond is epitaxially aligned with copper and grows as single crystal. The SEM image depicted in FIG. 19 also shows an Electron Backscatter Diffraction ("EBSD") from the underlying copper substrate and diamond microneedles. As another example, FIG. 20 is an image of an SEM micrograph showing the formation of a diamond faceted pillar 2002 from super undercooled carbon.

Figure 21:
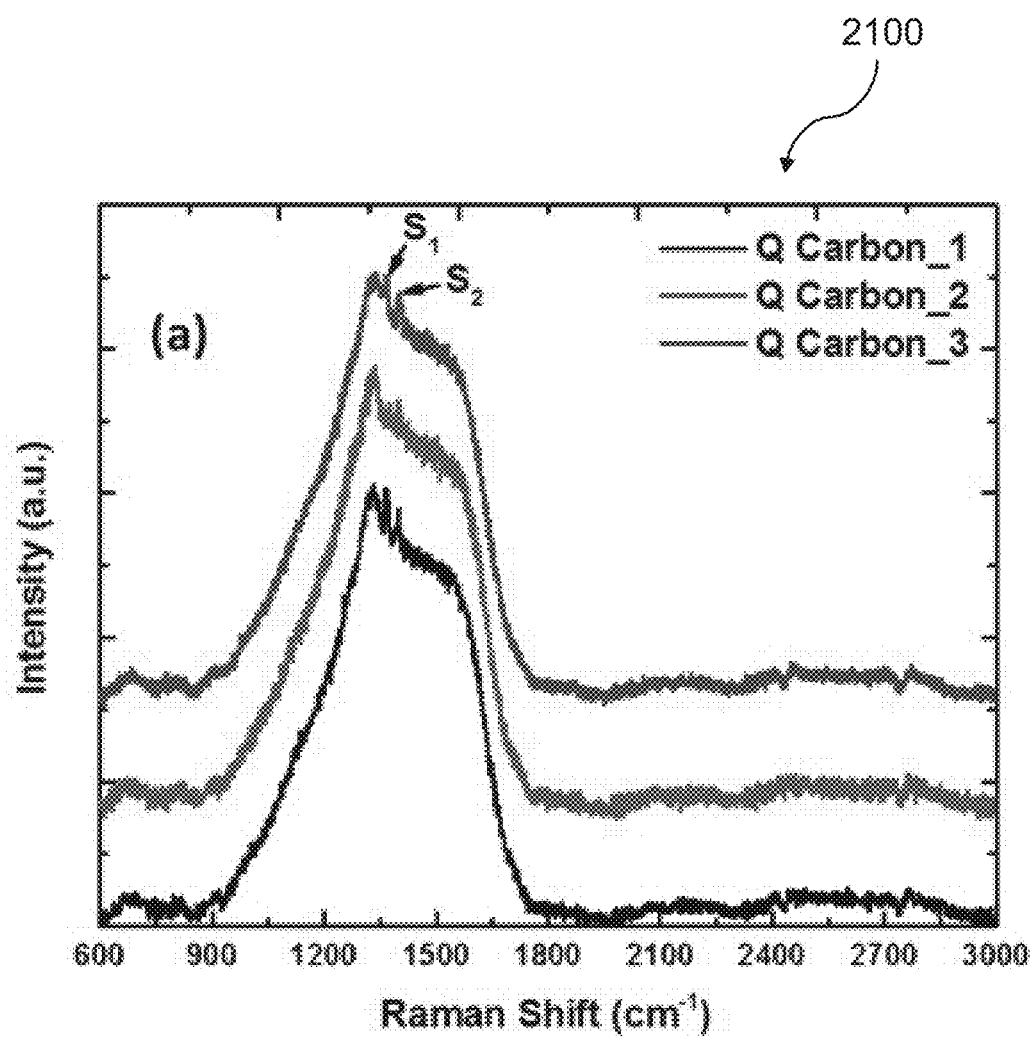
FIG. 21 is a graph 2100 depicting an example of Raman spectra results from Q-carbon on a sapphire substrate after a laser pulse, according to one example.

FIG. 21 is a graph 2100 depicting an example of Raman spectra results from Q-carbon on a sapphire substrate after a laser pulse, according to one example. In some examples, the laser pulse can be a single laser pulse. The single laser pulse can be from an ArF Excimer laser. As an example, the energy density of the laser pulse can be 0.6 $Jcm^{-2}$ and the wavelength of the laser pulse can be 633 nm. In graph 2100 a diamond peak may occur at 1333 $cm^{-1}$ with a broad peak at about 1350 $cm^{-1}$ along with a small peak at 1140 $cm^{-1}$. In some examples, $sp^3$ fraction of between seventy-six percent and eighty-one percent can be obtained by fitting the Raman spectrum depicted in graph 2100. In graph 2100, peaks $S_1$ and $S_2$ (occurring at 1360 $cm^{-1}$ and 1375 $cm^{-1}$, respectively) may belong to the sapphire substrate. In some examples, the graph 2100 may also indicate a slight upshift due to stress of the primary Raman peak and a bump at 1140 $cm^{-1}$, which may be characteristic of $sp^2$ bonded carbon at the grain boundaries or interfaces in a nanodiamond. In some examples, downshift in Raman peak may occur as the size of the diamond decreases as a result of phonon dispersion relations.

Figure 22:
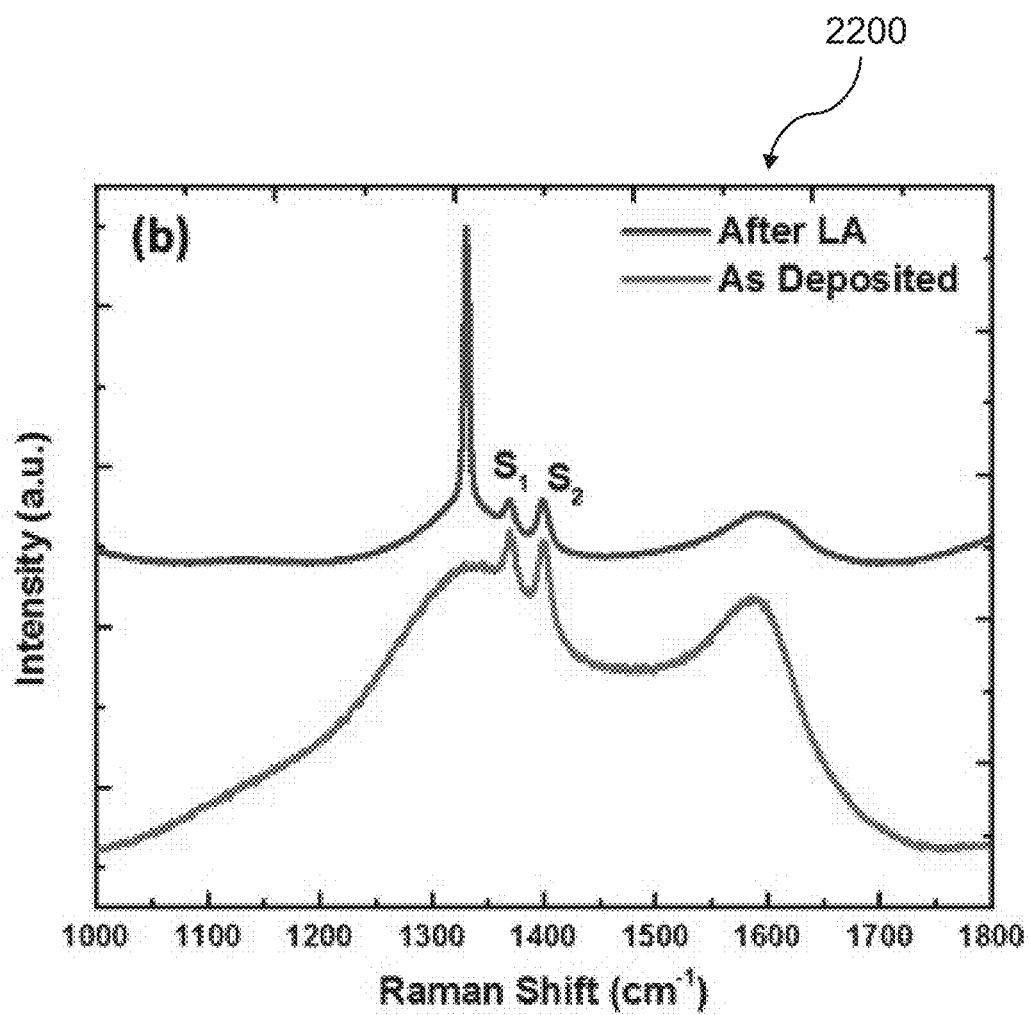
FIG. 22 is a graph 2200 depicting an example of Raman spectra results from microdiamond on sapphire substrate after a laser pulse, according to one example.

FIG. 22 is a graph 2200 depicting an example of Raman spectra results from microdiamond on sapphire substrate after a laser pulse, according to one example. In some examples, the laser pulse can be a single laser pulse. The single laser pulse can be from an ArF Excimer laser. As an example, the energy density of the laser pulse can be 0.6 $Jcm^{-2}$ and the wavelength of the laser pulse can be 633 nm. In graph 2200 a sharp diamond peak may occur at 1331.54 $cm^{-1}$ along with sapphire peaks $S_1$ and $S_2$ (at 1360 $cm^{-1}$ and 1375 $cm^{-1}$, respectively). In some examples, the graph 2200 may also indicate a small G peak of residual unconverted amorphous graphite. In some examples, $sp^3$ fraction of about fifty-two percent can be obtained by fitting the Raman spectrum depicted in graph 2200.

Figure 23:
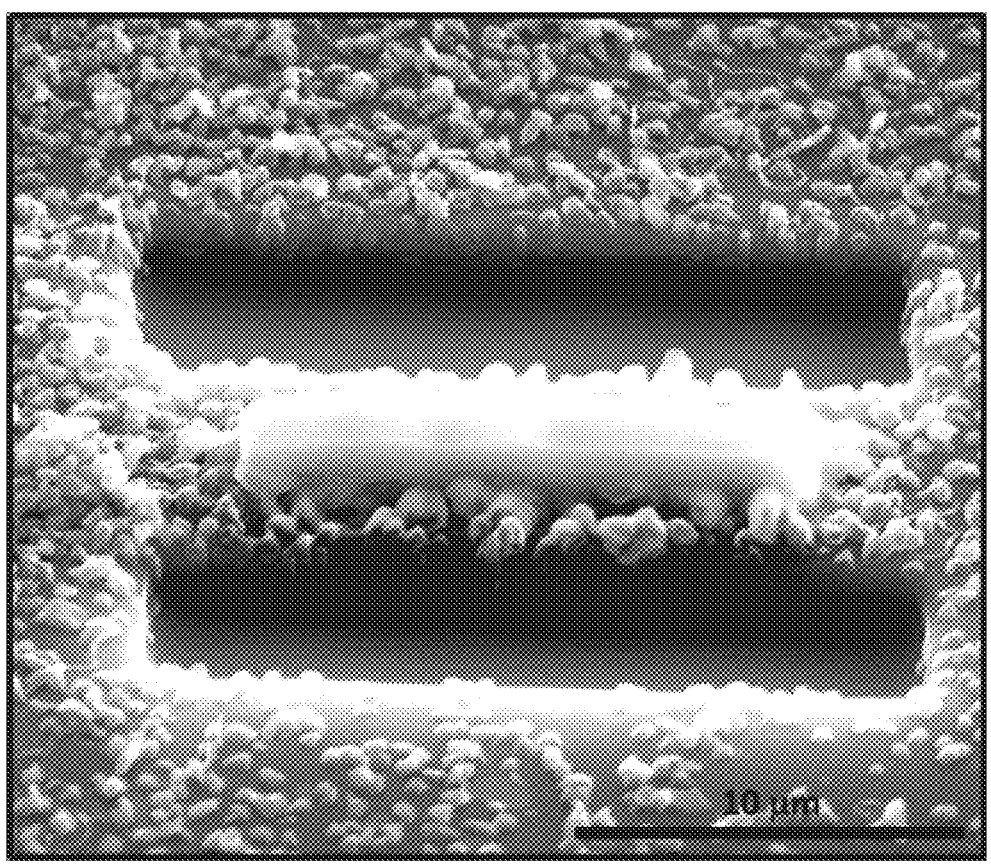
FIG. 23 is an image of an SEM micrograph image showing a cross-section transmission electron microscopy ("TEM") sample of Q-carbon containing nanodiamonds and microdiamonds on a sapphire substrate, according to one example.

FIG. 23 is an image of a SEM micrograph image showing a cross-section transmission electron microscopy ("TEM") sample of Q-carbon containing nanodiamonds and microdiamonds on a sapphire substrate, according to one example.

Figure 24:
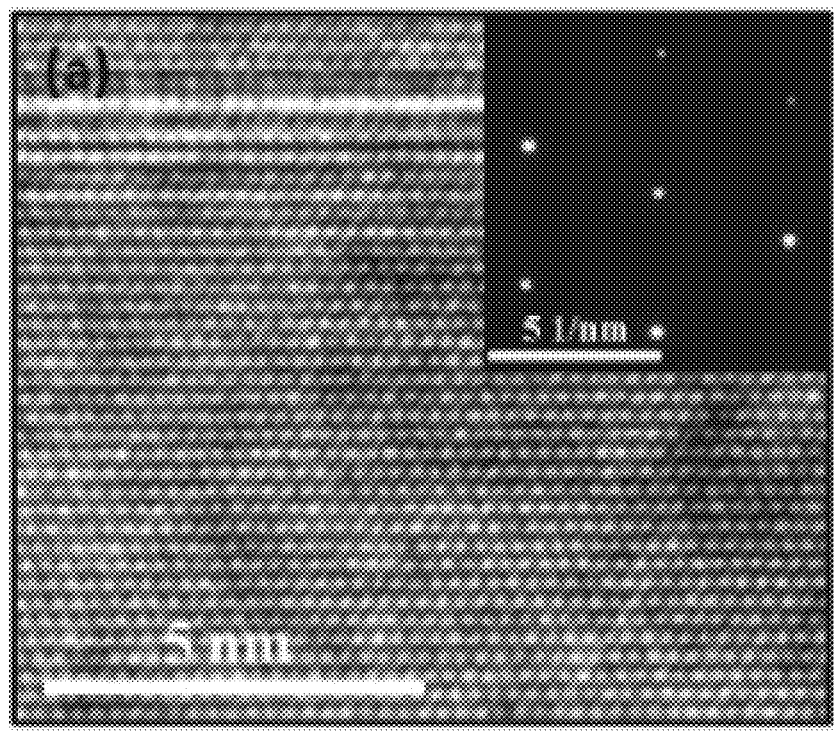
FIG. 24 is a high-resolution TEM ("HRTEM") image showing a diamond microcrystallite and the corresponding <110> electron diffraction pattern, according to one example.

FIG. 24 is a high-resolution TEM ("HRTEM") image showing a diamond microcrystallite and the corresponding <110> electron diffraction pattern, according to one example. The HRTEM image depicted in FIG. 24 includes an image of cross-sections of the microcrystallite, which depict individual <110> columns of diamond.

Figure 25:
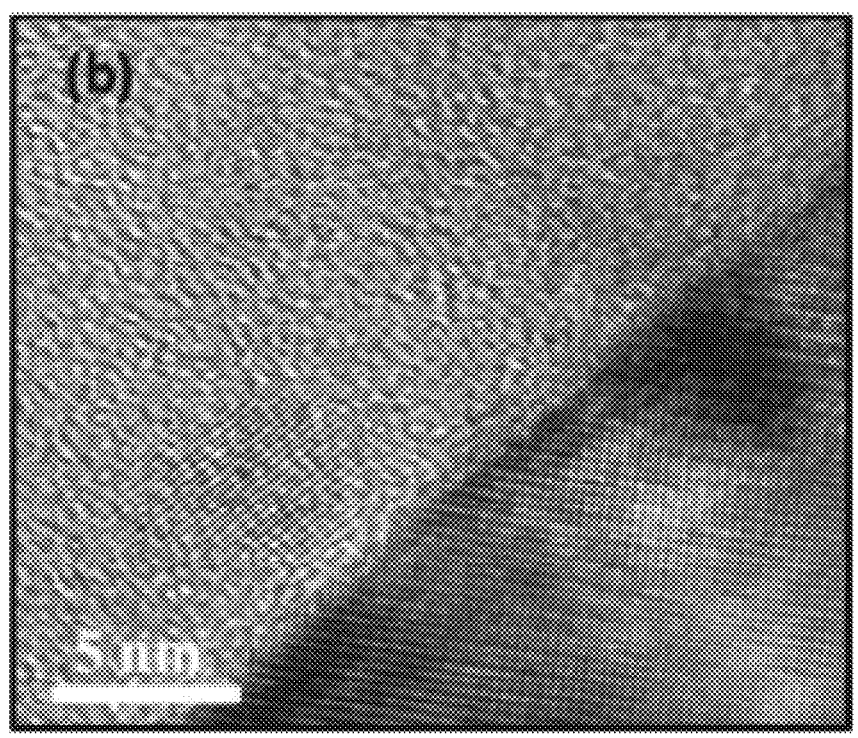
FIG. 25 is a HTREM image from Q-carbon that has a substantially amorphous structure with some nanodiamonds embedded into the Q-carbon.

FIG. 25 is a HTREM image from Q-carbon that has a substantially amorphous structure with some nanodiamonds embedded into the Q-carbon.

Figure 26:
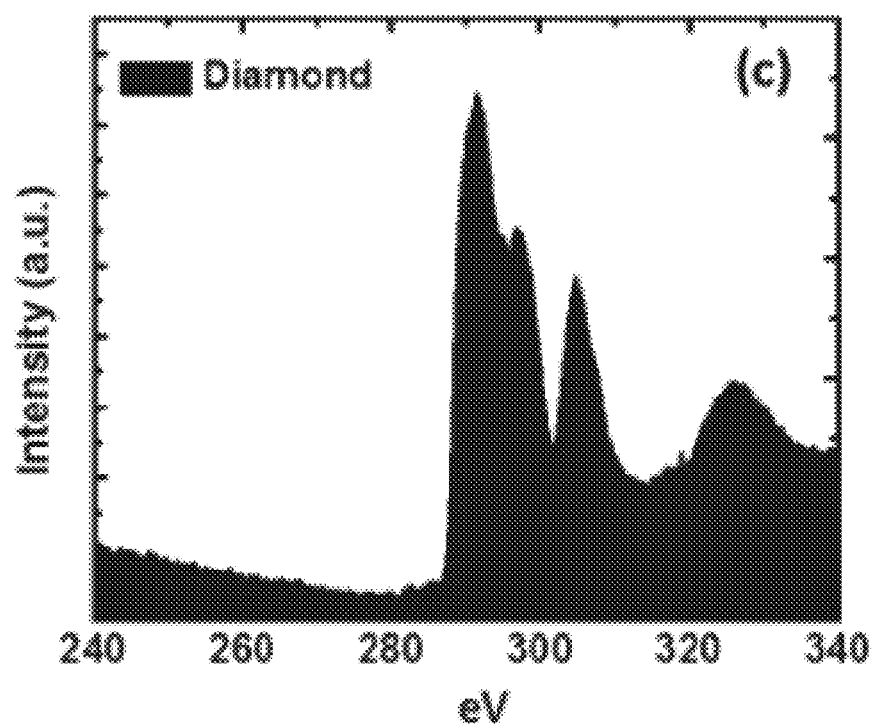
FIG. 26 is a graph of an electron energy loss spectroscopy ("EELS") spectrum from diamond, according to one example.

FIG. 26 is a graph of an electron energy loss spectroscopy ("EELS") spectrum from diamond, according to one example. The EELS spectrum depicted in FIG. 26 may contain a sharp edge at 288 eV with a peak at 292 eV. In some examples, the sharp edge and peak may correspond to $sp^3$ bonding. The $sp^3$ bonding may be characteristic of an EELS spectrum for a diamond.

Figure 27:
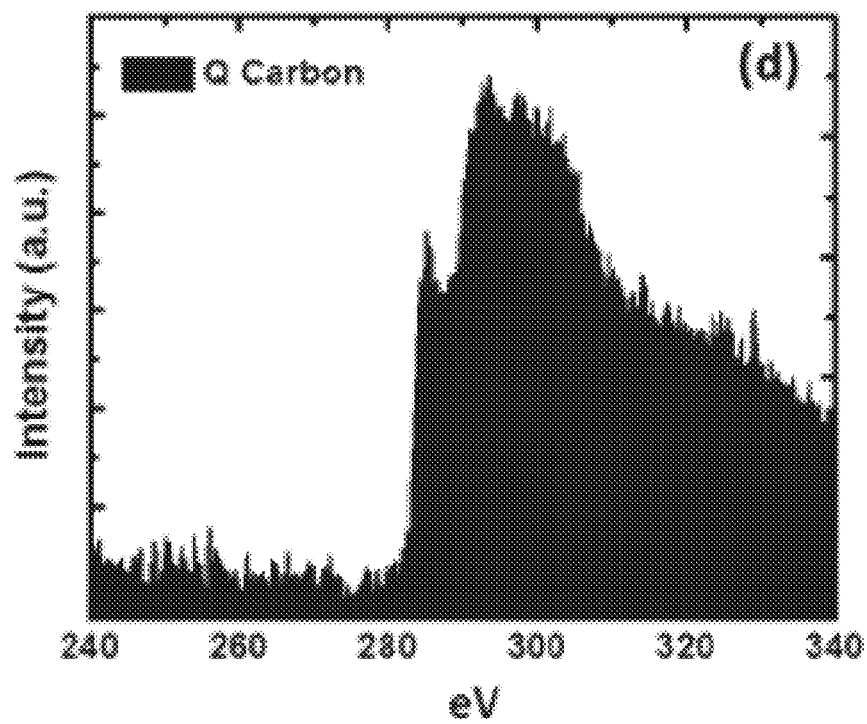
FIG. 27 is a graph of an EELS spectrum from Q-carbon, according to one example.

FIG. 27 is a graph of an EELS spectrum from Q-carbon (e.g., the Q-carbon depicted in FIG. 25), according to one example. The EELS spectrum may have a sloping edge at 285 eV with a broad peak at 292 eV. In some examples, the EELS spectrum may indicate $sp^3$ bonding of about eighty percent. The sp³ bonding may correspond to Raman results from Q-carbon (e.g., the Raman results depicted in FIG. 21).

Figure 28:
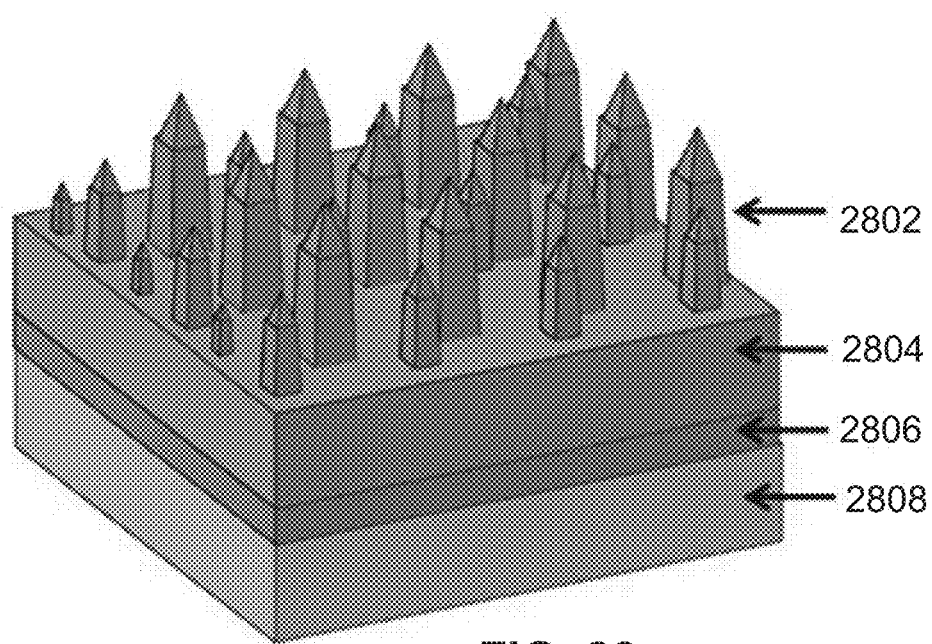
FIG. 28 is a schematic diagram showing formation of diamond nanoneedles or microneedles from super undercooled carbon.

As described above, in some examples, a diamond nanoneedle or microneedle can form from Q-carbon. In some examples, a microdiamond may grow from the Q-carbon in the form of a nanoneedle or a microneedle. The diamond nanoneedle or microneedle may grow from Q-carbon in the absence of any catalyst or in the absence of hydrogen. For example, FIG. 28 is a schematic diagram showing formation of diamond nanoneedle or microneedles 2802 from Q-carbon 2806. The Q-carbon 2806 can be formed by nanosecond laser melting of an amorphous carbon film 2804 and quenching the amorphous carbon film 2804 from an undercooled state to room temperature. In some examples, the carbon film 2804 can be on a substrate 2808 (e.g., a sapphire, plastic, glass, Cu/TiN/Si or Cu/Sapphire substrate).

Figure 29:
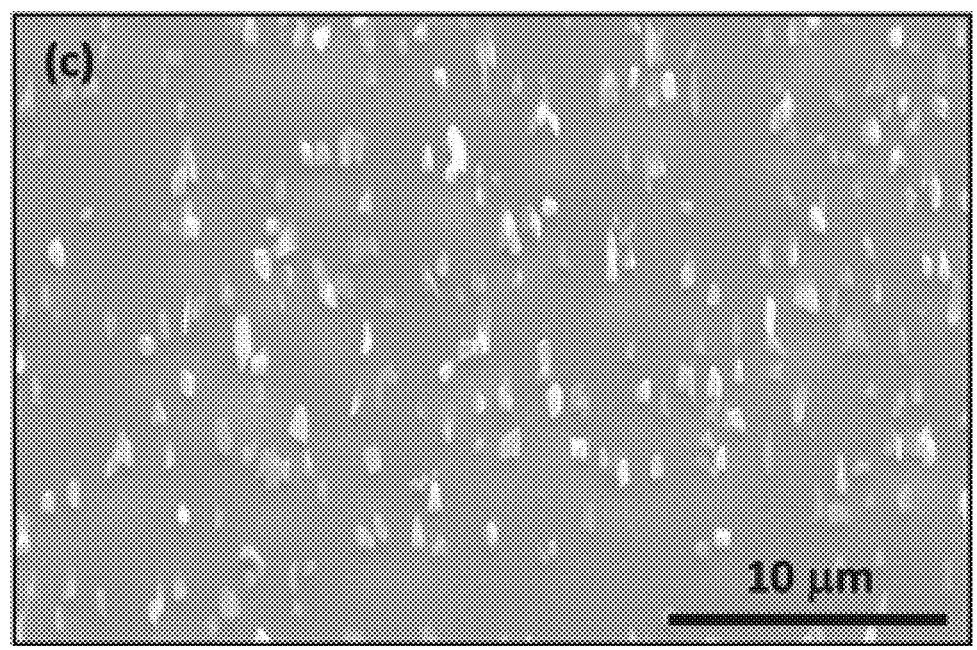
FIG. 29 is an SEM micrograph showing formation of diamond nanoneedles and diamond microneedles from super undercooled carbon.

FIG. 29 is an image of an SEM micrograph showing formation of diamond nanoneedles and diamond microneedles from super undercooled carbon. In the example shown in FIG. 29, an entire layer of amorphous carbon can be converted into nanoneedles and microneedles.

Figure 30:
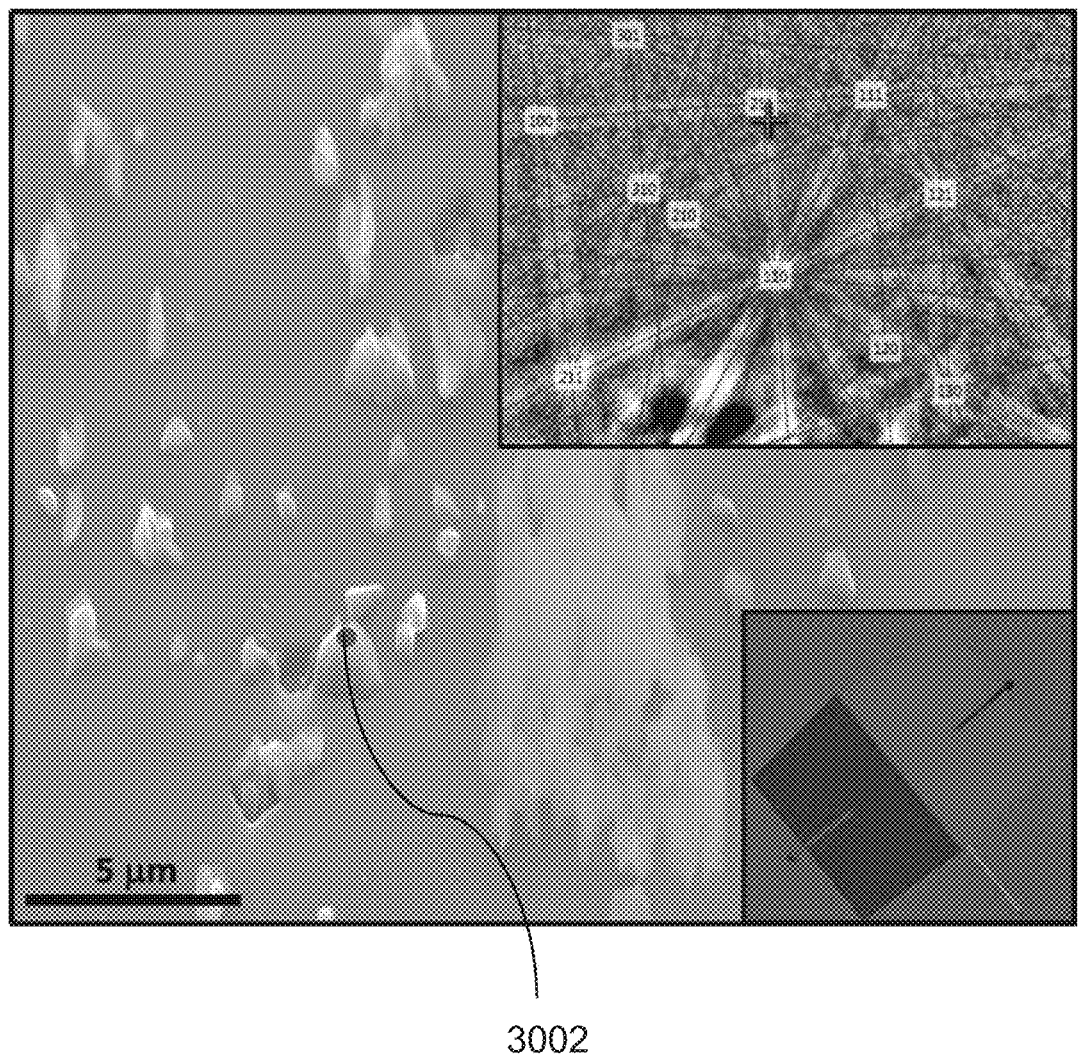
FIG. 30 is an SEM image with EBSD Kikuchi pattern from microdiamond growing out of super undercooled carbon, according to one example.

FIG. 30 is an image showing EBSD Kikuchi patterns from microdiamonds growing out of super undercooled carbon, according to one example. In some examples, a diamond microneedle or nanoneedle may grow from a microdiamond on the Q-carbon. In the example shown in FIG. 30, a diamond microneedle 3002 may form from the Q-carbon. The microneedle 3002 may have a length of up to two microns. In some examples, the microneedle 3002 may grow out of the Q-carbon formed near a sapphire interface through carbon over layers. In some examples, the diamond nanoneedle and microneedle may grow from the Q-carbon in the absence of a catalyst. In another example, the nanoneedle and microneedle may grow in the absence of hydrogen.

Figure 31:
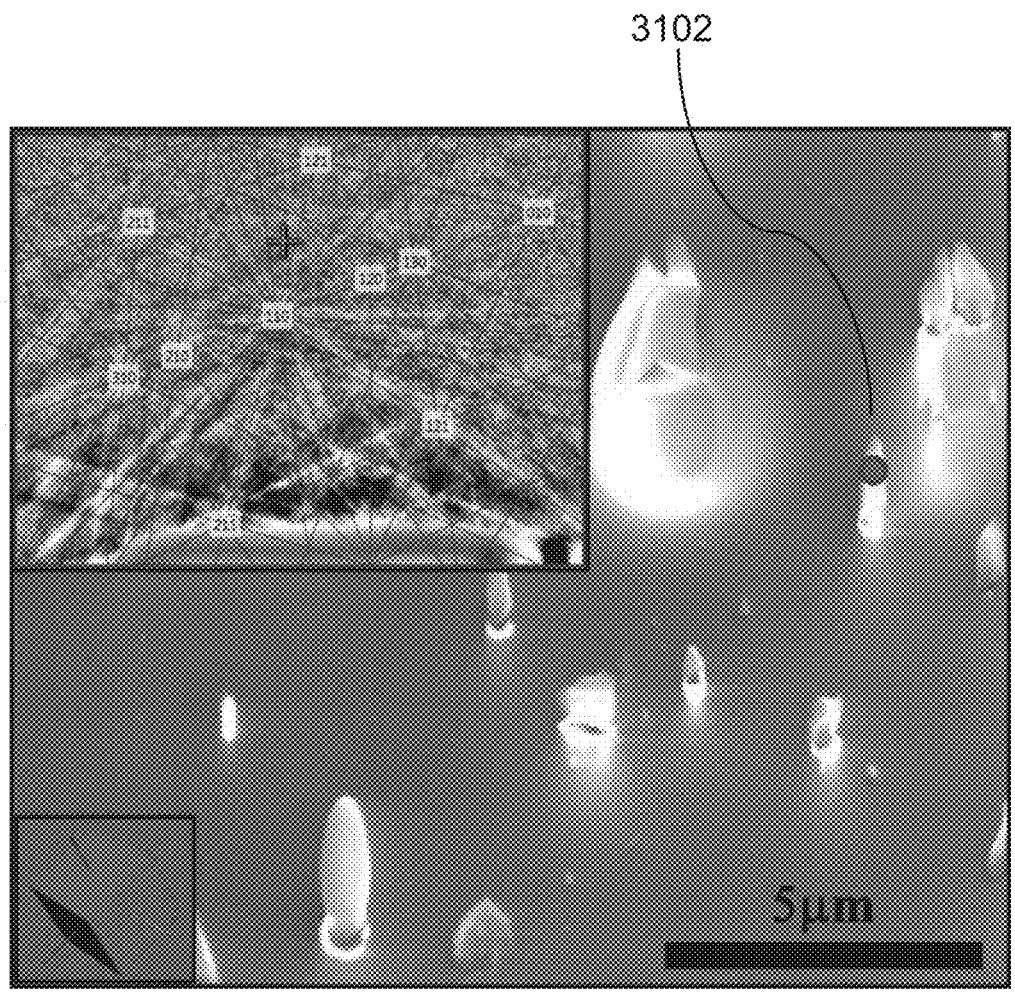
FIG. 31 is an SEM image with EBSD Kikuchi pattern from a nanoneedle growing out of super undercooled carbon near a sapphire interface, according to another example.
Figure 32:
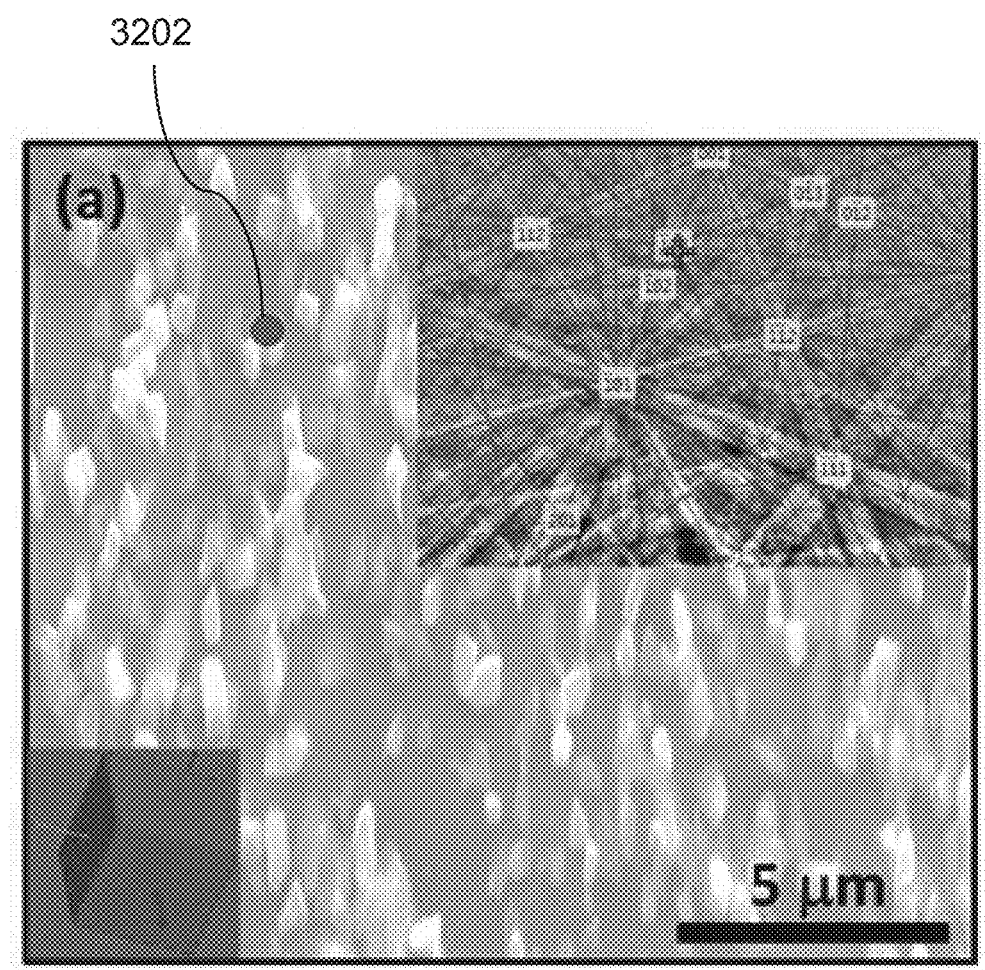
FIG. 32 is an image of an SEM micrograph showing diamond microneedles forming from super undercooled carbon with an EBSD pattern.

FIG. 31 is an image showing EBSD Kikuchi patterns from microdiamonds growing out of super undercooled carbon near a sapphire interface, according to another example. In the example shown in FIG. 31, a diamond nanoneedle or a microneedle 3102 may grow out of the super undercooled carbon. As an example, a nanoneedle having a diameter of 80 nm can grow out of the super undercooled carbon. In another example, a diamond microneedle having a diameter between 100 nm and 500 nm can grow out of the super undercooled carbon. In still another example, a diamond nanoneedle or microneedle having a length of up to 3000 nm can grow out of the super undercooled carbon FIG. 32 is an image of an SEM micrograph showing diamond microneedles 3202 forming from super undercooled carbon. In the example shown in FIG. 32, the inset shows an electron backscatter diffraction pattern of diamond along with a characteristic diamond Kikuchi pattern.

Figure 33:
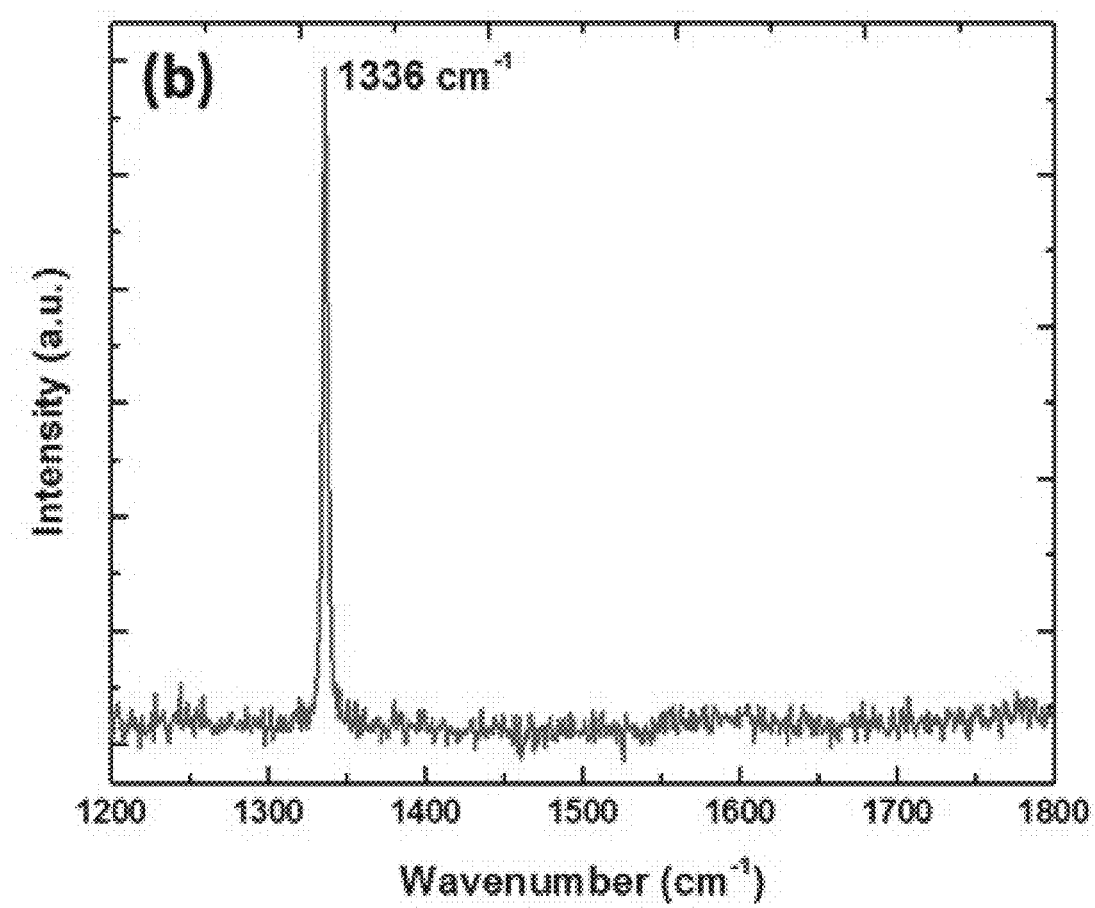
FIG. 33 is a graph depicting an example of Raman spectrum results from diamond microneedles.

FIG. 33 is a graph depicting an example of Raman spectra results from diamond microneedles (e.g., the diamond microneedles depicted in FIG. 32). In the example shown in FIG. 33, the graph can indicate a sharp Raman diamond peak at 1136 cm⁻¹, where all the amorphous carbon is converted into diamond.

Figure 34:
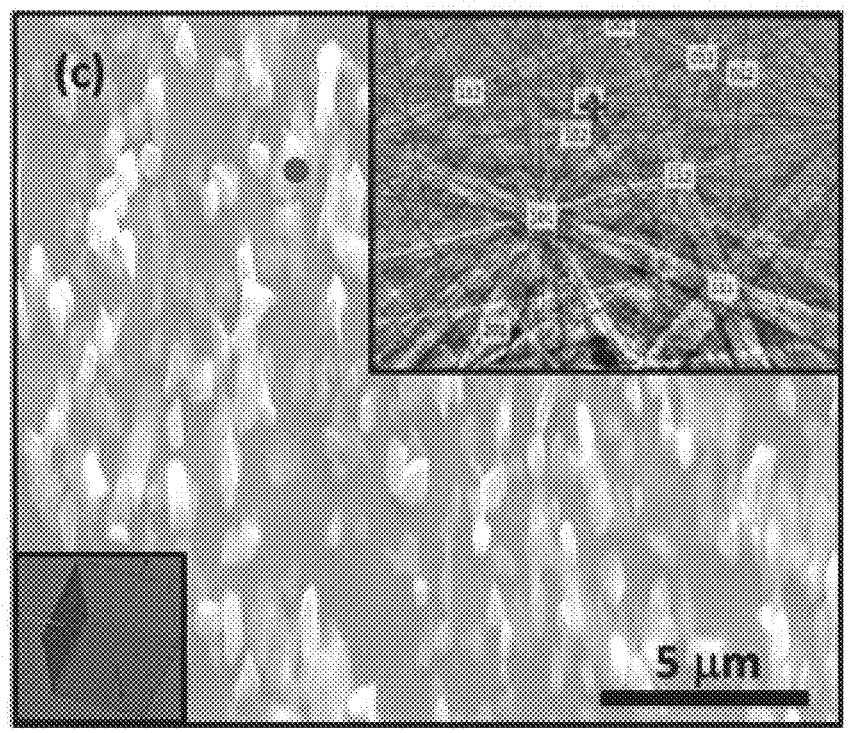
FIG. 34 is an SEM micrograph showing diamond nanoneedles and microneedles growing from super undercooled carbon on a sapphire substrate, according to one example.

FIG. 34 is an image of an SEM micrograph showing diamond nanoneedles and microneedles growing from super undercooled carbon on a sapphire substrate with inset EBSD and orientation diagram, according to one example.

Figure 35:
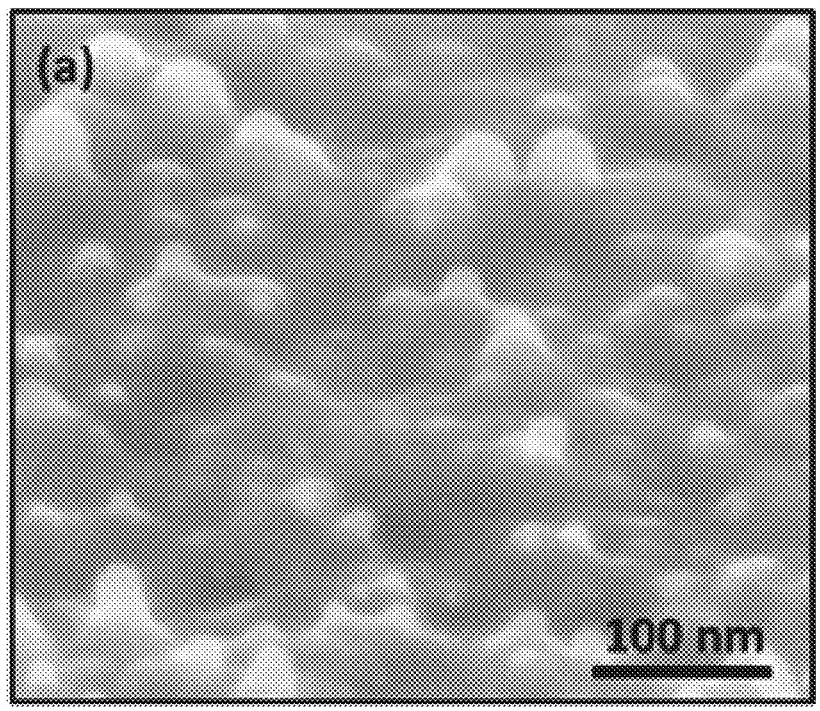
FIG. 35 is an image of an SEM micrograph after residual amorphous carbon is etched away, which shows that nanoscale perturbation sets in quenched super undercooled carbon liquid.
Figure 36:
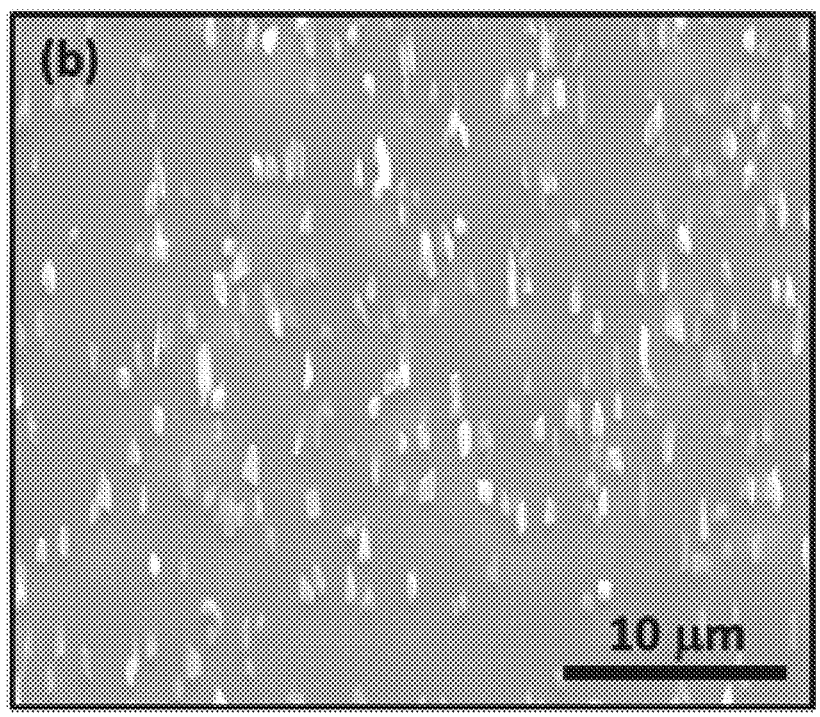
FIG. 36 is an image of a SEM micrograph after residual amorphous carbon is etched away, which shows formation of diamond nanoneedles and microneedles from super undercooled carbon.
Figure 37:
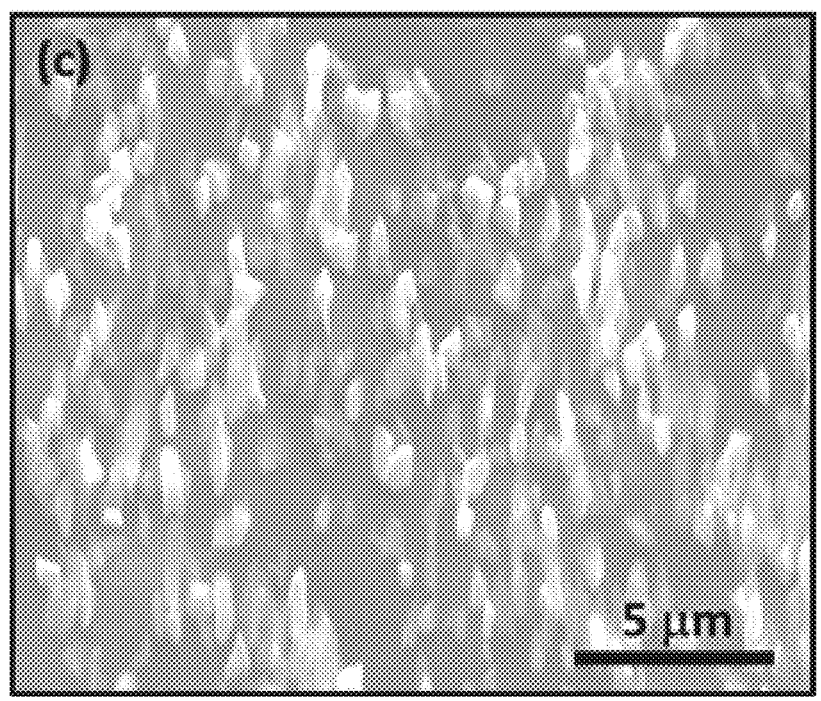
FIG. 37 is an image of a SEM micrograph showing formation of nanoneedles and microneedles from super undercooled carbon after residual amorphous carbon is etched away, according to another example.

In some examples, residual amorphous carbon can be etched away after diamond nanoneedles or microneedles form from the Q-carbon. For example, residual amorphous carbon can be etched away by oxygen plasma. Etching away residual amorphous carbon can provide more accurate data regarding formation of diamond nanoneedles or microneedles from Q-carbon. For example, FIG. 35 is an image of an SEM micrograph after residual amorphous carbon is etched away, which shows that nanoscale perturbation sets in quenched super undercooled carbon liquid. As another example, FIG. 36 is an image of an SEM micrograph after residual amorphous carbon is etched away, which shows formation of diamond nanoneedles and microneedles from Q-carbon. As still another example, FIG. 37 is an image of a SEM micrograph showing formation of nanoneedles and microneedles from super undercooled carbon phase after residual amorphous carbon is etched away, according to another example.

Figure 38:
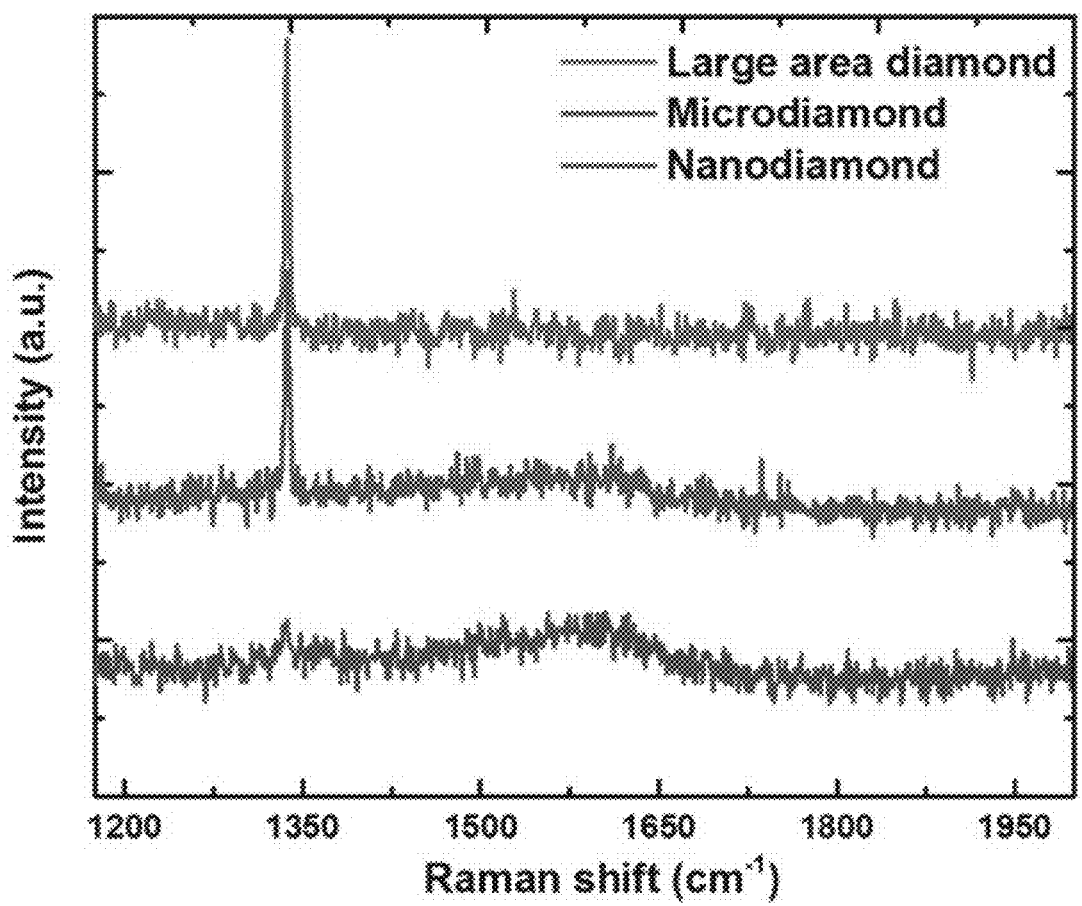
FIG. 38 is a graph depicting an example of Raman spectra results from nanodiamond, microdiamond and large-area thin films without residual amorphous peaks.

In some examples, etching away residual amorphous carbon can provide more accurate Raman spectra results (e.g., Raman spectra results without residual amorphous peaks). For example, FIG. 38 is a graph depicting an example of Raman spectra results from nanodiamond, microdiamond and large-area thin films without residual amorphous peaks.

Figure 39:
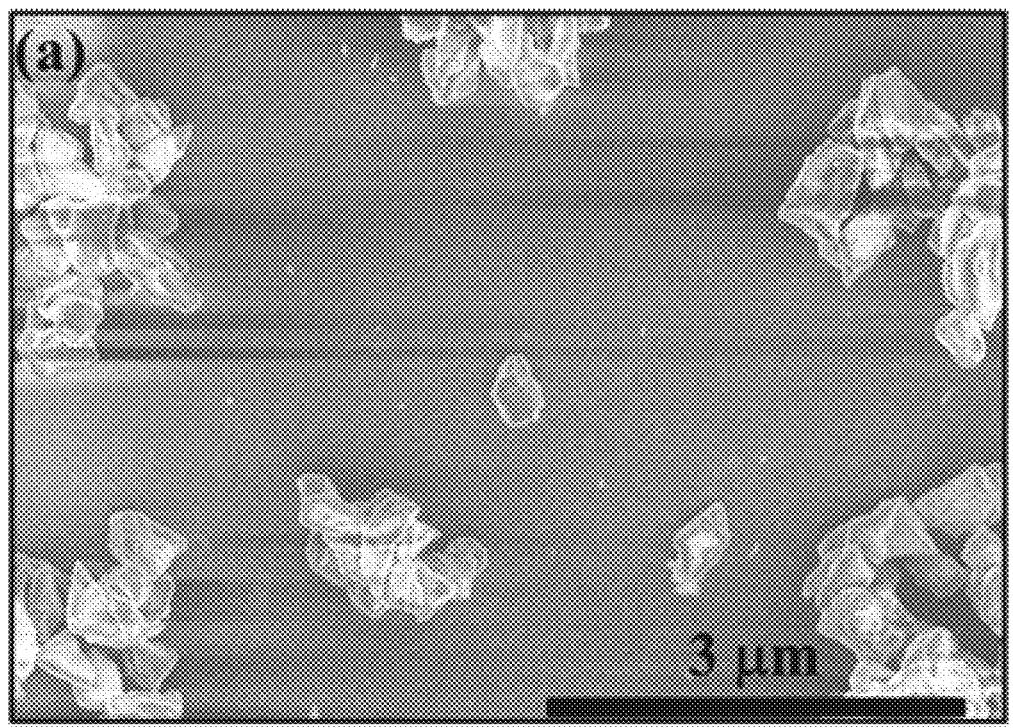
FIG. 39 is an image of a SEM micrograph showing microdiamonds and nanodiamonds on a high density polyethylene (HOPE) substrate.

In some examples, laser heating of amorphous carbon for forming Q-carbon can be confined spatially and temporally. Confining the laser heating of the amorphous carbon can allow diamonds or diamond films formed from the amorphous carbon to be deposited on heat-sensitive substrates (e.g., polymer substrates or low thermal conductivity substrates, including, for example, sapphire, silicon, plastic, or glass). For example, FIG. 39 is an image of a SEM micrograph showing microdiamonds and nanodiamonds on a high density polyethylene ("HDPE") substrate. In some examples, the microdiamonds and nanodiamonds on the HDPE substrate can have an average grain size of 500 nm and 30 nm, respectively. In some examples, the diamond grains of the microdiamonds and nanodiamonds may contain high-index facets. The high-index facets may have catalytic properties. In some examples, the high-index facets may provide nucleation sites for subsequent diamond growth or formation.

Figure 40:
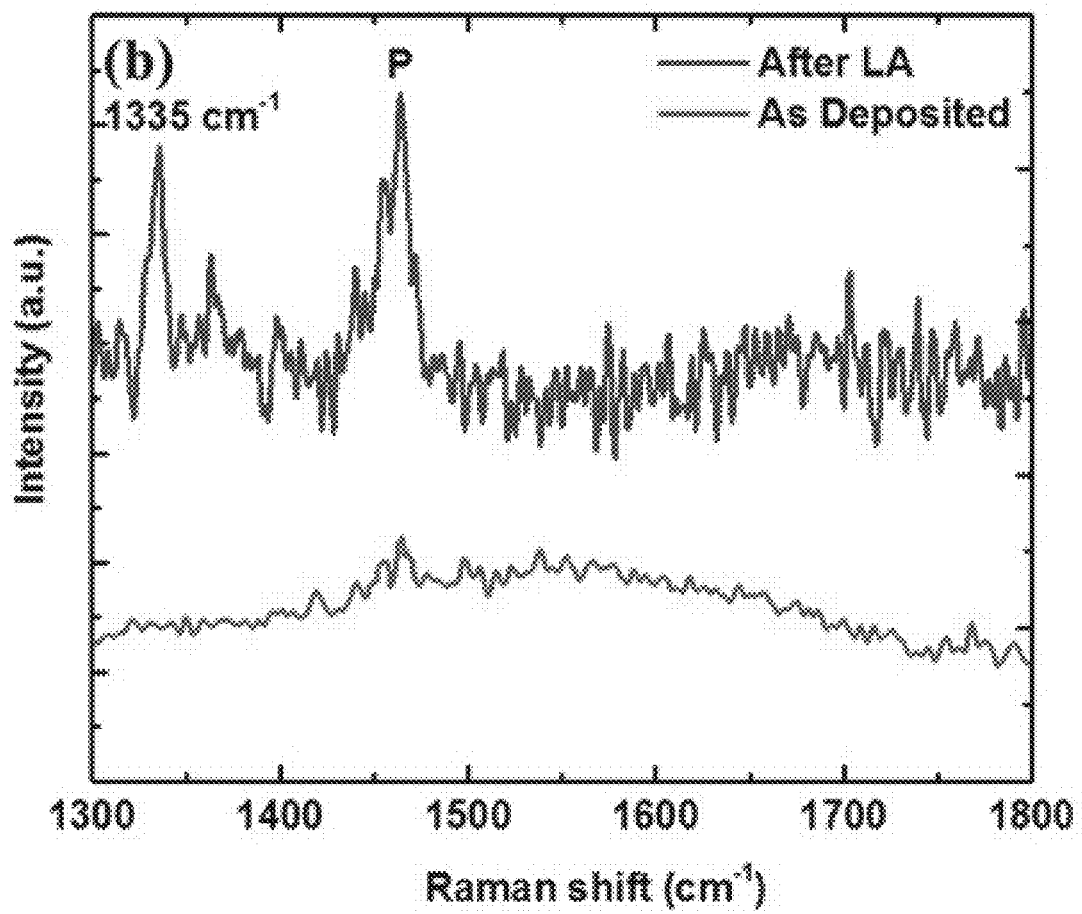
FIG. 40 is a graph depicting an example of Raman spectra results before and after laser annealing an amorphous diamond-like carbon film from the HDPE substrate depicted in FIG. 39.

FIG. 40 is a graph depicting an example of Raman spectra results before and after laser annealing an amorphous diamond-like carbon film. In some examples, the carbon film can be irradiated with a laser pulse having an energy density of 0.8 Jcm⁻². In the graph depicted in FIG. 40, a diamond peak may occur at 1335 cm⁻¹ along with a HDPE peak at 1464 cm⁻¹ after the laser pulse is applied to the carbon film. In the graph depicted in FIG. 40, the Raman spectrum from the amorphous diamond-like carbon film can include a broad peak at around 1350 cm⁻¹. In some examples, sp³ fraction of about forty-five percent before laser annealing can be obtained by fitting the Raman spectrum depicted in FIG. 40.

In some examples, a nanodiamond or microdiamond may form because of diamond phase from highly undercooled pure carbon. For example, for a homogeneous nucleation of diamond from highly undercooled state of pure carbon, the Gibbs free energy of diamond nuclei ($\Delta G_T$) consists of gain in volume energy ($\Delta G_V$) and expense of surface free energy ($\Delta G_S$) terms. The Gibbs free energy of diamond nuclei $\Delta GT$ can be determined by solving the following formula:

$$\Delta G_T = \Delta G_V + \Delta G_S$$

In the formula above, $\Delta G_T$ can be rewritten as the following formula:

$$\Delta G_T = \frac{-4}{3}\pi r^3 \frac{\rho}{M_m} \frac{\Delta H_m}{T_m} \Delta T_u + 4\pi r^2 r_s$$

In the formula above, $r_s$ is the radius of diamond nucleus, $$\frac{\rho}{M_m} \frac{\Delta H_m}{T_m} \Delta T_u$$

is the gain in free energy for the formation of diamond nucleus from the undercooled state of the pure carbon, $T_m$ is the melting point of carbon, $\Delta T_u$ is the undercooling from the temperature of nucleation (e.g., a difference between $T_m$ and the formation temperature ($T_r$)), $\rho$ is the solid diamond density. $M_m$ is the molar mass, $\Delta H_m$ is the latent heat of melting, and $r_s$ is the surface free energy between diamond nuclei and undercooling carbon liquid.

In some examples, the maximum of $\Delta G_T$, $\Delta G_T^*$, can correspond to the diamond reaction barrier at a critical size of the radius of diamond nucleus ("r*"). The $\Delta G_T^*$ and r* values can be determined by solving the following formulas:

$$r^* = \frac{2r_s T_m M_m}{\Delta H_m \Delta T_u \rho}$$

$$\Delta G_T^* = \frac{16\pi r_s 3 T_m^2 M_m^2}{3\Delta H_m^2 \Delta T_u^2 \rho^2}$$

In some examples, the rate of nucleation (I) can be governed by the following formula:

$$I = A\exp\frac{-\Delta G_T^*}{KT_r}$$

In the formula above, $T_r = T_m - \Delta T_u$, $A = n(kT/h) \exp(-\Delta F_A/kT)$, I equals the number of diamond nuclei $cm^{-3}s^{-1}$, n equals the number density of atoms, and $\Delta F_A$ is the free energy of activation across the liquid-solid interface. In some examples, a 5 nm and a 10 nm diamond crystallite can have A values of $10^{25}$ $cm^{-3}s^{-1}$ and $10^{24}$ $cm^{-3}s^{-1}$, respectively. In some examples, the free energy of metastable diamond, highly undercooled carbon liquid, and amorphous diamond-like carbon can become equal at the formation temperature $T_r$.

In some examples, a large value of $\Delta T_u$ can drive the critical size of the radius of diamond nucleus (r*) lower. Driving the critical size of the radius of diamond nucleus lower can enhance diamond nucleation. In other examples, the value of $\Delta G_T^*$ can be low, which may enhance the nucleation rate of a nanodiamond from the highly undercooled state of carbon. The nanodiamond may provide a seed for microdiamond growth.

Figure 41:
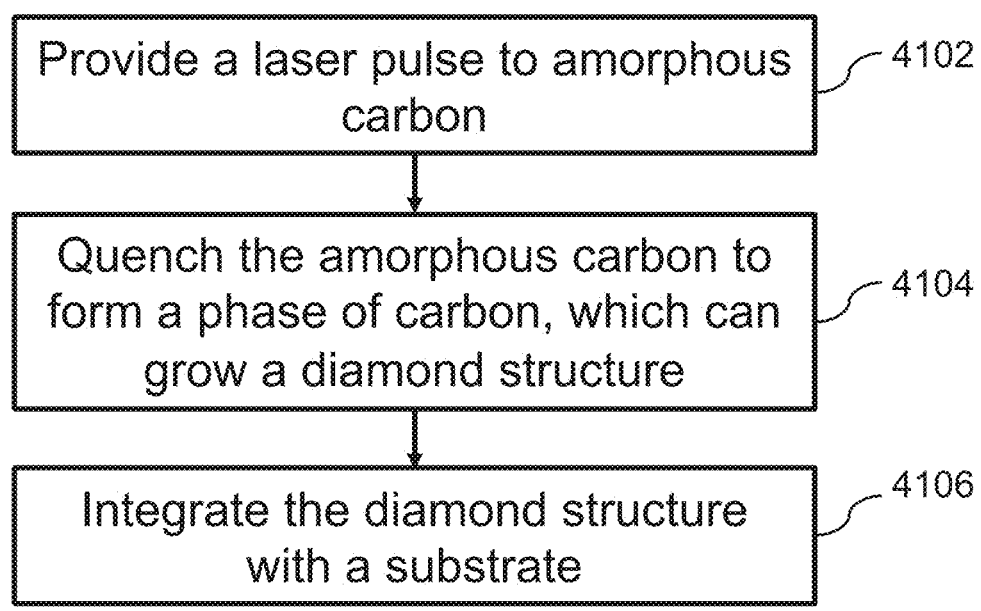
FIG. 41 is a flow chart depicting an example of a process for converting super undercooled carbon into a phase of carbon (e.g., Q-carbon) from which diamond structures can grow or nucleate.

FIG. 41 is a flow chart depicting an example of a process for converting carbon into a phase of carbon (e.g., Q-carbon) from which diamond structures can grow or nucleate.

In block 4102, a laser pulse is provided to amorphous carbon. In some examples, an amorphous carbon film can be irradiated with a nanosecond laser (e.g., an ArF Excimer laser). The amorphous carbon can include bonding characteristics that may be a mixture of graphite (e.g., $sp^2$ bonded) and diamond (e.g., $sp^3$ bonded). The amorphous carbon film may be irradiated with the nanosecond laser at room temperature in air at atmospheric pressure. In some examples, the nanosecond laser can irradiate the amorphous carbon film using a single nanosecond laser pulse. The wavelength of the pulse can range between 193 nm and 308 nm. The pulse duration can range 20 ns to 60 ns. In some examples, the energy density of the laser pulse may vary. For example, the energy density of the laser pulse can be 0.5 $Jcm^{-2}$ for forming a nanodiamond. In some examples, increasing the energy density of the laser pulse can create a microdiamond. For example, the energy density of the laser pulse can be 0.6 $Jcm^{-2}$ for forming the microdiamond. The laser pulse can melt the amorphous carbon and create a highly undercooled state of the amorphous carbon. Undercooling the amorphous carbon can modify the equilibrium phase diagram of carbon (e.g., the carbon phase diagram 100 in FIG. 1). For example, undercooling the amorphous carbon can shift the graphite, diamond, and liquid carbon triple point on the equilibrium phase diagram from a high-pressure and temperature (e.g., 12 GPa and 5000K) to low pressures and temperatures (e.g., ambient pressures and temperatures in the range of 4000K). In some examples, shifting the graphite, diamond, and liquid carbon triple point to low pressures and temperatures may cause the Gibbs free energy of the amorphous carbon to equal the free energy of highly undercooled liquid and metastable diamond phase which is quenched and retained at room temperature. In some examples, the amorphous carbon film can be on a substrate (e.g., a sapphire, glass, or polymer substrate). Undercooling the amorphous carbon can cause a highly undercooled carbon layer to form near the carbon film-substrate interface.

In block 4104, the amorphous carbon is quenched. In some examples, the amorphous carbon film can be quenched and retained at room temperature. Quenching the amorphous carbon film from the highly undercooled state to room temperature may create a phase of carbon (e.g., Q-carbon), which can grow a diamond structure.

In some examples, the Q-carbon can include nanodiamond nuclei which can provide a seed for growth of a nanodiamond, microdiamond, diamond nanoneedle, diamond microneedle, or single-crystal diamond film. In another example, a subsequent laser pulse can be applied to the Q-carbon. The subsequent laser pulse can create a highly undercooled state. Quenching or cooling the Q-carbon from the highly undercooled state can cause a nanodiamond, microdiamond, diamond nanoneedle, diamond microneedle, or single-crystal diamond film to form.

In some examples, quenching the Q-carbon can cause a nanodiamond to nucleate. The nanodiamond can nucleate and provide a seed for growth of microdiamond crystals. In some examples, the undercooled state may be retained for a sufficient period of time prior to quenching. Retaining the undercooled state for a sufficient period of time can allow diamond nanocrystallites to nucleate and grow. As an example, for a nanodiamond having a size of 10 nm, the period of time for growth may be between 5 ns and 10 ns. As another example, a diamond layer of unit cell thickness of 0.356 nm may be formed by melting and quenching 37 nm of Cu-2.0 at % amorphous carbon film.

In other examples, nanodiamond nuclei can be embedded in the Q-carbon. The nanodiamond nuclei can provide a seed for growth of diamond microstructures, diamond nanostructures, and single-crystal diamond sheets. For example, the nanodiamond nuclei can provide a seed for growth of diamond nanoneedles, diamond microneedles, and large-area single-crystal diamond sheets.

In some examples, increasing the carbon content of the amorphous carbon film (e.g., from 2.0 at % to 4 at %) can double the thickness of graphene or diamond layers. In still another example, nucleation and growth of diamond or the formation of graphene from the amorphous carbon film can depend on a number of factors including, for example, the parameters of the laser (e.g., energy density of a laser pulse or duration of the laser pulse), the characteristics of the amorphous carbon film substrate, the extent of undercooling of the amorphous carbon film, and the sp$^3$ content of the amorphous carbon film.

Q-carbon formed from the amorphous carbon film may have various enhanced characteristics and properties. For example, the Q-carbon can have enhanced mechanical, chemical, and physical properties, including, for example, enhanced hardness, enhanced electrical conductivity, enhanced room-temperature ferromagnetism ("RTFM"), enhanced field emission, and enhanced electron emission (e.g., negative electron affinity). In some examples, the Q-carbon can be harder than diamond. For example, from covalent bond length determinations, the Q-carbon may be harder than diamond. In some examples, the Q-carbon may be a semiconductor. In other examples, the Q-carbon may be metallic. In still another example, the Q-carbon may exhibit robust ferromagnetism. As an example, the Q-carbon can have enhanced ferromagnetism with a Curie temperature at about 500K. In another example, the Q-carbon can have enhanced ferromagnetism with a Curie temperature over 500K.

Figure 42:
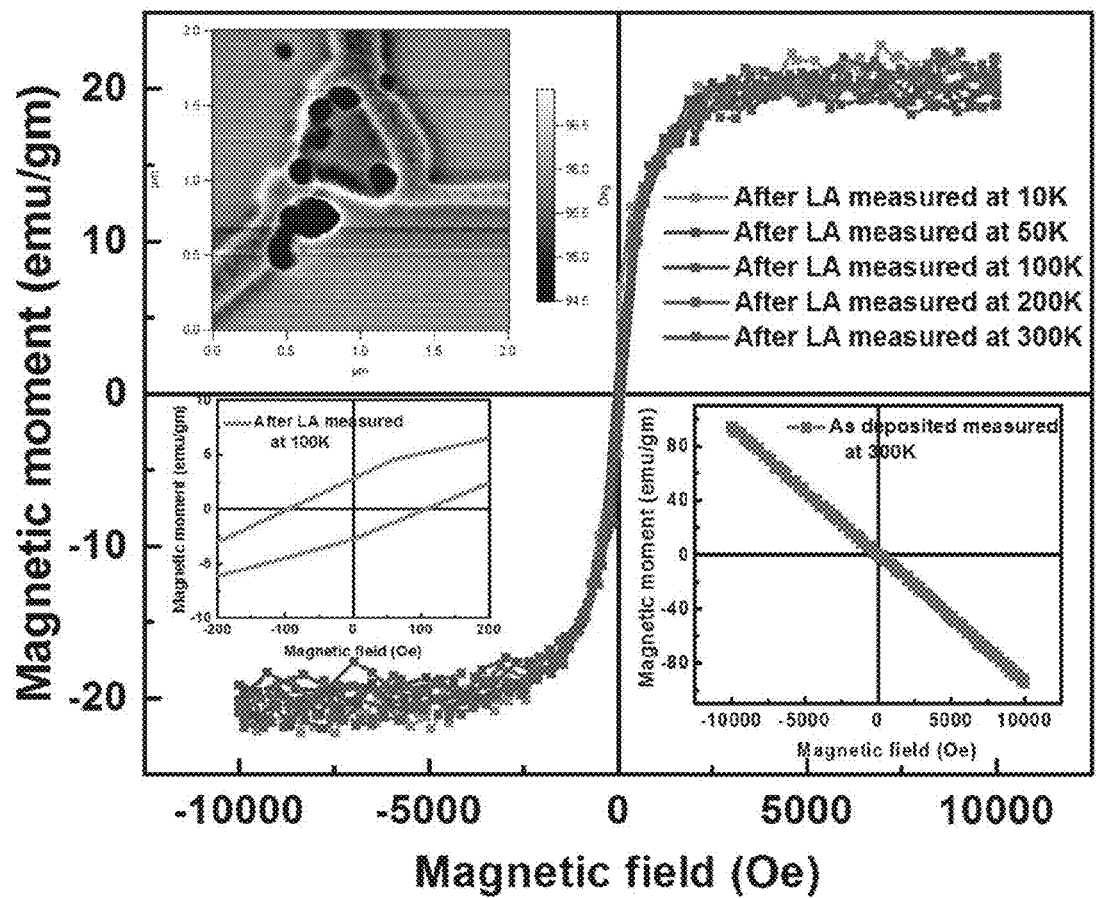
FIG. 42 is a graph depicting an example of bulk ferromagnetism in carbon, according to one example.

FIG. 42 is a graph depicting an example of bulk ferromagnetism in carbon, according to one example.

Figure 43:
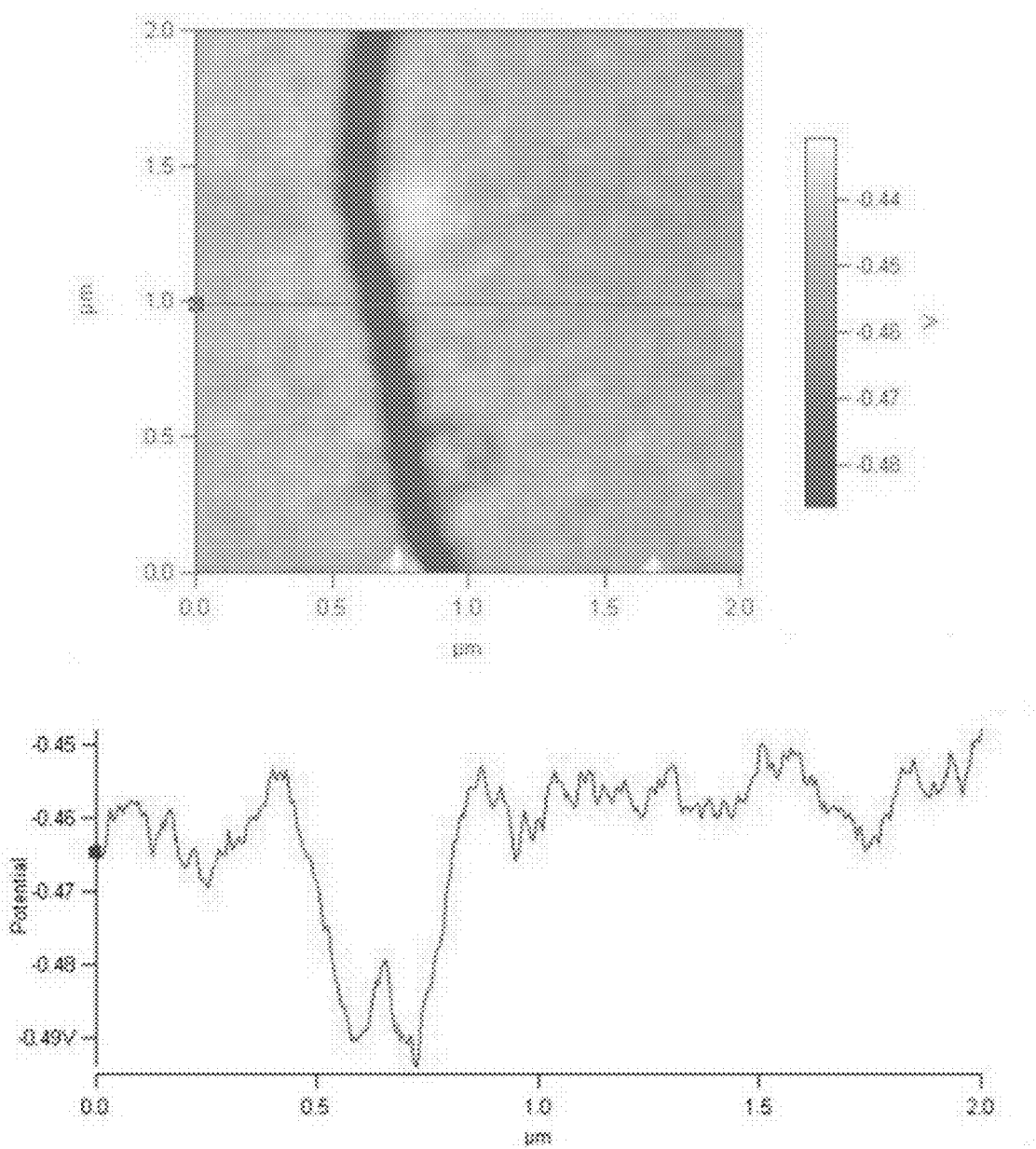
FIG. 43 is a graph showing Kelvin Probe Force Microscopy ("KPFM") on Q-carbon compared to a matrix of diamond and diamond-like carbon.

FIG. 43 is a graph showing Kelvin Probe Force Microscopy ("KPFM") on Q-carbon compared to a matrix of diamond and diamond-like carbon. In the example depicted in FIG. 43, Q-carbon can have lower surface potential (e.g., up to 40 meV) compared to diamond-like carbon. In some examples, the lower surface potential can indicate that the Q-carbon has higher field emission potential as compared to diamond-like carbon.

Figure 44:
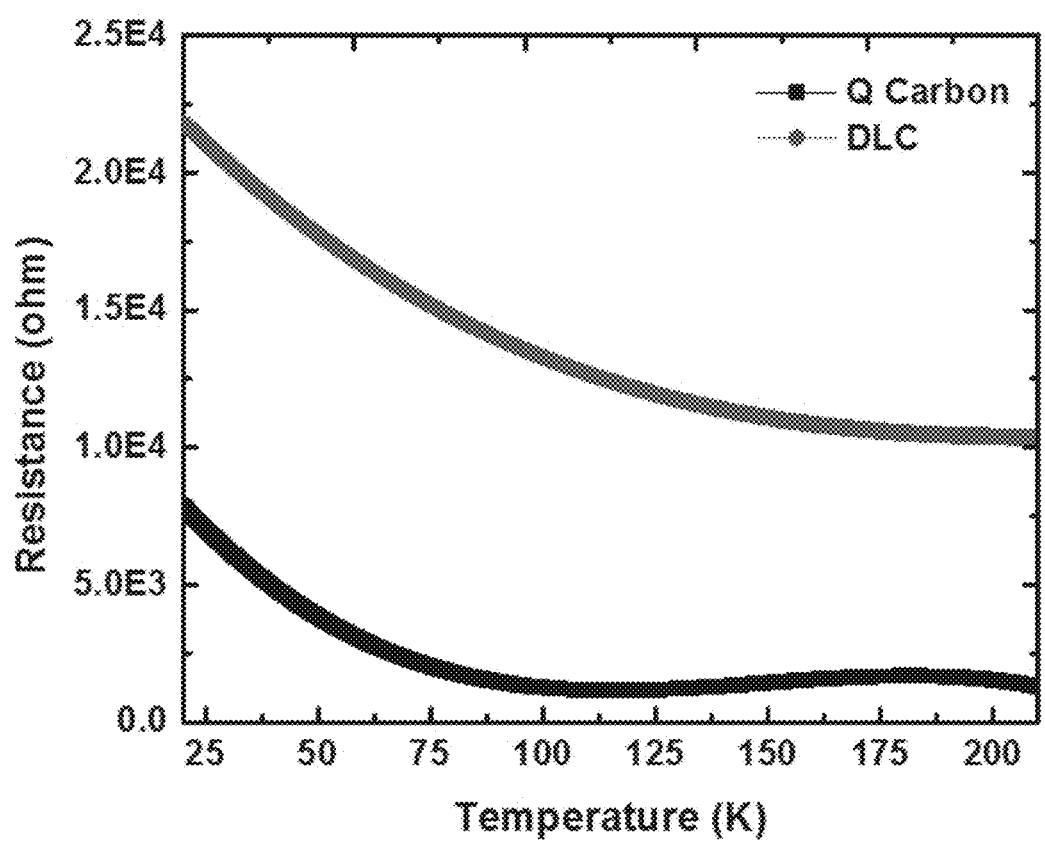
FIG. 44 is a graph showing resistivity of amorphous carbon and Q-carbon as function of temperature.

FIG. 44 is a graph showing resistivity of amorphous carbon versus resistivity of Q-carbon as a function of temperature. In some examples, resistivity of amorphous carbon can be measured before applying a laser pulse to the amorphous carbon. In the example shown in FIG. 44, there can be a decrease in resistivity with increasing temperature after the laser pulse is applied to the amorphous carbon (e.g., after the Q-carbon is formed). In some examples, the decrease in resistivity can indicate that Q-carbon has characteristics of a semiconductor. For example, in the example shown in FIG. 44, a decrease in resistivity with increasing temperature can indicate that the Q-carbon may have semiconducting characteristics up to about 125K. The example shown in FIG. 44 may also indicate a semiconductor-to metal transition.

Figure 45:
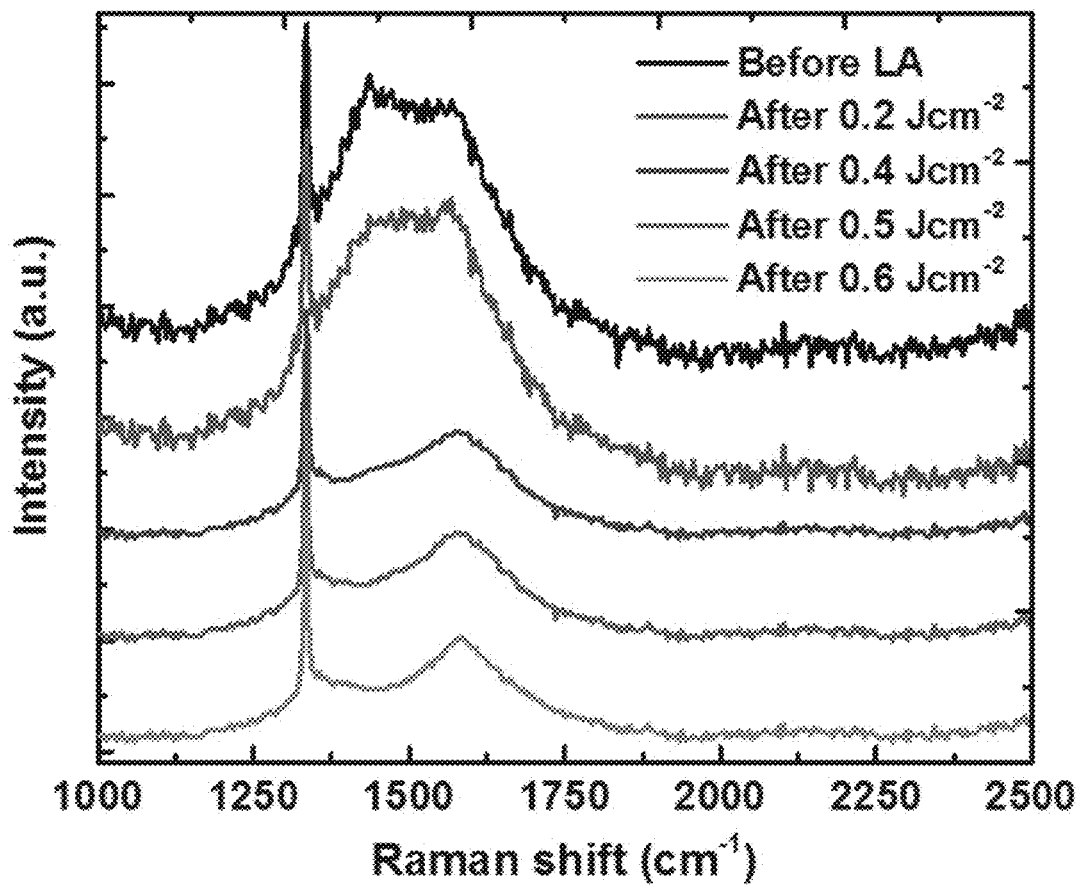
FIG. 45 is a graph depicting an example of Raman spectra results from Q-carbon after multiple laser pulses, showing high-temperature stability of Q-carbon

FIG. 45 is a graph depicting an example of Raman spectra results from Q-carbon after multiple laser pulses. In the example depicted in FIG. 45, the Raman spectra results may indicate that Q-carbon can be stable against thermal heating.

A diamond formed from Q-carbon may have various enhanced characteristics and properties. For example, a nanodiamond formed from Q-carbon may have enhanced hardness or enhanced electron emission and catalytic properties. In some examples, a nanodiamond with enhanced electron emission properties may contain a sp$^3$ bonded nanostructured diamond and a small fraction of sp$^2$ bonded carbon. The nanodiamond may also contain disordered carbon associated with grain boundaries.

Returning to FIG. 41, in some examples, the process for converting carbon into the phase of carbon further includes, in block 4106, integrating the diamond structure with a substrate. For example, the diamond structure can be integrated with a silicon based microelectronic device. In another example, the diamond structure can be integrated with a silicon based nanoelectronic device.

Figure 46:
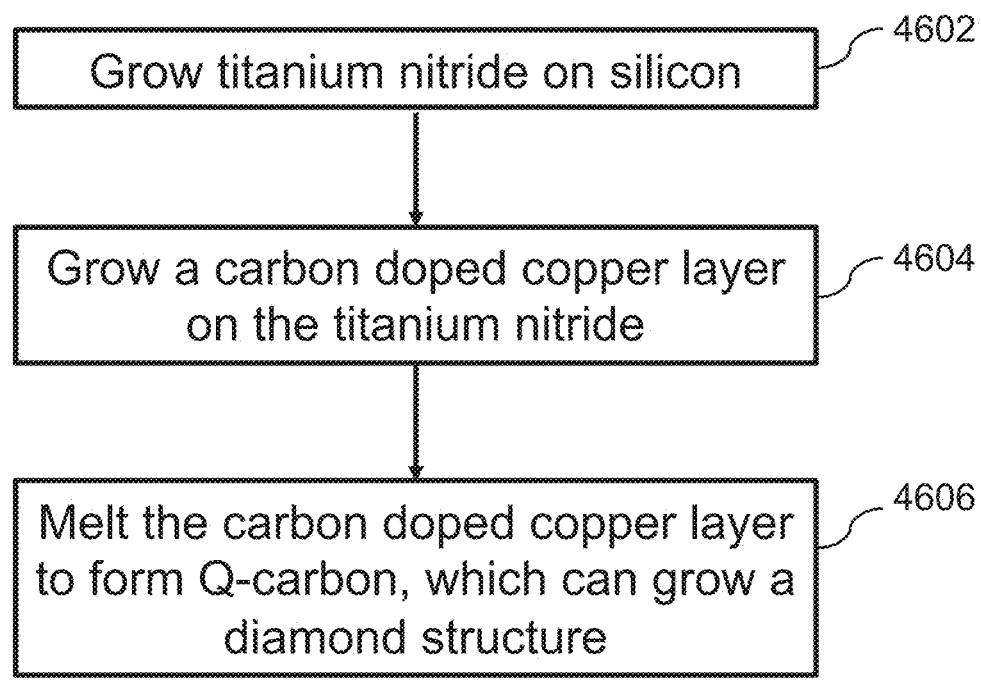
FIG. 46 is a flow chart depicting an example of a process for integrating a diamond structure with a substrate.

As an example, FIG. 46 is a flow chart depicting an example of a process for integrating a diamond structure with a substrate.

In block 4602, titanium nitride can be grown on silicon. In some examples, a layer of epitaxial titanium nitride can be grown on a silicon substrate. The titanium nitride can be grown by pulsed laser deposition, for example, utilizing KrF (248 nm wavelength) or ArF (193 nm wavelength). The epitaxial titanium nitride can have a lattice constant of 0.42 nm. The silicon can have a lattice constant of 0.543 nm. In some example, the layer of epitaxial titanium nitride can be grown on the silicon by domain matching epitaxy paradigm, where titanium nitride can grow epitaxially on the silicon substrate. For example, the epitaxial titanium nitride can be grown on the silicon substrate with over twenty-two percent lattice misfit by alternating 4/3 (e.g., corresponding to twenty-five percent misfit) and 5/4 (e.g., corresponding to twenty percent misfit) domains of lattice planes with almost equal frequency. In some examples, the epitaxial titanium nitride layer can have low metallic resistivity (e.g., 15 μΩ-cm). In some examples, the epitaxial titanium nitride layer with low metallic resistivity can provide an effective diffusion barrier and a template for epitaxial growth of subsequent function layers.

In block 4604 a carbon doped copper layer can be grown on the titanium nitride. The copper layer can be grown by pulsed laser deposition, for example, utilizing KrF or ArF. In some examples, the carbon doped copper layer can have a lattice constant of 0.360 nm. The carbon doped copper layer can be grown epitaxially on the titanium nitride by matching seven lattice planes of copper with six lattice planes of titanium nitride, which may correspond to 7/6 domain matching epitaxy to accommodate over fifteen percent lattice misfit. In some examples, the epitaxial titanium nitride layer can be a robust diffusion barrier layer, which can protect an underlying silicon substrate (e.g., the silicon substrate in block 4102). For example, the epitaxial titanium nitride layer can protect the silicon substrate from any contamination from the carbon doped copper layer.

In block 4606, the carbon doped copper layer can be melted to form Q-carbon, which can grow a diamond structure. In some examples, the carbon doped copper layer can be melted by pulsed laser annealing (e.g., by utilizing a nanosecond Excimer pulsed laser). The carbon doped copper layer can be melted by utilizing energy densities in the melting regime. In some examples, the melted carbon can be zone refined to surface and grow epitaxially as graphene or diamond depending on parameters (e.g., energy density) of the laser. The carbon doped layer can be melted to form Q-carbon, which can grow a diamond structure, in a manner substantially the same as the process for converting carbon into Q-carbon described in detail with respect to FIG. 41.

In some examples, the diamond structure can be integrated with a silicon based microelectronic device. In another example, the diamond structure can be integrated with a silicon based nanoelectronic device. In some examples the diamond structures can provide a template for the growth of cubic boron nitride ("c-BN").

In some aspects, methods for converting carbon into a phase of carbon which can grow or nucleate diamond are provided according to one or more of the following examples:

Example #1: Diamond-like carbon films (e.g., amorphous carbon films) can be deposited on sapphire (e.g., sapphire that is c-plane polished both sides), SiO$_2$/Si(100) and glass substrates by using an ArF laser. The ArF laser can provide a laser pulse for ablation. The laser pulse can have a wavelength of 193 nm. The laser pulse can have an energy density of 3.0 Jcm$^{-2}$ The ArF laser can provide the laser pulse for a duration of 20 ns. A second laser pulse can melt the deposited carbon films to a thickness between 50 nm and 500 nm. The diamond-like carbon films can be characterized by transmission electron microscopy and Raman spectra. The diamond-like carbon films may be amorphous containing Raman signature with estimated Sp$^3$ fraction over fifty percent. The diamond-like carbon films can be irradiated in air with ArF laser pulses. Each laser pulse can have a wavelength of 193 nm. Each laser pulse can have an energy density of 0.6 Jcm$^{-2}$. Each laser pulse can have a duration of 20 ns. The diamond-like carbon films can be characterized by high-resolution scanning electron microscopy, transmission electron microscopy, X-ray diffraction and Raman spectroscopy.

In some examples hexagonal boron nitride ("h-BN") can be directly converted into cubic boron nitride ("c-BN") by nanosecond pulsed laser melting h-BN at ambient temperatures and atmospheric pressure in air. According to the pressure-temperature phase diagram of c-BN, transformation from h-BN into c-BN under equilibrium processing may occur at high temperatures and pressures, as the hBN-cBN-Liquid triple point is at 3500K/9.5 GPa or 3700K/7.0 GPa. By nonequilibrium nanosecond laser melting h-BN, a super undercooled state can be created. The super undercooled state can shift the hBN-cBN-Liquid triple point to as low as 2800K and atmospheric pressure. In some examples, h-BN can be directly converted into c-BN by controlling the kinetics of transformation at ambient temperatures and atmospheric pressure in air by nanosecond pulsed laser annealing h-BN. In some examples, an n-type dopant and a p-type dopant can be incorporated into c-BN formed from h-BN. Incorporating a concentration of an n-type dopant (e.g., Si) and a p-type dopant (e.g., Zn or Be) into c-BN can create a doped layer. The doped layer can be used for next-generation solid state devices and systems.

In some examples, c-BN can have enhanced properties. For example, a c-BN coating may have less reactivity with ferrous alloys even at high temperatures, which may allow the c-BN coating to be matched with the ferrous alloys. In still another example, c-BN can be doped with both n-type and p-type dopants. In some examples, a c-BN coating may have a protective boron oxide layer. The protective boron oxide layer may cause the c-BN coating to have a higher oxidation resistance than diamond. In another example, the boron oxide layer can be an insulating layer, which may be used for solid state devices or systems (e.g., high-power devices, cutting tools, and biomedical applications). In some examples, c-BN may have properties, which may be advantageous over properties of diamond.

In some examples, c-BN may have properties similar to properties of diamond. For example, electrical properties of c-BN may be similar to electrical properties of diamond.

Figure 47:
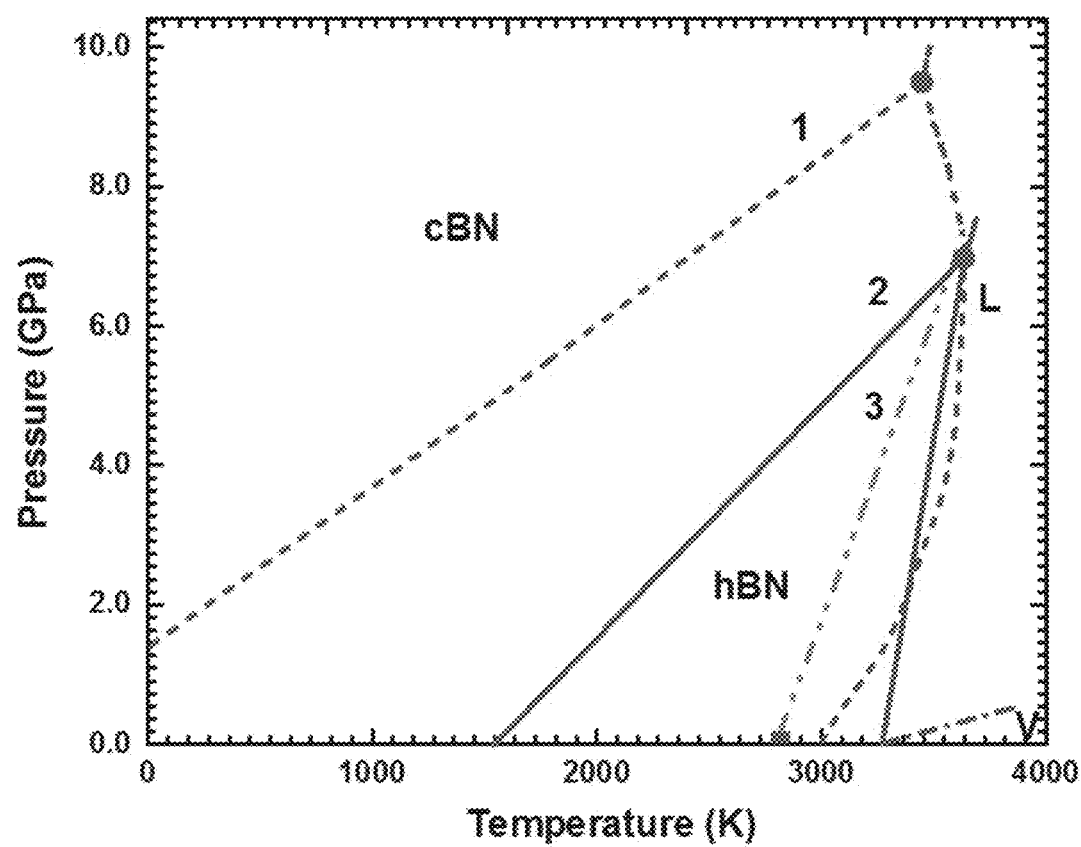
FIG. 47 is a graph depicting an example of a boron nitride phase diagram containing cubic boron nitride (c-BN), hexagonal boron nitride (h-BN) and liquid boron nitride.

FIG. 47 is a graph depicting an example of a cubic boron nitride phase diagram.

In the phase diagram depicted in FIG. 47, there can be differences between well accepted Corrigan and Bundy (curve 1) and modifications suggested by Solozhenko (curve 2) based upon some experimental born nitride ("BN") melting data and extrapolation of heat capacities of BN phases into high-temperature regime by using pseudo-Debye model, which can have at least four adjustable parameters.

In some examples, $\Delta G^0$ (T,P) for h-BN to c-BN phase transformation can be negative in the temperature range 0-1600K and positive above 1600K. In some examples, $\Delta G^0$ (T,P) for h-BN to c-BN phase transformation being negative in the temperature range 0-1600K and positive above 1600K can modify the well accepted phase diagram of Corrigan and Bundy, according to which c-BN line does not meet T-axis and intersects pressure axis at 1.4 GPa. In some examples, the L-cBN-hBN triple point can be shifted from 3500K/9.5 GPa (Corrigan-Bundy P-T diagram) to 3700K/7.0 GPa. In another example, the L-cBN-hBN triple point can be shifted from 3500K/7.0 GPa to 3000K/0.1 MPa (1 Atm) by using nanosecond laser melting to cause super undercooling of h-BN, where liquid BN can be directly converted into a stable phase of c-BN.

Figure 48:
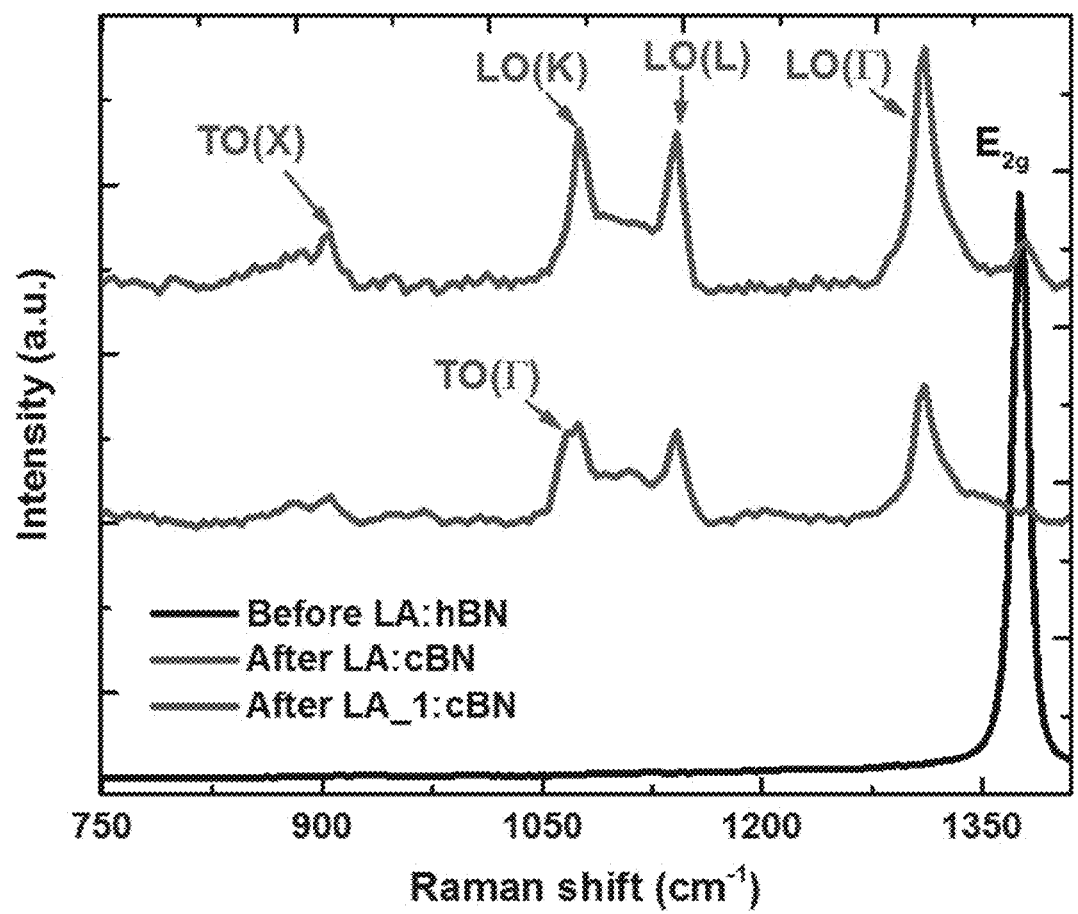
FIG. 48 is a graph depicting an example of Raman spectra results before and after laser annealing h-BN to convert h-BN into phase-pure c-BN.

FIG. 48 is a graph depicting an example of Raman spectra results before laser annealing hBN and after laser annealing hBN. After laser annealing, only characteristic peaks for cBN are observed, illustrating 100% conversion of hBN into phase-pure cBN, as shown in Table 2 below. Table 2 shows an agreement of Raman data with theoretical data on Raman spectra of cBN.

Table 2, below, includes data from experimentally observed Raman vibrational modes of cBN formed in accordance with the present disclosure. The theoretical and experimental values can be obtained from ab-initio calculations.

TABLE 2

Theoretical and experimentally observed Raman vibrational modes of c-BN

| Optical Branch | Theoretical (cm$^{-1}$) | Experimental (cm$^{-1}$) |
|---|---|---|
| TO(X) | 900 | 902.15 |
| TO(K) | 910 | 917.82 |
| TO(Q) | 945 | 947.84 |
| TO(W) | 965 | 971.41 |
| TO(Q) | 1000 | 998.27 |
| TO(Γ) | 1035 | 1012.50 |
| LO(K) | 1075 | 1074.84 |
| LO(L) | 1140 | 1141.93 |
| LO(Γ) | 1285 | 1310.88 |

FIG. 49A shows formation of super undercooled BN, which can be referred to as Q-BN, from which nano and micro cBN crystallites are formed. In some examples, as-deposited hBN can be in the form of nanocrystalline hBN, which is melted at atmospheric pressure in air at an estimated temperature of 2800K. The Q-BN can be formed near a sapphire interface, similar to Q-carbon, which can break into filamentary structure through interfacial instability. In some examples, the Q-BN can be converted into nanocrystalline films, large-area <111> platelets, or single-crystal thin films. For example, FIG. 49B shows Q-BN converted into nanocrystalline films. FIG. 49C shows Q-BN converted into large-area <111> platelets. FIG. 49D shows Q-BN converted into single-crystal thin films.

Figure 50A:
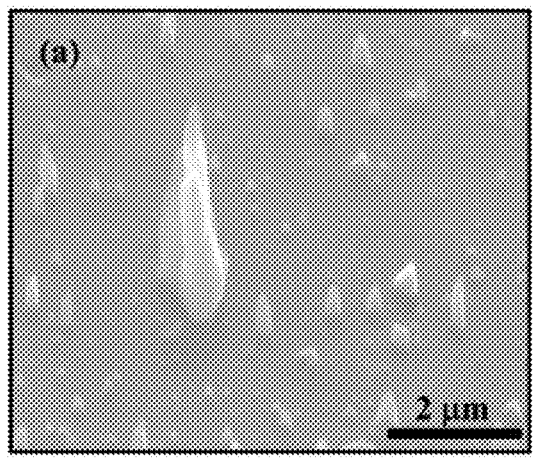
FIG. 50A shows formation of nanoneedles and microneedles of cBN.

FIG. 50A shows formation of nanoneedles and microneedles of cBN. In some examples, some of the microneedles can be over two microns long.

Figure 50B:
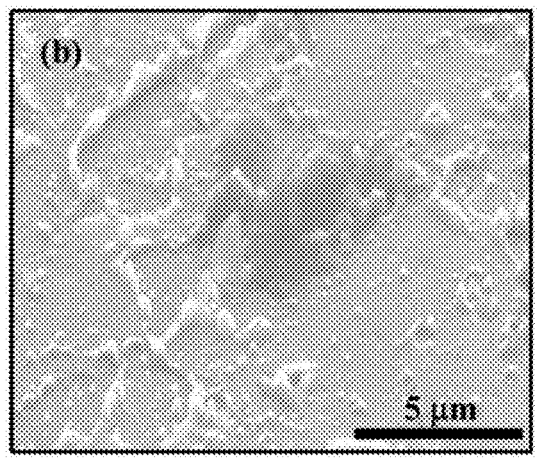
FIG. 50B shows a mechanism of formation of nanoneedles and microneedles of cBN.

FIG. 50B shows a mechanism of formation of nanoneedles and microneedles of cBN, where interfacial instability in super undercooled BN leads to formation periodic features of an order of 90 nm, which coalesce to form larger size microneedles.

Figure 50C:
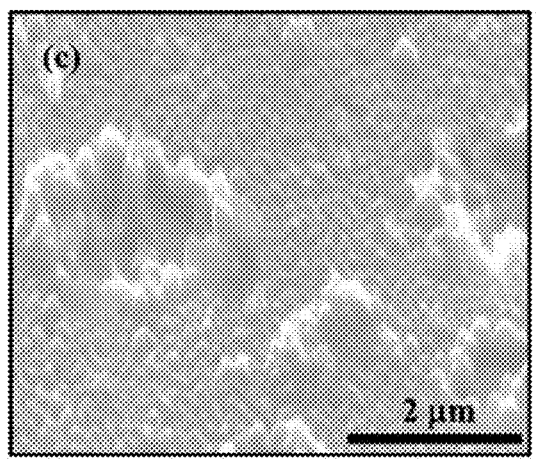
FIG. 50C shows initial stages of formation of nanoneedles and microneedles as a result of interfacial instability.

FIG. 50C shows initial stages of formation of nanoneedles and microneedles as a result of interfacial instability.

Figure 50D:
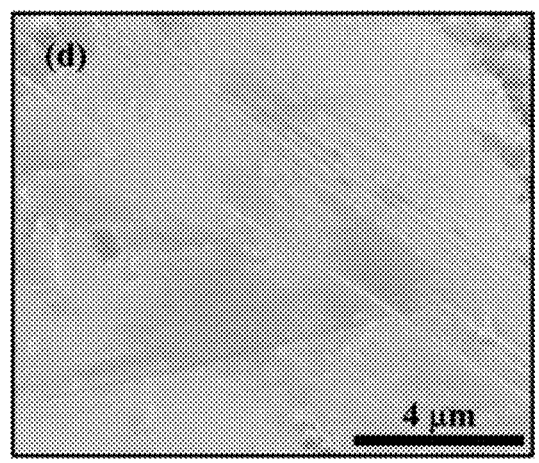
FIG. 50D shows a large-area single crystal thin film formed in the middle for a laser beam.

FIG. 50D shows a large-area single crystal thin film formed in the middle for a laser beam, where there is 100% conversion of hBN into phase pure cBN.

In some embodiments, hexagonal BN ("hBN") can be deposited onto c-sapphire substrates at room temperature using ArF laser (pulse duration=20 ns, wavelength=193 nm, energy density=3.0 J cm$^{-2}$) in a laser MBE chamber under a vacuum of 3E-08 torr. The as-deposited films can be nanocrystalline with grain size ~25 nm. These films can be irradiated using pulsed ArF laser having energy densities of 0.3 to 1.0 J cm$^{-2}$ to create super undercooled BN (referred as Q-BN) from which nano- and micro-cBN crystallites are formed. The as-deposited hBN can be in the form of nanocrystalline hBN, which can be melted at atmospheric pressure in air at the estimated temperature of 2800 K. The Q-BN is formed near the sapphire interface, similar to Q-carbon, which can break into filamentary structure through interfacial instability. The Q-BN can be converted into nanocrystalline films, large-area <111> platelets and single-crystal thin films, nanoneedles and microneedles of cBN. In some embodiments, large-area single-crystal thin films are formed in the middle for the laser beam, where (0001) sapphire substrate is providing a template for (111) growth of diamond. In some embodiments hBN is converted into phase-pure cBN in the form of nanodots, nanorods, microcrystalline thin films, and large-area single-crystal cBN thin films.

Embodiments also include methods for synthesis and processing of pure and/or nitrogen doped (or "N-doped") diamonds (e.g., diamonds having a nitrogen-vacancy ("NV") center (or "NV defect")) with sharp NV$^0$ and NV$^-$ transitions at ambient temperatures and pressures in air. Pure and nitrogen doped nanodiamonds are non-toxic, and have enhanced electronic, magnetic, optical and mechanical properties with applications ranging, for example, from drug delivery and fluorescent biomarkers to single-photon sensors and quantum computing, nanoscale electronic and magnetic sensing, single-spin nuclear magnetic resonance, nanoscale thermometry and nanosensors. The NV center in diamond is a point defect in diamond with C3v symmetry consisting of substitutional nitrogen and vacancy pair along <111> directions. Considering <110> chains, one of the links consists of a substitutional nitrogen and a lattice vacancy, as illustrated in FIGS. 51 and 52.

Figure 51:
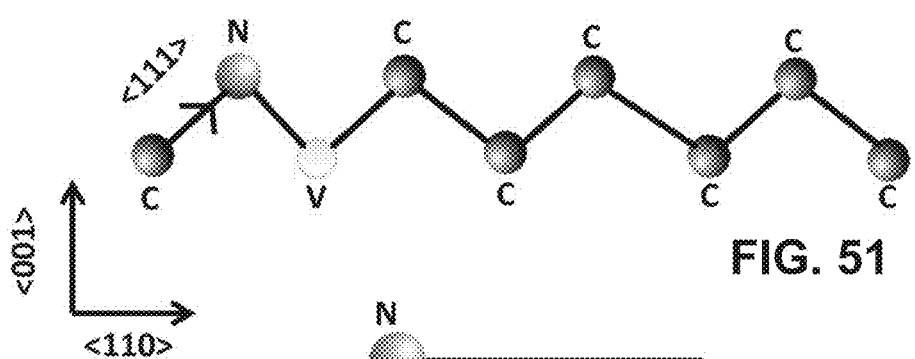
FIG. 51 illustrates the atomic structure of substitutional nitrogen and vacancy (NV) defect in <110> chain of diamond.
Figure 52:
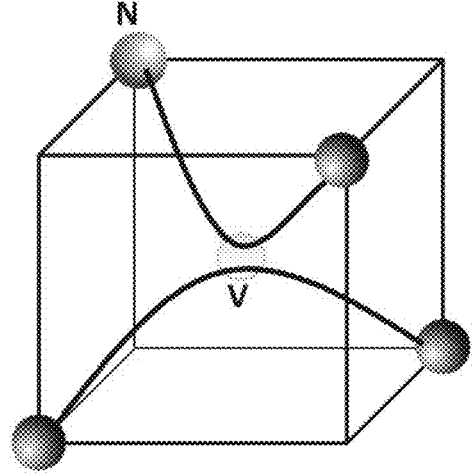
FIG. 52 illustrates an NV defect in a diamond tetrahedron contained in (a/2,a/2,a/2) diamond unit cell.

FIG. 51 illustrates the atomic structure of an NV defect in the <110> chains of diamond, and FIG. 52 illustrates the structure of an NV defect in the diamond tetrahedron contained in the half (a/2, a/2, a/2) unit cell. These NV centers in diamond are stable, and can be used, for example, for reliable and robust electronic, optical and magnetic nanoscale devices and systems operating at room temperature. The NV center is a deep-level defect; and it exists in neutral NV$^0$ state and magnetically active NV$^-$ state with a trapped electron. Unique features of the NV center are derived from spin triplet ground state and dependence of fluorescence on spin orientation. The Electron Paramagnetic Resonance ("ERR") spectrum of a single NV center can be detected and shifts of the ERR spectra can be measured from perturbations in electric and magnetic fields, temperature, spatial orientation, strain and pressure. The magnetically active NV$^-$ defects are characterized by optical zero phonon line ("ZPL") at 1.945 eV (637 nm), whereas NV$^0$ has ZPL at 2.156 eV (575 nm). Associated vibronic bands extend ZPLs to lower and higher energy absorption and emission.

The magnetically active NV$^-$ is also characterized by zero-field magnetic resonance at ~2.88 GHz, which occurs between ms=0 and ms=±1 spins with a g-factor of 2.0028 associated with A$_2$ ground state. The optically detected magnetic resonance ("ODMR") of NV$^-$ at ~1.42 GHz is attributed to $^3$E ground state with g-factor of 2.01. Because NV$^-$ is magnetically active, its luminescence can be controlled by the magnetic field for various applications including, for example, single-photon sensors, nanoscale electronic and magnetic sensing, single-spin nuclear magnetic resonance, nanoscale thermometry, fluorescent biomarkers, quantum computing and nanosensors. It may be desirable to perform controlled synthesis of pure and NV-doped diamonds for these and/or other applications.

Embodiments include methods for controlled synthesis of NV-doped diamonds by direct conversion of N-doped carbon into NV-doped diamond structures such as, for example, single-crystal nanodiamonds, nanoneedles, microneedles and/or thin films. In some such embodiments, one or more carbon films can be deposited by pulsed laser deposition on a substrate (e.g., tungsten carbide, silicon, stainless steel, titanium nitride, sapphire, glass, or polymer substrate) to a desired thickness. In some embodiments, the layer thickness ranges from 5 nm to 500 nm. The carbon films can be doped with nitrogen by: (1) by adjusting the nitrogen partial pressure ($5.0 \times 10^{-3}$, $5.0 \times 10^{-2}$, $5.0 \times 10^{-1}$ Torr); and/or (2) by bombarding simultaneously with N$_2^+$ (0.5-1.0 KeV) during carbon thin film deposition. The N$_2^+$ ions break into atomic nitrogen atoms upon impact, which are buried inside the film. The nitrogen concentration can be adjusted by controlling the nitrogen partial pressure and/or by measuring the nitrogen ion flux. Subsequently, the films are irradiated with high-power nanosecond laser pulses with energy density 0.5-1.0 Jcm$^{-2}$, pulse duration 20-40 nanoseconds, and laser wavelength of 193 nm for ArF Excimer laser. The as-deposited and doped films are melted in the highly super undercooled state and then quenched (e.g., within 200-250 nanoseconds) to form NV-doped diamond.

In some embodiments, the NV-doped diamond can be formed with dopant concentrations exceeding solubility limits. Rapid quenching and solidification (e.g., with velocity of the order of 5 ms$^{-1}$) from a liquid phase can trap NV defects beyond thermodynamic limits. For example, a single NV defect in 5 nm diamond may require solubility limit of $2.0 \times 10^{18}$ Ncm$^{-3}$, which can be achieved by rapid quenching (e.g., within 200-250 nanoseconds) from the liquid, utilizing the phenomenon of solute trapping.

By controlling the quenching from the liquid, NV-doped diamonds can be nucleated in the form of nanodiamonds (2-8 nm), microdiamonds (100-1000 nm), nanoneedles and microneedles up to 3000 nm long, and large-area thin films. NV-doped nanodiamonds, microdiamonds, nanoneedles, microneedles, and large area single crystal films can be formed from super undercooled carbon depending, for example, on the factors discussed above and with values similar to those shown in Table 1.

In some embodiments, the NV defects can be located individually in various diamond structures (e.g., as nanodiamonds (4 nm-10 nm), nanoneedles, microneedles and/or thin films) by, for example, controlling the nitrogen concentrations in the as-deposited films. Nitrogen is incorporated into the NV-doped diamond during rapid liquid-phase growth, where dopant concentrations can exceed the thermodynamic solubility limits, as discussed above. The number density of NV defects can be controlled by the nitrogen concentrations in the as-deposited films. A single NV defect in 5 nm diamond may require solubility limit in excess of $2.0 \times 10^{18}$ Ncm$^{-3}$, which can be achieved by rapid quenching within 200-250 nanoseconds from the liquid, utilizing the phenomenon of solute trapping. The NV-doped diamond can be formed with sharp NV$^-$ and NV$^0$ transitions, and transitions between NV$^-$ and NV$^0$ can be introduced electrically and optically by laser illumination.

In some embodiments, a single-crystal substrate template is used to grow epitaxial NV diamond structures such as, for example, epitaxial single-crystal microdiamonds, nanoneedles, microneedles and large-area thin films.

In some embodiments, NV diamond structures can be placed deterministically on the substrate. In some examples, the NV diamond structures can be arranged periodically in a self-organized fashion (e.g., via self-assembly). In another example, strain driven placement can be used to deterministically place NV diamond structures on the substrate.

Embodiments providing controlled doping of diamond with NV centers in a variety of nanostructures can be used, for example, for various quantum nanotechnologies in physical and biological sciences (e.g., single-photon sensors, quantum computing, nanoscale electronic and magnetic sensing, single-spin nuclear magnetic resonance, nanoscale thermometry, fluorescent biomarkers and nanosensors).

It will be appreciated that, in some embodiments, different dopants can be used to create other types of doped diamonds, such as n-type and p-type doped diamonds. In some such embodiments, carbon films doped with an n-type dopant (e.g., Ni, P, As, or Sb—) can be directly converted into n-type doped diamond (e.g., n-type doped diamond with dopant concentrations exceeding far beyond the thermodynamic solubility limits) similar to the methods discussed above with respect to NV-doped diamonds. It will similarly be appreciated that p-type doped diamond by directly converting carbon films doped with a p-type dopant (e.g., boron and boron compounds) can be directly converted into p-type doped diamond (e.g., p-type doped diamond with dopant concentrations exceeding the thermodynamic solubility limits).

Embodiments also include methods for controlled synthesis of pure (or "un-doped") diamonds by direct conversion of pure carbon into pure diamond. The pure diamonds can be in the form of single-crystal nanodiamonds, nanoneedles, microneedles and/or thin films. In some such embodiments, one or more carbon films can be deposited by pulsed laser deposition on a substrate (e.g., tungsten carbide, silicon, stainless steel, titanium nitride, sapphire, glass, or polymer substrate) to a desired thickness. In some embodiments, the layer thickness ranges from 5 nm to 500 nm. Subsequently, the films are irradiated with high-power nanosecond laser pulses with energy density 0.5-1.0 Jcm$^{-2}$, pulse duration 20-40 nanoseconds, and laser wavelength of 193 nm for ArF Excimer laser. The as-deposited and doped films are melted in the highly super undercooled state and then quenched within 200-250 nanoseconds to form pure diamond. By controlling the quenching from the liquid, pure diamonds can be nucleated in the form of nanodiamonds (2 nm-8 nm), microdiamonds (100 nm-1000 nm), nanoneedles and microneedles up to 3000 nm long, and large-area thin films. Pure nanodiamonds, microdiamonds, nanoneedles, microneedles, and large area single crystal films can be formed from super undercooled carbon depending, for example, on the factors discussed above and with values similar to those shown in Table 1.

In some embodiments, a single-crystal substrate template is used to grow epitaxial pure diamond structures such as, for example, epitaxial single-crystal microdiamonds, nanoneedles, microneedles and large-area thin films.

In some embodiments, pure diamond can be placed deterministically on the substrate. In some examples, the diamond structures can be arranged periodically in a self-organized fashion (e.g., via self-assembly). In another example, strain driven placement can be used to deterministically place diamond structures on the substrate.

With respect to FIGS. 53-66, the characterization of diamond phase was carried by using electron backscatter diffraction ("EBSD"), Raman spectroscopy (633 nm source), and photoluminescence (PL) with 325 nm source. Alfa300 R superior confocal Raman spectroscope with a lateral resolution less than 200 nm was employed to characterize the Raman active vibrational modes. Crystalline Si was used to calibrate the Raman spectra, which has its characteristic Raman peak at 520.6 cm$^{-1}$. High resolution SEM with sub nanometer resolution was carried out using FEI Verios 460L SEM to characterize the as-deposited and the laser irradiated films. EBSD HKLNordlys detector with less than 10 nm lateral resolution was used to map out Kikuchi diffraction pattern in FEI Quanta 3D FEG instrument in as-deposited and laser annealed thin films.

Figure 53:
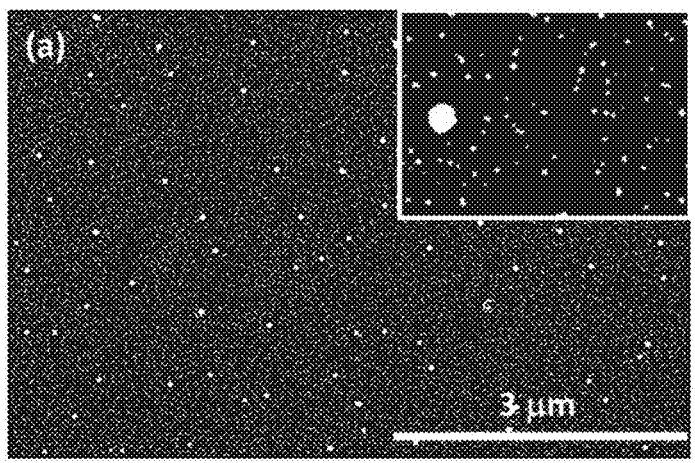
FIG. 53 is a high-resolution SEM micrograph of nanodiamonds with inset at a higher magnification, according to one example.
Figure 54:
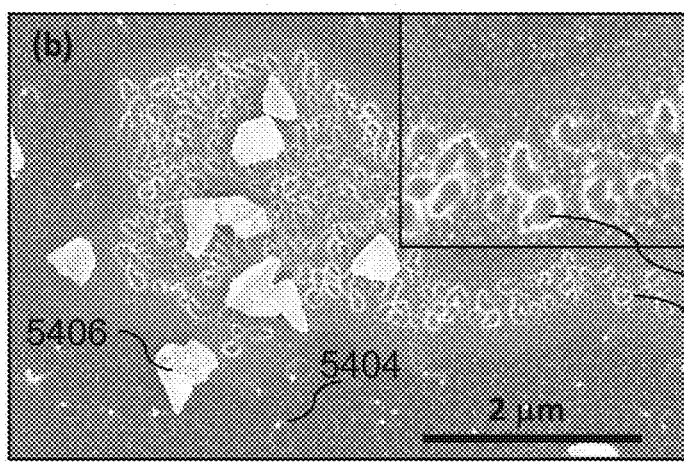
FIG. 54 is a high-resolution SEM micrograph of a mechanism of nanodiamond formation from Q-Carbon, according to one example.
Figure 55:
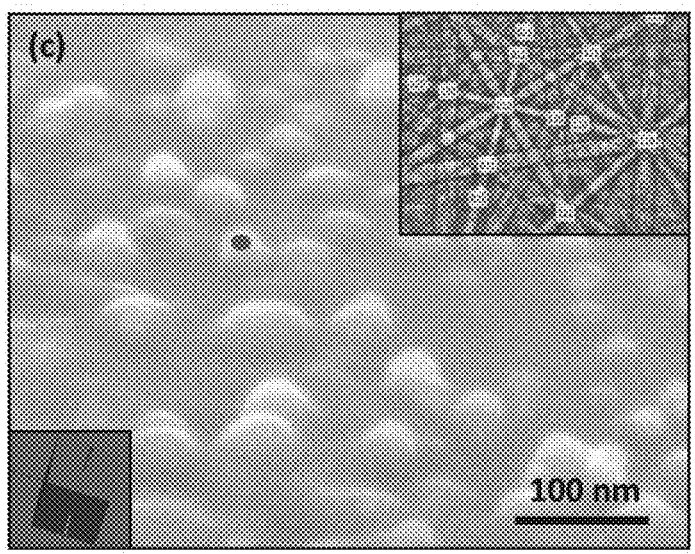
FIG. 55 is a high-resolution SEM micrograph of the formation of nanodiamonds during initial stages and EBSD pattern, showing characteristic diamond Kikuchi pattern, according to one example.

FIGS. 53-55 show high-resolution SEM micrographs of nanodiamonds from pure undoped samples. FIG. 53 is a high-resolution SEM micrograph of nanodiamonds with inset at a higher magnification, according to one example. The example depicted in FIG. 53 shows the formation of undoped nanodiamonds after a single laser pulse, where the average size varied from 2 nm to 8 nm, according to one example. These nanodiamonds nucleate from the highly undercooled carbon melt via homogeneous nucleation, and their size can be controlled by growth times during the quenching cycle. The larger sizes are formed as a result of heterogeneous nucleation, where sapphire acts as a template for diamond growth. Nanodiamonds are faceted down to this size range, as shown in the inset.

During the initial stages or incipient carbon melting, the melting occurs in the form of rings, creating a ring of nanodiamonds, such as ring 5402 shown in FIG. 54. FIG. 54 is a high-resolution SEM micrograph of a mechanism of nanodiamond formation from Q-Carbon, according to one example. FIG. 54 also shows the formation of Q-carbon and nucleation of nanodiamonds from Q-carbon, according to one example. The larger diamond microcrystallites grow from the melt with increasing growth time. The nanodiamond growth around the super undercooled ring often has one larger nanodiamond (e.g., 5404), which is formed when two nucleation fronts around the ring collide, as shown in the inset at a higher magnification. The larger micro-diamonds (e.g., 5406) can be formed when sapphire substrate provides a template for epitaxial growth from super undercooled liquid.

FIG. 55 is a high-resolution SEM micrograph of the formation of nanodiamonds during initial stages and EBSD pattern, showing characteristic diamond Kikuchi pattern, according to one example. The example depicted in FIG. 55 shows the initial stages of the formation of self-organized nanodiamonds, according to one example. The inset EBSD confirms the diamond crystal structure, showing the characteristic Kikuchi diffraction pattern for diamond. The formation of string like structure in a supercooled liquid may be a result of spatial heterogeneity and dynamic facilitation in the regions having high atomic mobility, corresponding to high diffusivity in liquid of the order of 10$^{-4}$ cm$^2$s$^{-1}$. Coherent motion of carbon atoms within micro strings may facilitate the creation of neighboring excitations leading to the formation of observed ring structure of liquid carbon from which nanodiamonds can be formed. Molecular dynamics simulations have shown string-like cooperative motion at temperatures well above the glass transition temperature. The mean length of the string increases upon cooling with nearly exponential distribution with temperature.

Figure 56:
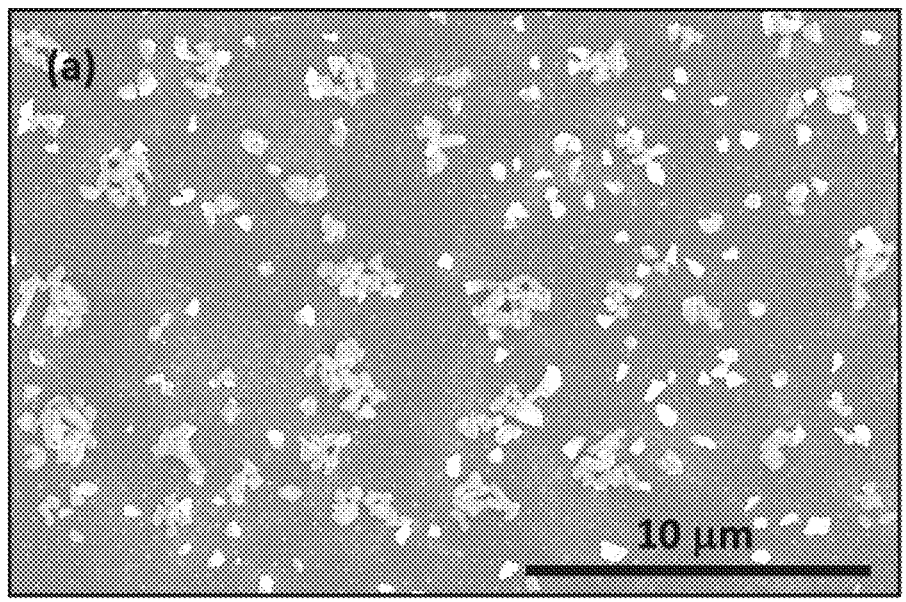
FIG. 56 is a high-resolution SEM micrograph of a mixture of nanodiamonds and microdiamonds, according to one example.
Figure 57:
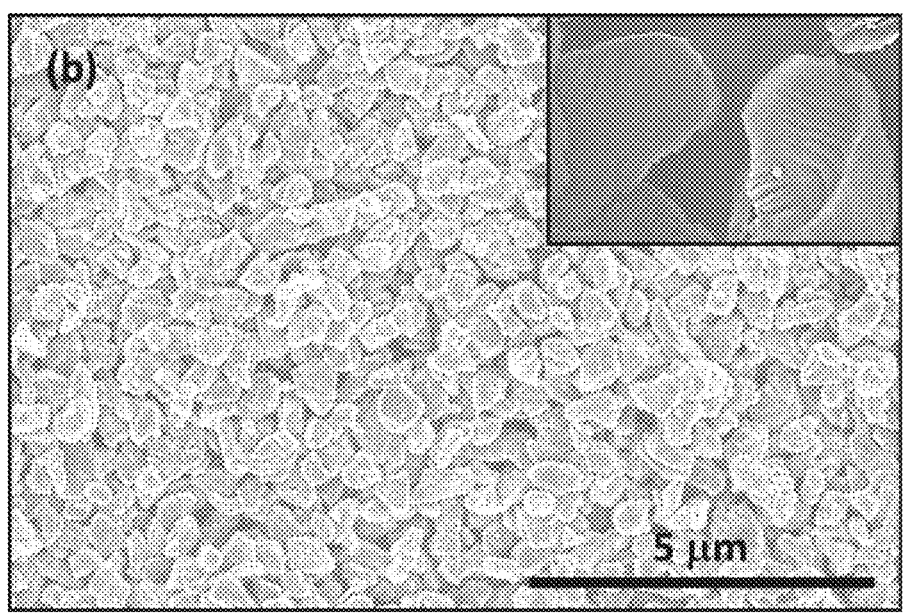
FIG. 57 is a high-resolution SEM micrograph of microdiamonds covering the entire area with inset showing twins whose density is controlled by quenching rates, according to one example.

FIGS. 56 and 57 show high-resolution SEM micrographs of microdiamonds from pure undoped samples. FIG. 56 is a high-resolution SEM micrograph of a mixture of nanodiamonds and microdiamonds, according to one example. The example depicted in FIG. 56 is a high-resolution SEM of undoped diamond nanocrystallites with average size 20 nm and microcrystallites with an average size of 500 nm, according to one example.

At a higher energy density, a full conversion of carbon into diamond microcrystallites is shown in FIG. 57, according to one example. The inset at a higher magnification shows the details of faceting and twinning in microcrystals. Such twinning in diamond can lead to improvements in catalytic and mechanical properties. Embodiments can vary the twin content by controlling the quenching rates from the melt, as shown, for example, by the formation of twins in the inset. The texture and orientation of these microcrystallites can be controlled by providing appropriate epitaxial template during growth from the liquid phase. In some embodiments, <111> oriented cubic diamond microcrystallites grow on (0001) sapphire, which are rotated with respect to each other by 30 degrees. The growth of three-fold cubic <111> diamond on hexagonal (0001) sapphire leads to twinning as result of two islands growing in a mirror symmetry.

Figure 58:
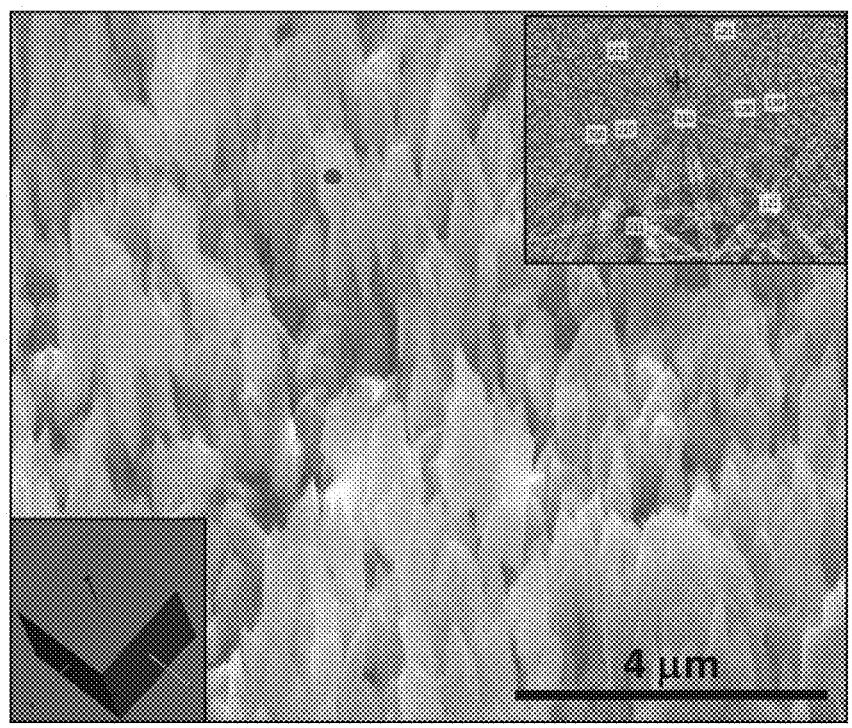
FIG. 58 shows nanoneedles and microneedles from pure undoped sample with inset characteristic diamond EBSD pattern and orientation from the spot indicated, according to one example.

FIG. 58 shows the formation of nanoneedles and microneedles as a result of interfacial instability during growth from the liquid phase, according to one example. These nanostructures are single-crystal without any large-angle grain boundaries, as result of interfacial instability during the initial stages of epitaxial growth with the underlying substrate template. Single-crystal nature of diamond is demonstrated by the Kikuchi diffraction pattern of the inset EBSD. The length of nanoneedles and microneedles is over three microns, which can occur as result of liquid phase growth with velocities around five meters per second.

Figure 59:
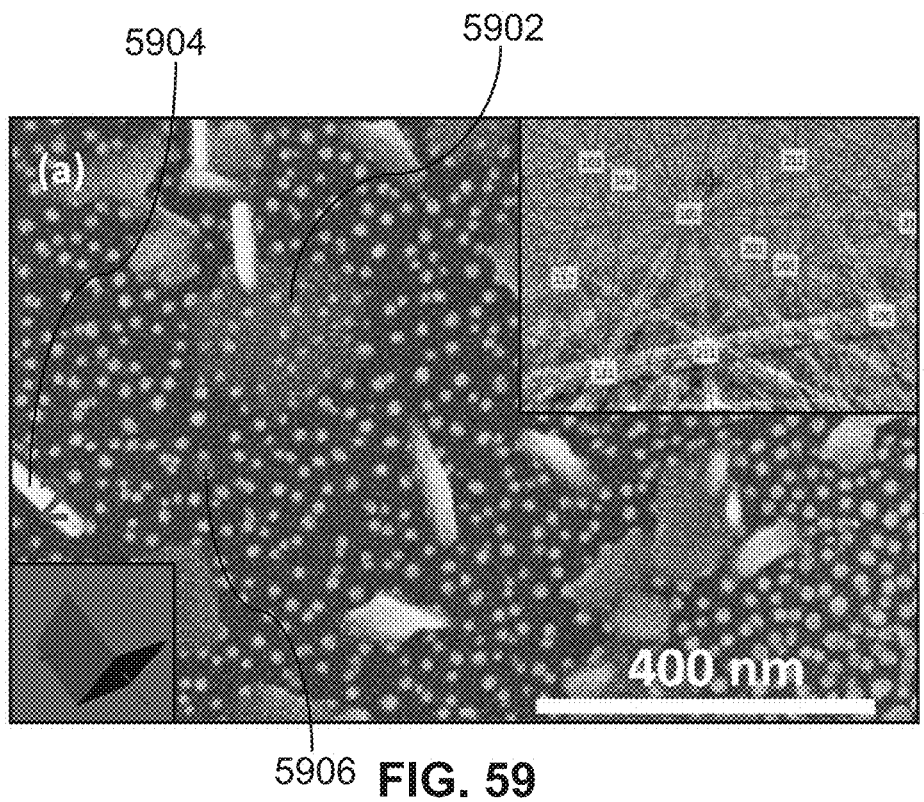
FIG. 59 is a high-resolution SEM micrograph of nanodiamonds, flat nanodiamond nanoplates, and perpendicular nanoplates of diamond with inset diamond EBSD Kikuchi pattern and orientation, according to one example.
Figure 60:
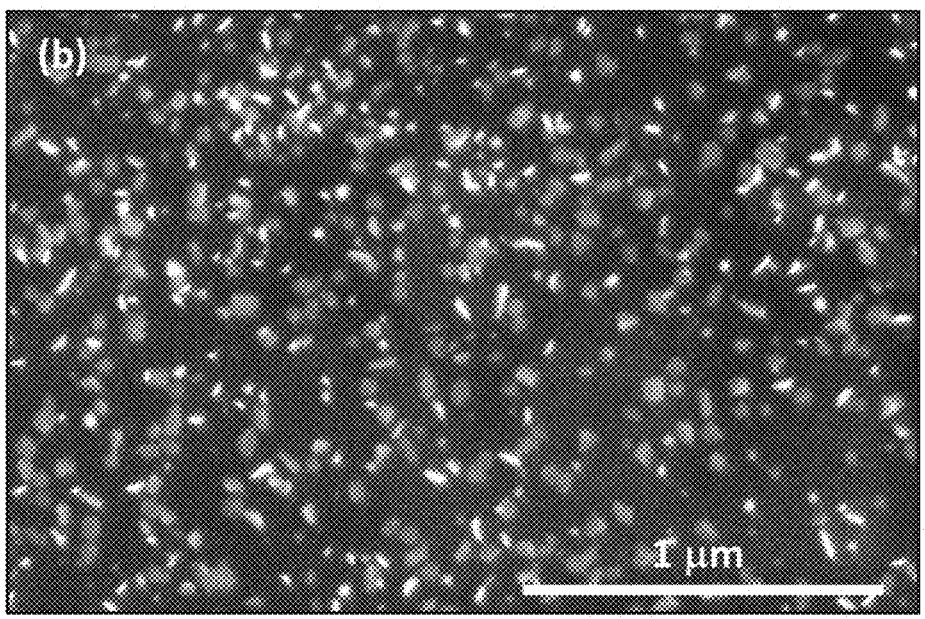
FIG. 60 is a high-resolution SEM micrograph of a mixture of nanodiamonds and nanoplates of diamond, according to one example.

FIGS. 59 and 60 show high-resolution SEM micrographs of nanodiamonds from N-doped samples. In some embodiments, after laser annealing of the as-deposited nitrogen-doped carbon layers, nanocrystals with an average size of 4-8 nm are formed, as shown, for example, in the high-resolution SEM micrograph in FIG. 59. FIG. 59 is a high-resolution SEM micrograph of nanodiamonds, flat nanodiamond nanoplates, and perpendicular nanoplates of diamond with inset diamond EBSD Kikuchi pattern and orientation. FIG. 59 also shows the formation of diamond platelets, some of which grow flat (as shown by diamond platelet 5902) and others grow normal to the substrate (as shown by diamond platelet 5904), according to one example. The nanocrystals are faceted, which is similar to pure diamond nanocrystals. The characteristic diamond EBSD (electron backscatter diffraction) or Kikuchi pattern from a nanodiamond 5906 is shown in the inset, confirming the structure of the diamond phase and orientation. Assuming one nitrogen-vacancy complex (NV center) in 4 nm diamond, the concentrations of N and V ($3.0 \times 10^{19}$ $cm^{-3}$) exceed thermodynamic limit of $2.0 \times 10^{18}$ $cm^{-3}$ for nitrogen. Taking experimental value for the formation energy of a neutral vacancy in diamond to be 3.0 eV, the concentration is estimated to be $\sim 3.6 \times 10^{19}$ $cm^{-3}$ at 4000K. Thus NV centers with concentrations exceeding the solubility limits can be formed under quenching from the liquid through solute trapping phenomenon. The formation of two types of platelet crystals is also shown in FIG. 60. The faint contrast from flat diamond microcrystals is observed because these are formed near the sapphire interface and are buried under the carbon.

Figure 61:
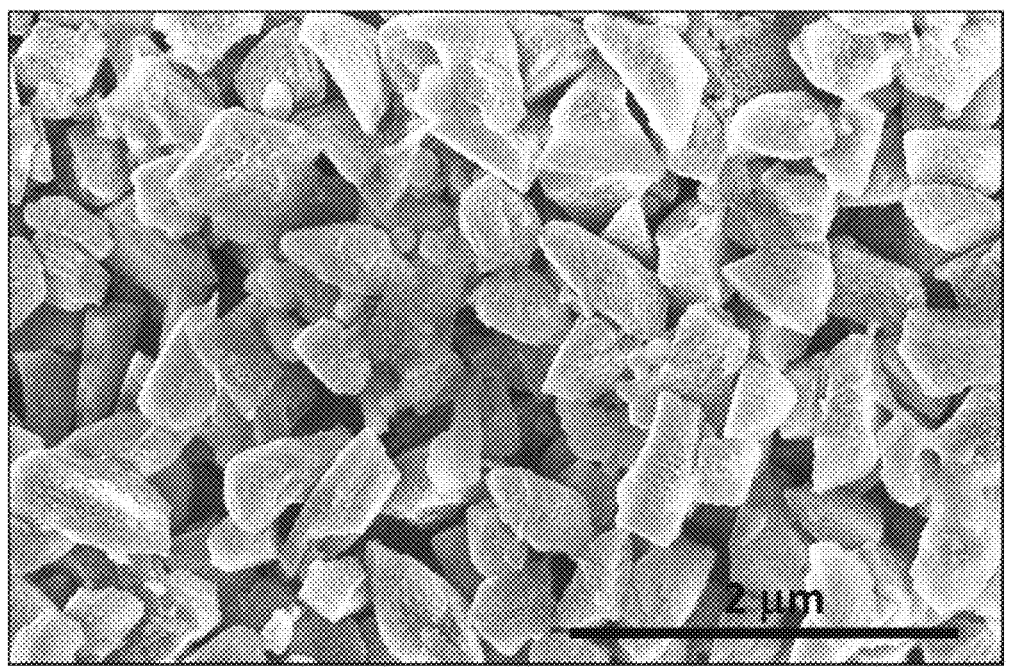
FIG. 61 is a high-resolution SEM micrograph of microdiamonds from N-doped samples containing twins, according to one example.

FIG. 61 is a high-resolution SEM micrograph of microdiamonds from N-doped samples containing twins. The example depicted in FIG. 61 shows a top view of a SEM micrograph showing formation of microcrystals of N-doped diamond, according to one example. In this example, microcrystals are formed with (0001) sapphire providing a template for epitaxial growth by domain matching epitaxy. The epitaxial relations of <111> diamond on (0001) sapphire are as follows: in-plane 19 (2d110) planes of diamond match with 20 (d-2110) planes of sapphire.

Figure 62:
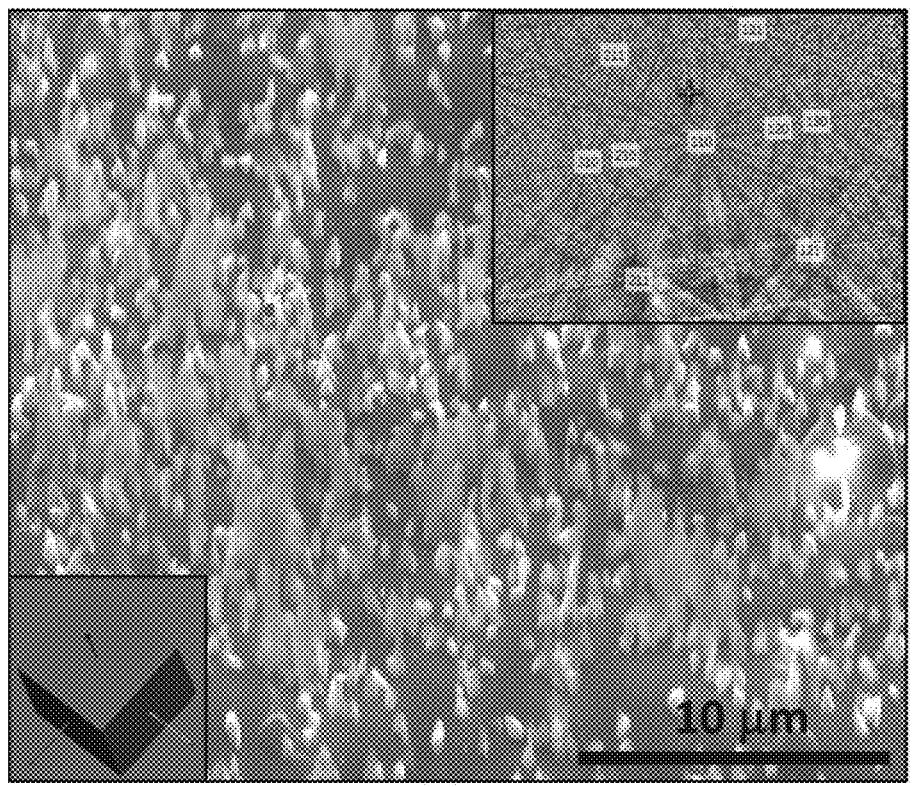
FIG. 62 shows nanoneedles and microneedles from N-doped sample with inset characteristic diamond pattern and orientation, according to one example.

FIG. 62 is a top view of a SEM micrograph showing formation of N-doped nanoneedles and microneedles, according to one example. From EBSD patterns, these nanoneedles and microneedles are single-crystals with sizes up to 2-3 microns. Under the liquid phase growth, this will require crystal growth velocities of the order of five meters per second, which have been established in silicon under highly undercooled state during nanosecond laser annealing.

Figure 63:
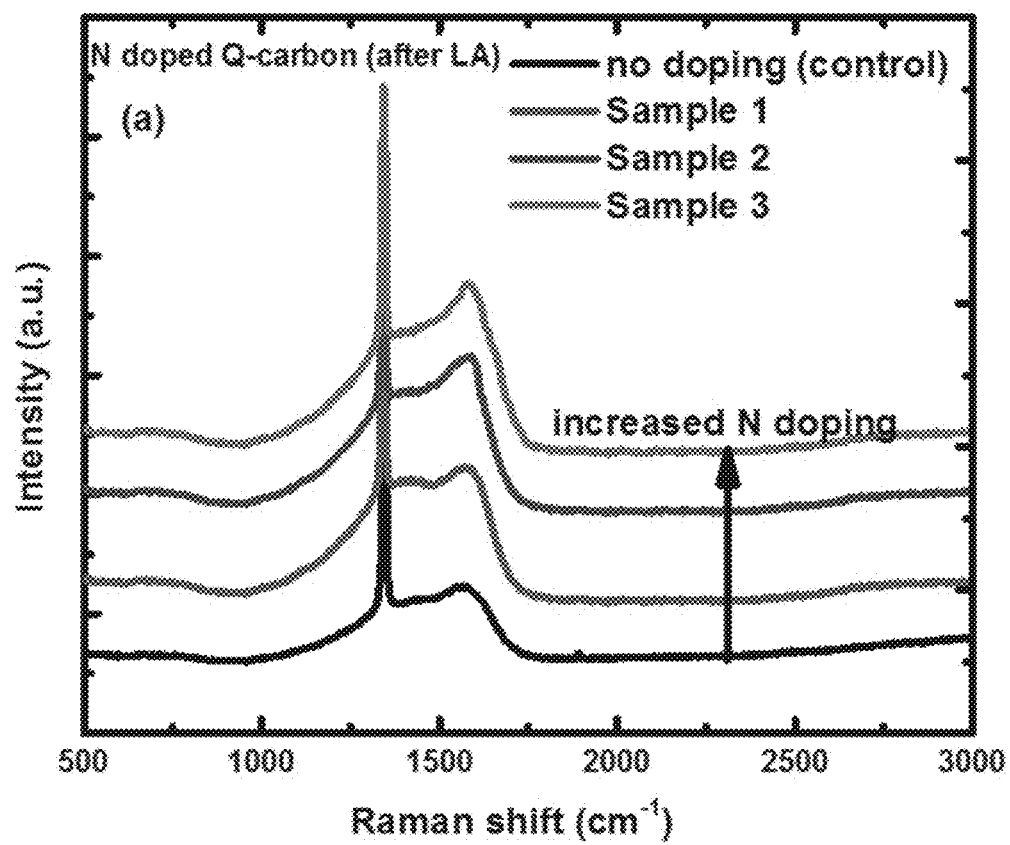
FIG. 63 shows Raman spectra for different N-doping by varying nitrogen pressure after laser treatment, including undoped control sample, according to one example.
Figure 64:
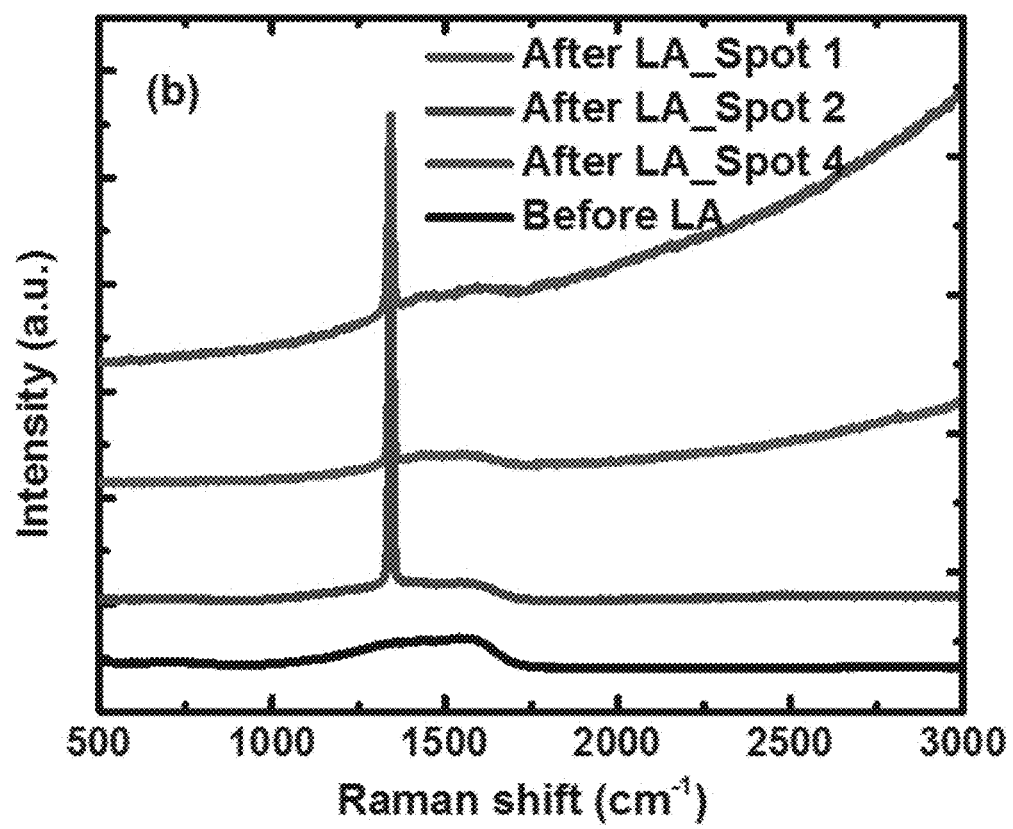
FIG. 64 shows Raman spectra for different N-doping by changing the $N_2^+$ ion flux after laser treatment, including the control (before laser annealing) sample, according to one example.
Figure 65:
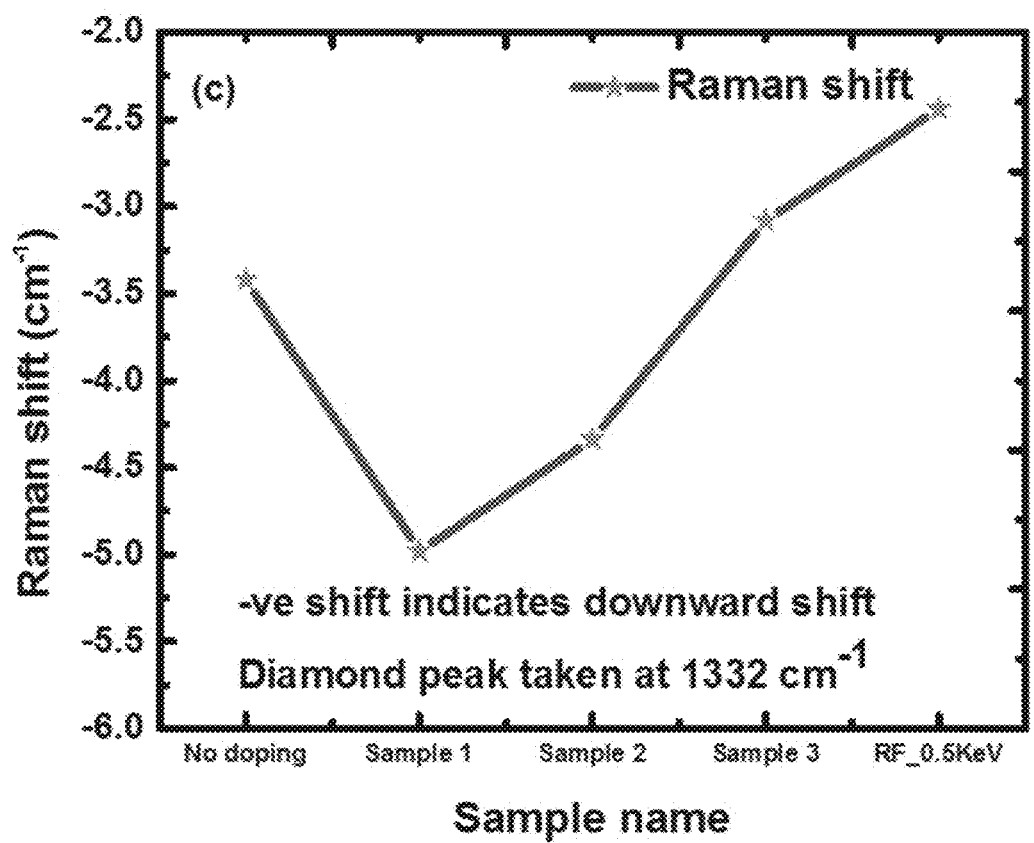
FIG. 65 shows Raman spectra for change in Raman shift, down shift due to size (nanorange) and upshift as a result of quenched-in stress, according to one example.

The Raman spectra from as-deposited carbon films as function of increasing nitrogen content (increasing partial pressure) are shown, for example, in FIG. 63. The partial pressure of nitrogen was varied from $5.0 \times 10^{-3}$ Torr (for sample #1) to $5.0 \times 10^{-2}$ Torr (for sample #2) to $5.0 \times 10^{-1}$ Torr (for sample #3). These Raman spectra contain D-peak at 1350 $cm^{-1}$ and G-peak at 1550 $cm^{-1}$. The nitrogen incorporation is signified by: (1) increasing the intensity ratio of I(D)/I(G); and (2) shift in the G-peak to higher wavenumber 1565 $cm^{-1}$. The control sample with no-doping shows the lowest D-peak. After laser annealing, the Raman spectra from $N_2^+$ implanted sample is shown in FIG. 64. FIG. 64 shows a sharp diamond peak which is downshifted from 1332 $cm^{-1}$ because of decreasing crystallite size. Considering phonon dispersion relations, the downshift for nanocrystalline diamond may be expected, as the Raman active phonon is at the maximum frequency. The Raman spectra from nitrogen pressure-doped samples showed Raman peak around 1327 $cm^{-1}$, which is downshifted from 1332 $cm^{-1}$, but also contained residual signature of G-peak around 1560 $cm^{-1}$. The results of Raman downshift for different N-doped samples, varying from 3 to 5 $cm^{-1}$, are shown in FIG. 65. In this example, there is an upshift due to stresses, which is combined with downshift due to size. The Raman shift in diamond ($\Delta\omega$) is related to $\Delta\omega$ (in $cm^{-1}$)=2.2±0.10 $cm^{-1}$ $GPa^{-1}$ along the [111] direction, $\Delta\omega$ (in $cm^{-1}$)=0.73±0.20 $cm^{-1}$ $GPa^{-1}$ along the [100] direction, and $\Delta\omega$ (in $cm^{-1}$)=3.2±0.23 $cm^{-1}$ $GPa^{-1}$ for the hydrostatic component. The biaxial stress in thin films can be described as a combination of two-thirds hydrostatic and one-third uniaxial stress. The biaxial stress can be estimated using $\sigma=2\mu((1+\upsilon)/(1-\upsilon))\cdot\Delta\varepsilon$, where $\mu$ is shear modulus, $\upsilon$ is Poisson's ratio, and $\Delta\varepsilon$ is the in-plain strain.

Figure 66:
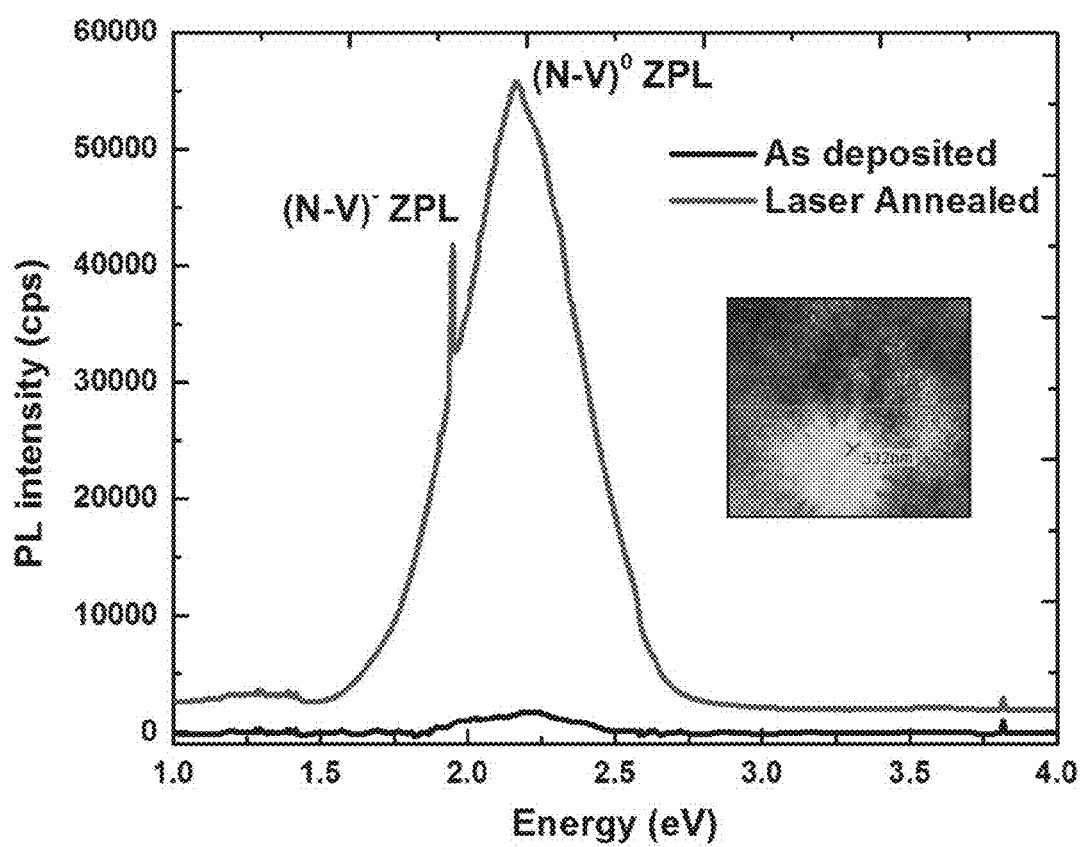
FIG. 66 shows a PL spectrum containing ZPL from $NV^-$ (637 nm) and $NV^0$ (575 nm) defects, with an inset (100×magnification) showing transitions when the sample is irradiated with 532 nm PL source.

The photoluminescence spectra from these nanocrystal magnetically active $NV^-$ defects are characterized by optical zero phonon line (ZPL) at 1.945 eV (637 nm), whereas $NV^0$ has ZPL at 2.156 eV (575 nm). FIG. 66 shows a PL spectrum containing ZPL from $NV^-$ (637 nm) and $NV^0$ (575 nm) defects, with an inset (100× magnification) showing transitions when the sample is irradiated with 532 nm PL source. FIG. 66 shows that magnetically active $NV^-$ defects are characterized by optical zero phonon line (ZPL) at 1.945 eV (637 nm), whereas $NV^0$ has ZPL at 2.156 eV (575 nm). These defects may also exhibit associated vibronic bands, extending ZPLs to lower and higher energy absorption and emission. In some examples, the characteristic $NV^-$ defect ZPL line from 5 nm diamond sample may be indicative of these defects being contained in the individual nanodiamonds, which can be used for variety of biomedical and nanosensor applications. By using 532 nm PL source, it is possible to image in-situ $NV^0$ (575 nm) and $NV^-$ (637 nm) defects and their transitions directly, as, shown in the inset of FIG. 66. The sharpness of PL peaks may be indicative of lack of other defects in nanodiamonds.

Figure 67:
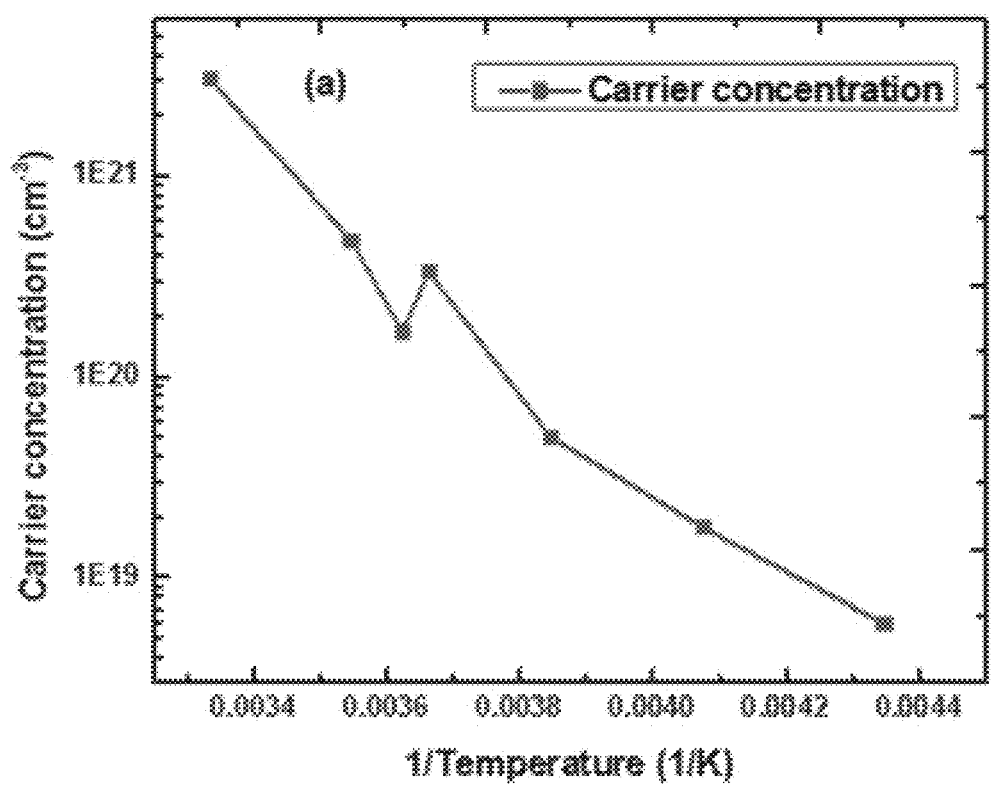
FIG. 67 shows Carrier concentration plotted as 1/T.
Figure 68:
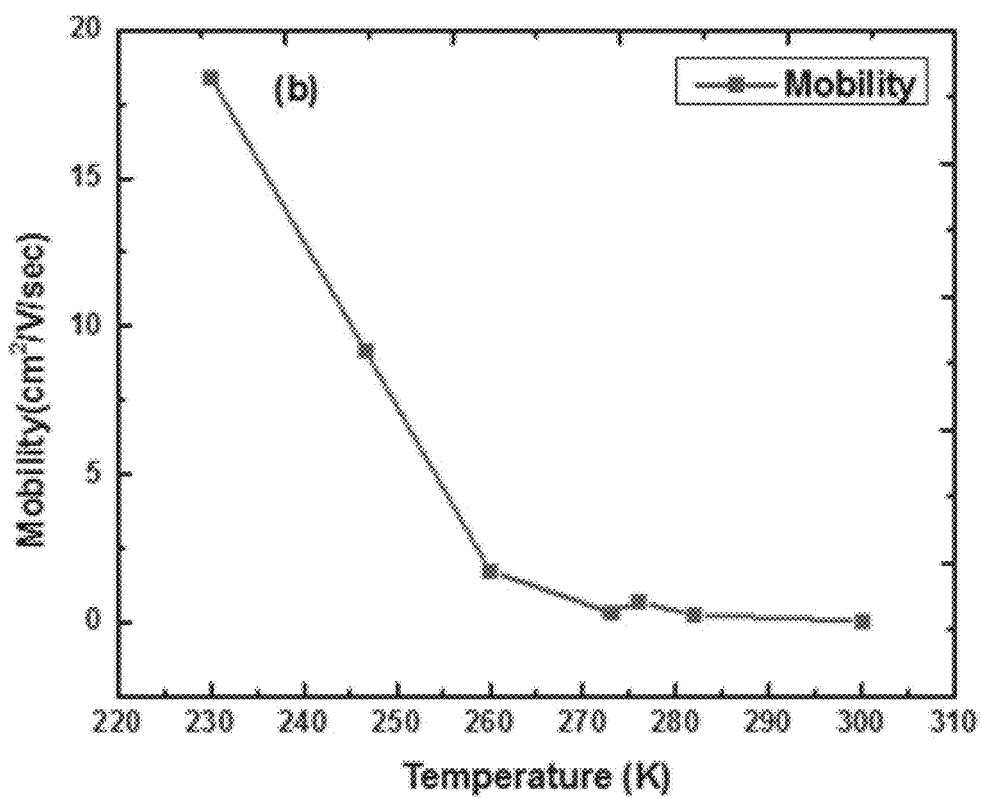
FIG. 68 shows Hall mobility as a function of T.

FIG. 67 provides the results on carrier concentration in N-doped diamond as a function of (1/T). In some examples, the carrier concentration may vary from $2.0 \times 10^{18}$ to $5.0 \times 10^{21}$ $cm^{-3}$. These high concentrations may be the consequence of dopant trapping during rapid quenching. In the case of silicon, the dopant concentrations exceeding four hundred times the solubility limits may be achieved as a result rapid solidification from the liquid phase. The phenomenon of formation of supersaturated silicon semiconductor alloys was modeled by solute trapping concepts which can be applicable in the diamond case as well. The carrier mobility as a function of temperature for a sample with carrier concentration of $2.0 \times 10^{19}$ $cm^{-3}$ is shown in FIG. 68, which shows Hall mobility as a function of T. This corresponds to conductivity of ~25 $\Omega$/cm at 250 K, which, in some instances, may be reasonable. A fit to $n=exp(-\Delta E/k_B T)$ suggest $\Delta E \sim 0.53$ eV.

Pure and N-doped diamond nanostructures are created in the form of nanodiamonds, microdiamonds, nanoneedles, microneedles, and large-area single-crystal thin films in a controlled way. This may be achieved by rapid melting of carbon in a super undercooled state and quenching to convert carbon into diamond at ambient temperatures and pressures in air. The dopants such as nitrogen can be incorporated into diamond far in excess of solubility limit via solute trapping phenomena. The vacancy concentration corresponding to quenching temperature can be trapped with nitrogen to create NV centers in nanodiamonds and other structures exceeding the solubility limit. The $NV^-$ and $NV^0$ defects have been characterized by photoluminescence using 325 nm wavelength, and $NV^-$ to $NV^0$ transitions are controlled electrically by passing current and by laser irradiation with 532 nm photons. Controlled synthesis and processing of NV nanodiamonds and other structures opens next generation of applications ranging from drug delivery and fluorescent biomarkers to single-photon sensors and quantum computing, nanoscale electronic and magnetic sensing, single-spin nuclear magnetic resonance, nanoscale thermometry and nanosensors.

Figure 69:
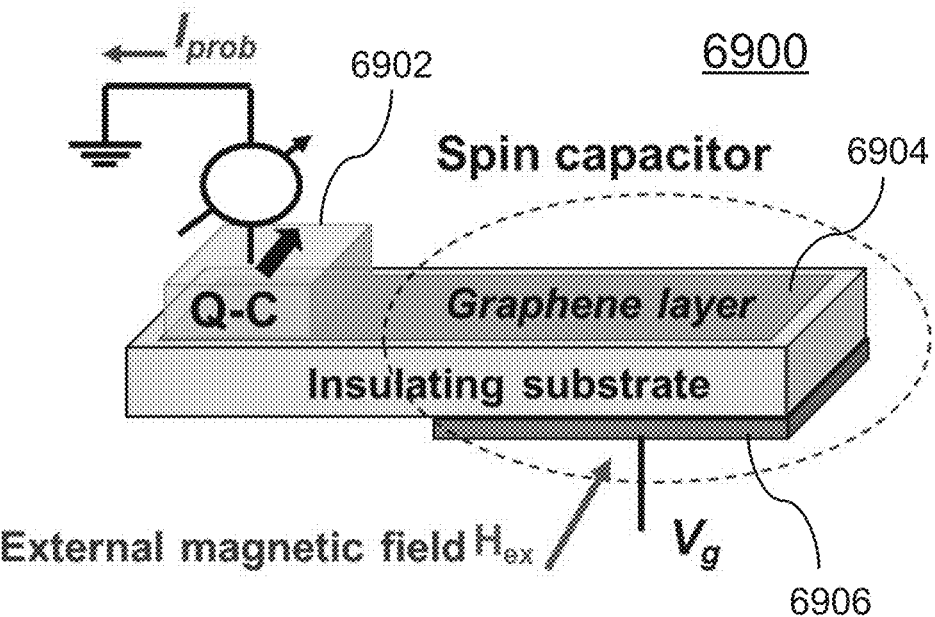
FIG. 69 shows a quantum spin phasemeter for magnetic field detection based on Q-Carbon, according to one example.

FIG. 69 shows a quantum spin phasemeter 6900 for magnetic field detection based on Q-Carbon, according to one example. Ferromagnetic ("FM") Q-carbon can be used as a source of spin-injection to graphene ("Gr") and/or a source of spin-detection from Gr. Quantum spin phasemeters with FM Q-carbon as a source of spin injection to Gr can have various advantages such as, for example: long spin-relaxation time in Gr presumes high sensitivity, room temperature operation, nano-scale size of the sensor, chemical inertness, and applications in biology and medicine.

Embodiments include spintronic devices for use in detection of extremely weak magnetic fields based on Q-Carbon. Such devices can include a one-terminal Q-carbon ferromagnetic ("FM") gate 6902 with a graphene sheet 6904, which is terminated closed to a biased metallic contact 6906, forming a capacitor which stores the electric charge Q under the appropriate electrical bias V_{g} and keeps the attendant spin polarization P(t), which appears due to spin injection through the FM contact at initial moment t=0. In operation, the injected spins can change due to precession in a magnetic field and decoherence. When bias is reversed, the electrons leave the capacitor with rotated and reduced spin polarization so that the intensity of reversal current through FM gate depends on rotation of polarization and its magnitude. These dependences can be recorded applying the series of sequential measuring with variable lengthening of exposure times (e.g., electron duration stay in the capacitor) at different device directions. Such measurements can supply information about the strength and direction of an external magnetic field.

In some embodiments, Q-carbon can be an efficient spin injector. For example, spin polarization up to 35% has been observed for Co. Q-Carbon can also create an improved contact with graphene, which possesses very long spin relaxation time at room temperature.

Figure 70:
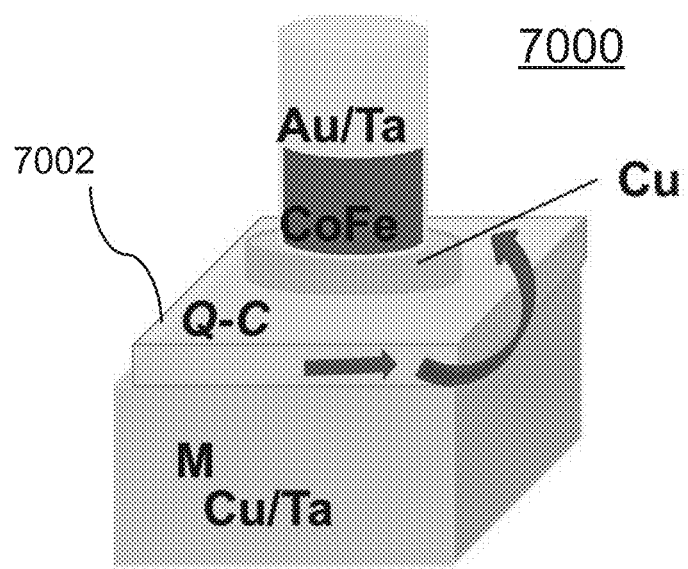
FIG. 70 shows a Q-Carbon as metallic ferromagnetic layer in spin-torque oscillator, according to one example.

FIG. 70 shows a Q-Carbon as metallic ferromagnetic layer in a spin-torque oscillator, according to one example. Using a Q-carbon free layer can reduce current that generates oscillations. Q-carbon can have magnetic softness and a relatively low spin density compared with conventional metallic ferromagnets (magnetization M=66 emu/cm³ compared with M=580 emu/cm³ for Py and 1800 emu/cm³ for CoFe). As such, the Q-carbon can improve the performance of devices (e.g., tunnel magnetic junction ("TMJ") devices) by substituting a metallic free FM layer with a Q-carbon layer. For example, smaller numbers of spin-polarized electrons switch magnetization when spin current passes through the Q-carbon layer. TMJ with Q-carbon can be used in memory devices as well as in devices as a source of GHz oscillations.

Figure 71:
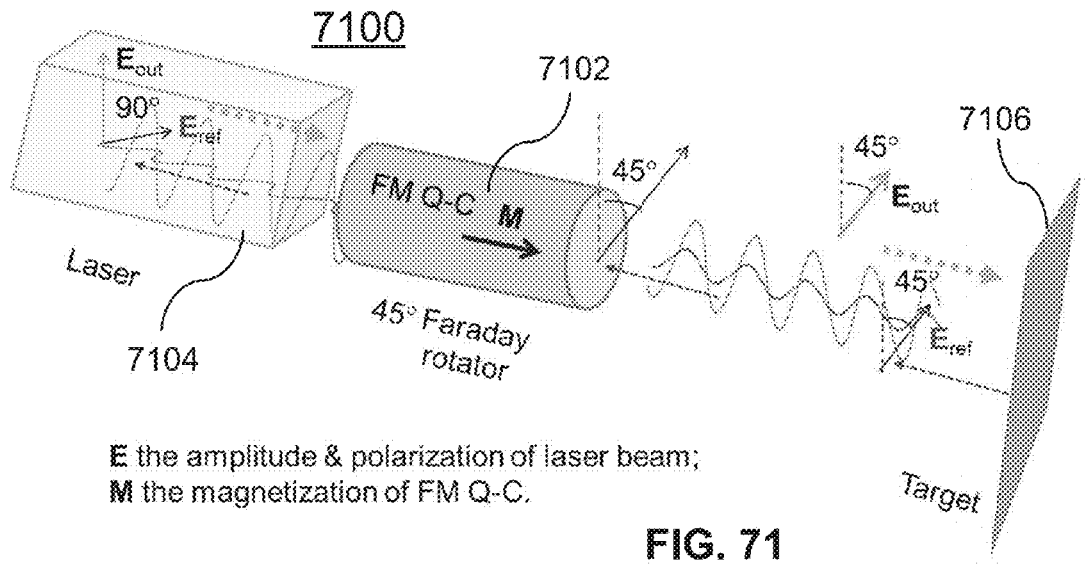
FIG. 71 shows a Q-Carbon optical lock, according to one example.

FIG. 71 shows a Q-Carbon optical lock, according to one example. Q-carbon can provide durability under power laser light polarization rotation. This can allow Q-carbon to be used as a Faraday locker, which can prevent spurious generation of next pulse before laser pumping is be completed. As shown in FIG. 71, ferromagnetic Q-carbon can be used as a Faraday rotator 7102. The Faraday angle of linear polarized laser beam from laser 7104 can be tuned to 45 degrees, the reflection from the target 7106 will be rotated more on same angle and reaches 90 degrees. The perpendicular polarized reflection does not provoke a spurious generation of next pulse before laser pumping will be completed.

Figure 72:
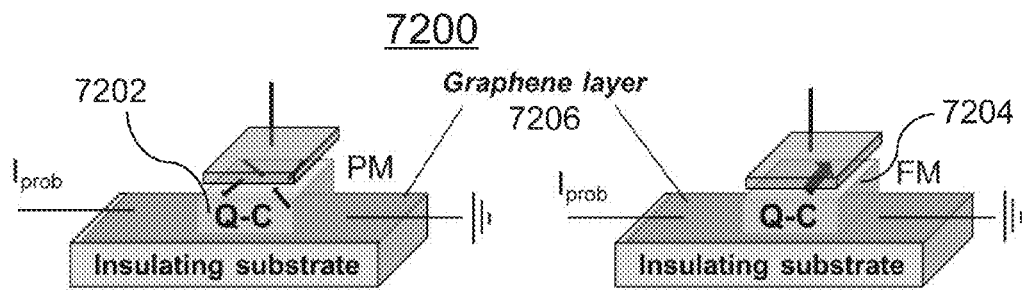
FIG. 72 shows a Q-Carbon memory unit based on bistability under paramagnetic ("PM")—ferromagnetic ("FM") phase transition, according to one example.

FIG. 72 shows a Q-Carbon memory unit based on bistability under paramagnetic ("PM")-ferromagnetic ("FM") phase transition, according to one example. Carrier density (electro-chemical potential) increase can mediate transition from PM phase to FM phases. Such a phase transition can be accompanied with electronic system reduction that stabilizes FM phase. Magnetoresistance through the attached graphene layer 7206 can discriminate Q-carbon PM 7202 or FM 7204 bistable states. Q-carbon may be used as an electrically controlled magnetic memory cell based on, for example, the magnetism of semiconducting Q-carbon's sensitivity to carrier density.

Figure 73:
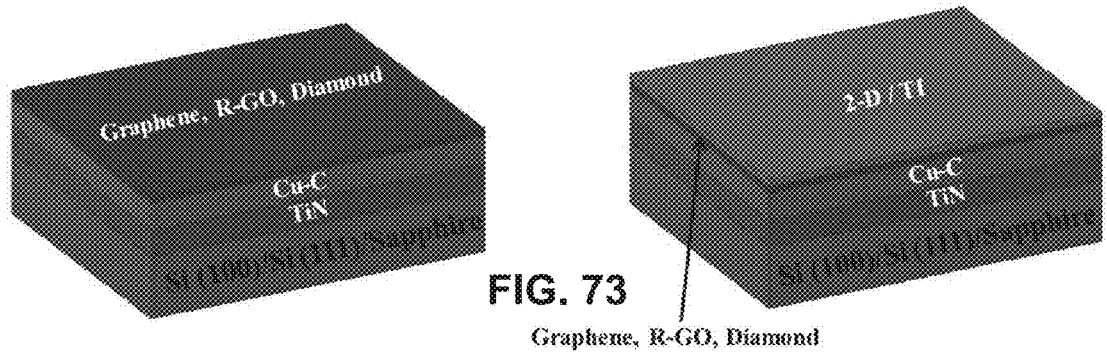
FIG. 73 shows graphene, reduced graphene oxide and diamond integrated with silicon and sapphire, according to one example.

FIG. 73 shows graphene, reduced graphene oxide and diamond integrated with silicon and sapphire, according to one example.

Embodiments also include various uses for the materials and structures disclosed herein including, for example, coating the materials and/or structures on aluminum, copper, zinc and zinc oxide coupons (contact surfaces) of frequently activated electro-mechanical switches to reduce wear and improve reliability, using the materials/structures as additives to fuel to add horsepower, using the materials/structures as additives to lubricants (e.g. motor oil) to reduce friction, coating the materials/structures on the tips of bullets and missiles to increase penetration, using the materials/structures in bulletproof fabrics and surfaces, using the magnetic materials/structures to assist in drug delivery by combining the materials with the drugs and magnetically directing to the desired part of the body; gemstones, coating the materials/structures on cutting tool surfaces for increased hardness and longer life, and using the materials/structures in brushless homopolar motor for hypersonic jet engines.

Figure 74:
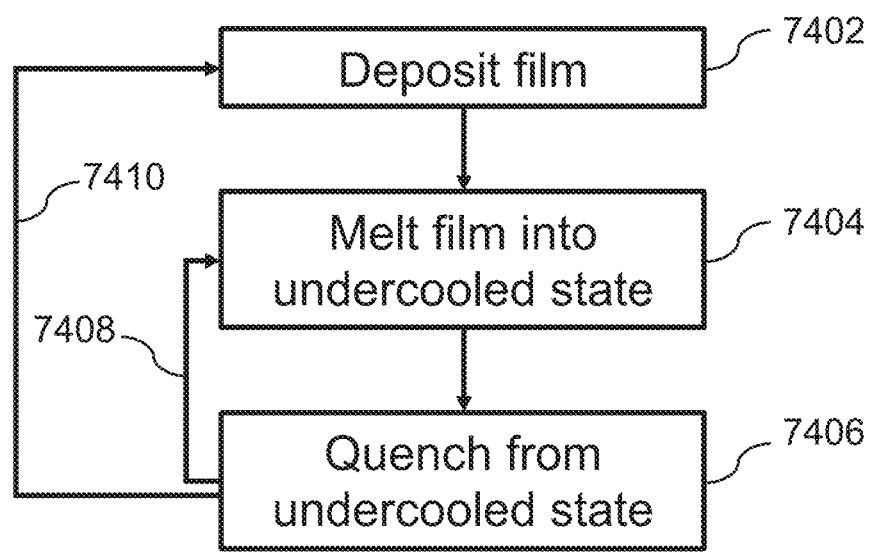
FIG. 74 is a flow chart depicting an example of a process for quenching from a super undercooled state to form one or more structures of material.

FIG. 74 is a flow chart 7400 depicting an example of a process for quenching from a super undercooled state to form one or more structures of material.

At 7402, a film is deposited. The film can be deposited on a substrate (e.g., tungsten carbide, silicon, copper, sapphire, glass, or a polymer substrate). In some embodiments, the film is deposited on the substrate by pulsed laser deposition. In some embodiments, the film includes amorphous carbon and/or hexagonal boron nitride.

At 7404, at least a portion of the film is melted into a super undercooled state. In some embodiments, the film (or portion thereof) is irradiated with a nanosecond laser.

At 7406, the melted portion of the film is quenched from the super undercooled state.

In some embodiments, an amorphous carbon film is deposited at 7402 and quenching from the super undercooled state creates Q-Carbon, diamond, and/or Q-Carbon/diamond composite. In some such embodiments, the quenching can create Q-Carbon, diamond, and/or Q-Carbon/diamond composite based on the amount of undercooling achieved at 7404. For example, as shown in FIG. 1B and discussed above, at around temperature $T_{dl}$ (slightly above 4000K) super undercooled carbon liquid can be quenched into diamond in various nanostructures and microstructures, and at around T* (slightly below 4000K) super undercooled carbon liquid can be quenched into Q-carbon. Diamond nanodiamonds, microdiamonds, nanoneedles, microneedles, or large area single crystal films can be formed by quenching from super undercooled carbon depending, for example, on the factors shown in Table 1.

In some embodiments, quenching from the super undercooled state can create cubic boron nitride film (e.g., when a hexagonal boron nitride film is deposited at 7402).

The process can be repeated in whole or in part, as shown, for example, at 7408 and 7410, respectively, to melt and quench other portions of the film, and to deposit additional film(s) for processing.

Figure 75:
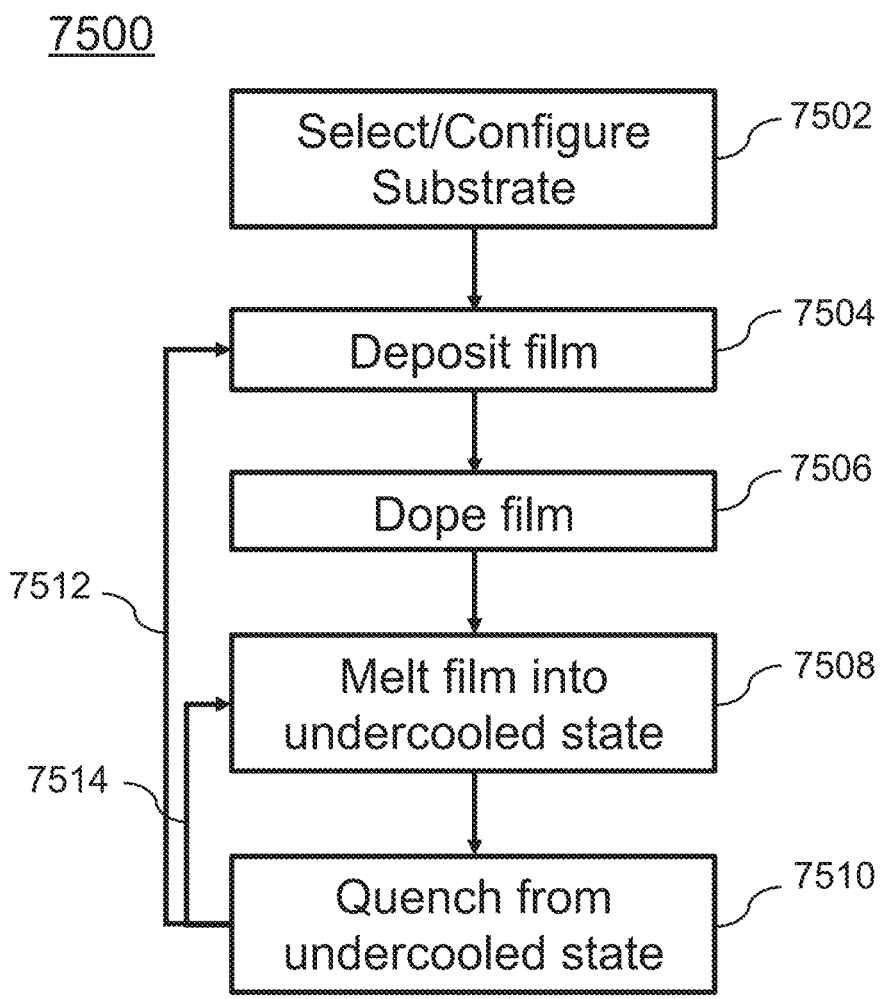
FIG. 75 is a flow chart depicting an example of a process for quenching from a super undercooled state to form one or more structures incorporating one or more dopants at concentrations exceeding thermodynamic solubility limits.

FIG. 75 is a flow chart 7500 depicting an example of a process for quenching from a super undercooled state to form one or more structures incorporating one or more dopants at concentrations exceeding thermodynamic solubility limits.

At 7502, a substrate is selected/configured. The substrate can be selected/configured to be a template for epitaxial growth and/or for deterministic placement of structures to be grown on the substrate.

At 7504, a film is deposited. The film can be deposited on a substrate (e.g., tungsten carbide, silicon, copper, sapphire, glass, or a polymer). In some embodiments, the film is deposited on the substrate by pulsed laser deposition. In some embodiments, the film includes amorphous carbon and/or hexagonal boron nitride.

At 7506, at least a portion of the film is doped with one or more dopants. For example, the film can be doped with n-type and/or p-type dopants. In some embodiments, an amorphous carbon film is doped with nitrogen ions to form diamond with nitrogen vacancies at 7510.

At 7508 at least a portion of the doped portion of the film is melted into a super undercooled state. In some embodiments, the film (or portion thereof) is irradiated with a nanosecond laser.

At 7510, the melted portion of the film is quenched from the super undercooled state. The quenching can form one or more structures incorporating dopants at concentrations exceeding thermodynamic solubility limits.

In some embodiments, an amorphous carbon film is deposited at 7504 and quenching from the super undercooled state creates diamond incorporating the one or more dopants at concentrations exceeding thermodynamic solubility limits via solute trapping.

In some embodiments, quenching from the super undercooled state can create cubic boron nitride (e.g., when a hexagonal boron nitride film is deposited at 7504) incorporating the one or more dopants at concentrations exceeding thermodynamic solubility limits via solute trapping.

The process can be repeated in whole or in part, as shown, for example, at 7514 and 7512, respectively, to melt and quench other portions of the film, and to deposit additional film(s) for processing. In some embodiments, the process can be repeated at 7512 to add additional layers of film with different dopant(s) than the previously quenched film layer/portion (e.g., to create a PN junction) and/or to add additional layers of film with the same dopant(s). In some embodiments, the process can be repeated at 7514 to melt and quench one or more other portions of the film. In such embodiments, the other portions can be doped with the same dopants as the previously quenched film layer/portion or different dopants.

Scaling up production can include repositioning between multiple quenching steps. For example, producing diamond structures can include creating a first diamond portion, repositioning, and creating a second diamond portion adjacent the first to form, together with the first portion, at least part of a nanodiamond, microdiamond, nanoneedle, microneedle, gemstone, large area single crystal film, or other structure. Those steps can be repeated until the complete structure is made.

Repositioning can be accomplished by moving the first portion with respect to an orientation of the laser pulse, moving the orientation of the laser pulse with respect to the first portion, or both. Moving the first portion can be done by translating or rotating a substrate supporting the first portion while leaving the orientation (angle) of the laser beam undisturbed so that a different portion of the substrate passes under the laser beam. Moving the orientation or scanning of the laser beam with respect to the film can comprise rotating a servo-mirror reflecting the laser beam onto a different portion of the substrate while the substrate remains unmoved. Doing both could include moving the substrate surface and the mirror at the same time to achieve faster repositioning of the laser beam onto a separate portion of the substrate.

The present inventor has created Q-Carbon following procedures described herein. The inventor conducted hardness testing on the created Q-Carbon using Hysitron Nanoindentor. The hardness testing included pressing a diamond tip against the created Q-Carbon and diamond-like carbon in a standard hardness test. The diamond tip did not indent the created Q-Carbon, indicating Q-Carbon is harder than diamond. Further, the diamond tip fractured when pressed against the created Q-Carbon, confirming Q-Carbon is harder than diamond.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A single crystal film comprising n-type doped diamond having a concentration of n-type dopants that exceeds thermodynamic solubility limits and p-type doped diamond having a concentration of p-type dopants that exceeds thermodynamic solubility limits, the n-type dopants comprising one or more selected from a group consisting of Ni, P, As, and Sb—.

2. The single crystal film of claim 1, wherein the p-type dopants consist of one or more selected from another group consisting of boron and boron compounds.

3. The single crystal film of claim 1, further comprising a p-n junction.

4. The single crystal film of claim 1, wherein the n-type and p-type dopants are incorporated into electrically active substitutional sites of the n-type and p-type doped diamond, respectively.

5. A structure comprising the single crystal film of claim 1 and a substrate, the single crystal film being a film grown epitaxially on the substrate, the substrate being a template for epitaxial growth of the n-type and/or p-type doped diamond.

6. The single crystal film of claim 1, wherein the n-type dopants are incorporated into electrically active substitutional sites of the n-type doped diamond.

7. A structure comprising the single crystal film of claim 1 and a substrate, the single crystal film being a film grown epitaxially on the substrate, the substrate being a template for epitaxial growth of the n-type doped diamond.

8. A single crystal film comprising:
a p-n junction comprising:
n-type doped diamond having a concentration of n-type dopants that exceeds thermodynamic solubility limits, and
p-type doped diamond having a concentration of p-type dopants that exceeds thermodynamic solubility limits.

9. The single crystal film of claim 8, wherein the p-type dopants consist of one or more selected from a group consisting of boron and boron compounds.

10. The single crystal film of claim 9, wherein the n-type dopants consist of one or more selected from another group consisting of Ni, P, As, and Sb—.

11. The single crystal film of claim 8, wherein the n-type and p-type dopants are incorporated into electrically active substitutional sites of the n-type and p-type doped diamond, respectively.

12. A structure comprising the single crystal film of claim 8 and a substrate, the single crystal film being a film grown epitaxially on the substrate, the substrate being a template for epitaxial growth of the n-type and/or p-type doped diamond.

13. A single crystal film comprising:
n-type doped diamond having a concentration of n-type dopants that exceeds thermodynamic solubility limits; and
p-type doped diamond having a concentration of p-type dopants that exceeds thermodynamic solubility limits.

14. The single crystal film of claim 13, wherein the p-type dopants consist of one or more selected from a group consisting of boron and boron compounds.

15. The single crystal film of claim 13, wherein the p-type dopants are incorporated into electrically active substitutional sites of the p-type doped diamond.

16. The single crystal film of claim 13, wherein the n-type dopants are incorporated into electrically active substitutional sites of the n-type doped diamond.

17. The single crystal film of claim 13, further comprising a p-n junction.

18. The single crystal film of claim 17, wherein the n-type dopants consist of one or more selected from another group consisting of Ni, P, As, and Sb—.

19. A structure comprising the single crystal film of claim 13 and a substrate, the single crystal film being a film grown epitaxially on the substrate, the substrate being a template for epitaxial growth of the n-type and/or p-type doped diamond.

* * * * *